United States Patent [19]

Mochizuki et al.

[11] Patent Number: 5,481,120

[45] Date of Patent: Jan. 2, 1996

[54] SEMICONDUCTOR DEVICE AND ITS FABRICATION METHOD

[75] Inventors: Kazuhiro Mochizuki, Tokyo; Tomoyoshi Mishima, Shiki, both of Japan; Tohru Nakamura, San Diego, Calif.; Hiroshi Masuda, Tokyo, Japan; Tomonori Tanoue, Tokyo, Japan; Tooru Haga, Tokyo, Japan; Yoshihisa Fujisaki, Tokyo, Japan

[73] Assignee: Hitachi, Ltd., Tokyo, Japan

[21] Appl. No.: 164,801

[22] Filed: Dec. 10, 1993

[30] Foreign Application Priority Data

Dec. 28, 1992 [JP] Japan .................................. 4-347688
Mar. 15, 1993 [JP] Japan .................................. 5-053722

[51] Int. Cl.$^6$ .................................................. H01L 27/02
[52] U.S. Cl. .......................... 257/49; 257/66; 257/192; 257/197; 257/588
[58] Field of Search ............................ 257/49, 51, 65, 257/66, 76–78, 184, 192, 197, 198, 201, 280, 588, 607, 609, 613, 615

[56] References Cited

U.S. PATENT DOCUMENTS 5,214,497  5/1993  Nanba et al. .......................... 257/49

OTHER PUBLICATIONS

Journal of Applied Physics, vol. 51 #7 Jul. 1980 pp. 3794–3800 by Yang et al.
IEEE Electron Device Letters, vol. 5 #8 Aug. 1984 pp. 310–312 by Asbech et al.
Applied Physics Letters, vol. 56 #20 May 1990 pp. 1942–1944 by Yoo et al.

Primary Examiner—Mark V. Prenty
Attorney, Agent, or Firm—Antonelli, Terry, Stout & Kraus

[57] ABSTRACT

Disclosed is a semiconductor device using a polycrystalline compound semiconductor with a low resistance as a low resistance layer, and its fabrication method. The above polycrystalline compound semiconductor layer is doped with C or Be as impurities in a large amount, and is extremely low in resistance. The polycrystalline compound semiconductor layer is formed by either of a molecular beam epitaxy method, an organometallic vapor phase epitaxy method and an organometallic molecular beam epitaxy method under the condition that a substrate temperature is 450° C. or less and the ratio of partial pressure of a V-group element to a III-group element is 50 or more. In the case that the above polycrystaline compound semiconductor layer with a low resistance is used as an extrinsic base region of an heterojunction bipolar transistor, since the extrinsic base region can be formed on a dielectric film formed on a collector, it is possible to reduce the base-collector capacitance, and hence to enhance the operational speed of the heterojunction bipolar transistor.

35 Claims, 40 Drawing Sheets

BUFFER LAYER (UNDOPE POLYCRYSTALLINE GaAs) FILM THICKNESS : 100mm

BUFFER LAYER (UNDOPE POLYCRYSTALLINE GaAs) FILM THICKNESS: 100 mm

Q1, Q2, Q3 ··· HETERO JUNCTION BIPOLAR TRANSISTOR
VI ·········· INPUT VOLTAGE
VR ·········· REFERENCE VOLTAGE
Vo1, Vo2 ····· OUTPUT VOLTAGE
Vccb ········ CONSTANT VOLTAGE

MOLECULAR BEAM EPITAXIAL

SEMICONDUCTOR DEVICE AND ITS FABRICATION METHOD

BACKGROUND OF THE INVENTION

The present invention relates to semiconductor devices such as heterojunction bipolar transistors, surface emitting laser diodes and hetero-insulated gate field effect transistors; and the fabrication method thereof.

In a prior art semiconductor device, for example, in a heterojunction bipolar transistor using III–V compound semiconductors, as shown in FIG. 3, an oxygen ion-implanted region 13 (hereinafter, referred to as "extrinsic collector region") is formed under an extrinsic base region 5 composed of a single crystalline compound semiconductor, so that carriers in the region 13 are depleted to reduce the extrinsic base-collector capacitance, thus achieving the high speed operation of the heterojunction bipolar transistor. In FIG. 3, reference numeral 1 indicates a single crystalline semiconductor substrate; 2 is a heavily doped n-type GaAs layer; 3 is an n-type GaAs layer; 7 is an undoped GaAs layer; 8 is an n-type AlGaAs layer; 9 is a heavily doped n-type GaAs layer, 10 is an emitter electrode; 11 is a base electrode; and 12 is a collector electrode. Such a technique has been disclosed, for example, in IEEE Electron Device Letters EDL-5 (1984) pp. 310–312.

In a prior art surface emitting laser diode, as shown in FIG. 51, at a p-type Bragg reflection layer 34, an oxygen ion-implanted region 39 is formed under a beryllium ion-implanted region 40 composed of a single crystalline compound semiconductor to obtain a current-confinement structure, thus improving the device characteristics. In FIG. 51, reference numeral 31 indicates a heavily doped n-type GaAs substrate; 32 is an n-type Bragg reflection layer; 33 is an InGaAs strained quantum well layer (active layer); 35 is an $Al_2O_3$ film; 37 is a p-type electrode; 38 is an n-type electrode; 39 is an oxygen ion-implanted region; and 4 is a $SiO_2$ film. Such a technique has been disclosed, for example, in Applied Physics Letters 56 (1990) pp. 1942–1944.

In a prior art hetero-insulated gate field effect transistor (hereinafter, referred to as "HBT"), as a gate electrode 6 shown in FIG. 56, a film made from a metal or a metal-semiconductor compound, for example, tungsten or WSi (tungsten silicide) is used. In FIG. 56, reference numeral 1 indicates a single crystalline semiconductor substrate; 5 is a heavily doped p-type GaAs layer; 35 is an $Al_2O_3$ film; 41 is a p-type GaAs channel layer; and 42 is an undoped AlGaAs layer. Such a technique has been disclosed in Unexamined Japanese Patent Publication No. HEI 1-161874.

In the prior art HBT described above, as shown in FIG. 3, as the extrinsic base region 5, the single crystalline compound semiconductor is used to reduce the resistance. The extrinsic base region 5 is formed on the extrinsic collector region 13 (collector under the base electrode 11) made from a single crystalline compound semiconductor by an epitaxial growth method. However, since the extrinsic collector region 13 is made from a compound semiconductor having a large relative dielectric constant (for example, about 13 for GaAs), and accordingly, in the HBT made from a III–V compound, it is difficult to further reduce the extrinsic base-collector capacitance.

In the prior art HBT described above, the area of the emitter region 8 cannot be made smaller than that of the emitter electrode 10, which makes it difficult to decrease the size of the HBT and to further reduce the extrinsic base-collector capacitance.

In the prior art surface emitting laser diode described above, a leak current is generated due to the crystal defect resulting from the oxygen ion implantation, which obstructs the formation of the perfect current-confinement structure. This brings about such a disadvantage that the device characteristics are not desirable, or rather liable to be deteriorated.

In the prior art hetero-insulated gate field effect transistor described above, since the surface of the semiconductor barrier layer is exposed in atmospheric air when the gate electrode is formed, the density of interface states at the metal-semiconductor interface is varied depending on the device fabricating condition, that is, cannot be made constant. As a result, the device characteristics are varied, which causes such a disadvantage in making it impossible to obtain the field effect transistors having the uniform characteristics.

Further, since metals are difficult to be processed as compared with semiconductors, when a gate electrode is made from a metal, the metal electrode length is determined by the dimension with which the metal is processed. This makes it difficult it to decrease the device size and to improve the integration density.

SUMMARY OF THE INVENTION

An object of the present invention is to solve the above disadvantages having the prior art, and to provide semiconductor devices with high performance and high reliability, and the fabrication method thereof.

Another object of the present invention is to provide an HBT with very high speed and high reliability, which is low in the extrinsic base-collector capacitance; a surface emitting laser diode being small in leak current, excellent in characteristics and improved in service life; and a hetero-insulated gate field effect transistor with high performance and high reliability, which includes a gate electrode having the extremely small dimension without any variation; and the fabrication method thereof.

A further object of the present invention is to provide an electronic circuit enabling very high speed operation using a semiconductor device with high performance and high reliability.

The above objects can be achieved by forming semiconductor devices, particularly, electrodes, extrinsic base regions and wirings of compound semiconductor devices using polycrystalline compound semiconductors.

The above polycrystalline semiconductors, preferably, include III–V polycrytalline compound semiconductors and alloys thereof. Beryllium (Be) or carbon (C) is, preferably, doped in the above polycrystalline compound semiconductor. Further, to obtain the desirable result, the content of the impurities may be specified to be in the range of $4 \times 10^{20}/cm^3$ to $2 \times 10^{22}/cm^3$.

To obtain the desirable result, the above III–V polycrystalline compound semiconductor layer may be formed by either of a molecular beam epitaxy method, organometallic vapor phase epitaxy method or organometallic molecular beam epitaxy method under the condition that a substrate temperature is 550° C. or less, preferably, 450° C. or less and a ratio of partial pressure of a V-group element to a III-group element is 20 or more, preferably, 50 or more and 200 or less.

In the case that the above semiconductor device is an HBT, the conductivity of a heavily doped collector region is taken as a first conductivity, and a semiconductor layer having a first conductivity or a second conductivity with the impurity concentration not more than $1 \times 10^{17}/cm^3$ is formed by a thickness of at least 30 nm between an extrinsic base region and a dielectric film; the minimum value of the energy gap in the extrinsic base region is made smaller than that in the base region; the emitter region is formed of a single crystalline region and a polycrystalline region; and the emitter region is formed so as to be contacted with both the single crystalline region and the polycrystalline region. Thus, the extremely preferable HBT can be obtained.

The above extrinsic base region is, preferably, formed by either of a molecular beam epitaxy method, organometallic vapor phase epitaxy method or organometallic molecular beam epitaxy method under the condition that the substrate temperature is 550° C. or less, preferably, 450° C. or less and a ratio of partial pressure of a V-group element to a III-group element is 20 or more, preferably, 50 or more and 200 or less.

Preferably, at least one molecular semiconductor layer is formed between the above extrinsic base region and the dielectric film by a molecular beam epitaxy method. Further, the above extrinsic base region is, preferably, formed by an organometallic vapor phase epitaxy method or organometallic molecular beam epitaxy method under the condition that a substrate temperature is 550° C. or less, preferably, 450° C. or less and a ratio of partial pressure of a V-group element to a III-group is 20 or more, preferably, 50 or more and 200 or less.

As for the formation of the collector layer, the above object can be effectively achieved using either of methods of: (a) forming a dielectric film pattern on a single crystalline semiconductor substrate, and selectively forming by epitaxial growth a collector layer composed of a semiconductor layer with a first conductivity or a second conductivity with an impurity concentration not more than $1\times10^{17}/cm^3$ only on a region where the dielectric film is not present; and depositing the dielectric film on the collector layer and flattening the surface by etching; (b) processing a collector layer formed on the whole surface of the single crystalline substrate in such a shape as having a side surface with an acute angle against the substrate; and depositing a dielectric film and flattening the surface by etching; and (c) forming on the single crystalline semiconductor substrate a dielectric film pattern having a side surface with an acute angle against the substrate, and forming a collector layer on the single crystalline semiconductor substrate and the dielectric film.

In the case that the above semiconductor device is a surface emitting laser diode, the extremely preferable result can be obtained by the following method: namely, on a single crystalline semiconductor substrate having a first conductivity, there are formed a region in which a distributed Bragg reflection layer composed of a semiconductor with the first conductivity, an active layer composed of a semiconductor with the first conductivity or a second conductivity, and a distributed Bragg reflection layer composed of a semiconductor with the second conductivity are sequentially laminated, and a region in which a dielectric film is deposited; and subsequently, both the regions are connected to each other by means of a III–V polycrystalline compound semiconductor layer with the second conductivity. The III–V polycrystalline compound semiconductor layer with the second conductivity is doped with Be or C as impurities in an amount of $4\times10^{20}/cm^3$, and can be formed by either of a molecular beam epitaxy method, organometallic vapor phase epitaxy method and organometallic molecular beam epitaxy method under the condition that a substrate temperature is 550° C. or less, preferably, 450° C. or less, and a ratio of partial pressure of a V-group element to a III-group element is 20 or more, preferably, 50 or more.

In the case that the above semiconductor device is a hetero-insulated gate field effect transistor, on a single crystalline semiconductor substrate, there are formed a channel layer composed of a semiconductor with the second conductivity; a barrier layer composed of a semiconductor with a carrier concentration of $1\times10^{17}/cm^3$ or less and with an energy band larger than the semiconductor forming the above channel layer; and a gate electrode composed of a III–V polycrystalline compound semiconductor layer with the second conductivity. The above III–V polycrystalline compound semiconductor layer is doped with Be or C as impurities in an amount of at least $4\times10^{20}/cm^3$, and can be formed by heating of an amorphous layer deposited by a molecular beam epitaxy method under an ultra-high vacuum of a back pressure not more than about 1 mTorr or by an organometallic vapor phase epitaxy method under a high-purity-hydrogen atmosphere.

The semiconductor devices such as the above HBT, hetero-insulated gate field effect transistor are used for all of transistors or for at least differential amplifier circuit, to thus constitute an electronic circuit.

In a compound semiconductor device, generally, a single crystalline compound semiconductor heavily doped with impurities is used for a low resistance region. The minimum value of the resistivity of a polycrystalline compound semiconductor known at present is 0.07 Ωcm, which is higher than the value obtained by the single crystalline compound semiconductor by one figure or more, thereby causing the above-described various disadvantages. The present inventor has variously examined the subject to reduce the resistance of non-single crystalline semiconductors, and thus found the fact that a sufficiently low resistance can be obtained for polycrystalline compound semiconductors.

This will be described by way of an example in which GaAs is used as a compound semiconductor and Be is used as a dopant.

FIG. 4 is an experimental result showing a doping level dependency on the resistivity of a polycrystalline p-type GaAs.

In FIG. 4, the symbol Δ indicates the result shown in Journal of Applied Physics 51 (1980) pp. 3794–3800. In this article, for forming a solar battery of a polycrystalline GaAs, Zn is used as p-type impurities, and the p-type polycrystalline GaAs is formed by an organometallic vapor phase epitaxy method under a substrate temperature of 725° C. However, the grain size is large, that is, in the range of 2 to 10 μm, and the resistivity is 0.07 Ωcm at maximum. The base width is usually 100 nm or less, and accordingly, in order that crystal grains in an extrinsic base region are continuously connected to a base region, the grain size must be 100 nm or less. As a consequence, the polycrystalline GaAs having the above grain size cannot be applied to an HBT. On the contrary, when the grain size is reduced to be applied to an HBT, since a resistivity is increased nearly in inverse proportion to the grain size, the resistance is further increased.

When the resistance of a base layer is increased, the high speed operation of an HBT is significantly obstructed, so that the resistivity of the base layer is usually specified to be about 0.004 Ωcm. In order not to increase the base resistance, it is required that the resistance of the extrinsic base region occupied in the base resistance is not dominant, concretely, the resistivity of the extrinsic base region is to be 0.04 Ωcm or less not exceeding 10 times the resistivity of the base resistance. However, as described above, in the prior art, the resistivity of the extrinsic base region cannot be reduced to be such a low value, which may be considered as a main reason why the prior art polycrystalline compound semiconductors are not used as conducting materials of semiconductors.

On the other hand, in FIG. 4, the symbol o shows the experimental result by the present inventor, which shows the doping level dependency on the resistivity in the case that an undoped polycrystalline GaAs layer with a thickness of 30 nm is formed on a $SiO_2$ film with a thickness of 40 nm by a molecular beam epitaxy method under the condition that a substrate temperature is 450° C. and a ratio of partial pressure of a V-group element to a III-group element is 50, and a Be doped polycrystalline GaAs layer with a thickness of 100 nm is fabricated under the same condition. The resistivity is reduced along with the doping level; however, the reduction rate thereof is changed with respect to the vicinity of the doping level of $2\times10^{20}/cm^3$. The grain size of the p-type polycrystalline GaAs film is substantially in the range of 30 to 50 nm, which satisfies the requirement of 100 nm or less, and when the doping level of Be exceeds the value of $4\times10^{20}/cm^3$, the resistivity becomes 0.04 $\Omega$cm or less. Further, when the substrate temperature is further lowered, or the rate of partial pressure of the V-group element to the III-group element is further increased, the resistivity of the Be doped polycrystalline GaAs compared at the same doping level is further lowered. For the substrate temperature of about 550° C., the grain size is somewhat larger, that is, 100 nm; however, this semiconductor can be practically used without problem so much. In addition, the ratio of partial pressure is, preferably, in the range of 50 to 500; however, when it is 20 or more, there can be obtained a polycrystalline compound semiconductor layer with a low resistance.

FIG. 4 shows only the case of the Be doped polycrystalline GaAs layer fabricated by the molecular beam epitaxy method; however, even in the case of a C-doped polycrystalline GaAs layer fabricated by an organometallic vapor phase epitaxy method or an organometallic molecular beam epitaxy method, the same result as in the Be doped polycrystalline GaAs layer can be obtained under the condition that a substrate temperature is 450° C. or less and a ratio of partial pressure of a V-group element to a III-group element is 50 or more.

Further, by provision of an n-type semiconductor layer or a p-type semiconductor layer with an impurity concentration not more than $1\times10^{17}/cm^3$ by a thickness of at least 30 nm between an extrinsic base region and a dielectric film, there can be avoided such a problem as increasing the resistivity resulting from the discontinuity of polycrystal grain boundaries. This will be described with reference to FIG. 4. In this figure, the symbols ● show the result of the case that an undoped polycrystalline GaAs layer (buffer layer) is not formed on a $SiO_2$, but a Be doped polycrystalline GaAs layer with a thickness of 100 nm is directly fabricated on the $SiO_2$ film by a molecular beam epitaxy method under the condition that a substrate temperature is 450° C. and a ratio of partial pressure of a V-group element to a III-group element is in the range of 50 to 200.

The higher the ratio of partial pressure of the V-group element to the III-group element is, the lower the resistivity of the Be doped polycrystalline GaAs layer is. Notwithstanding, the resistivity is higher than that of the undoped polycrystalline GaAs layer formed on the $SiO_2$ film. The reason for this is considered as follows: namely, since the grain size of the polycrystalline GaAs is substantially in half of the film thickness, the resistivity is increased due to the spaces present between polycrystal grains. As the thickness of the polycrystalline layer becomes thinner, the above tendency, that is, the increase in the resistivity, becomes significant. This problem, however, can be solved only by the presence of an undoped polycrystalline GaAs layer with a thickness of at least 30 nm between the extrinsic base region and the dielectric film, as shown by the symbol o in FIG. 4. Further, the same result can be obtained by replacing the above undoped polycrystalline GaAs layer with an n-type polycrystalline semiconductor layer containing Si as impurities with a film thickness of 30 nm or more, or with a p-type polycrystalline semiconductor layer containing Be in the concentration not more than $1\times10^{17}/cm^3$ with a film thickness of 30 nm or more. The reason why the upper limit of the carrier concentration is specified in use of the p-type polycrystalline semiconductor layer is to avoid the reduction of cutoff frequency due to an increase in the base width in the intrinsic region.

By making smaller the minimum value of an energy gap in the extrinsic base region than that in the base region, as compared with the case that the semiconductor layer having the same energy gap as in the base region is used for the extrinsic base region, the carrier concentration and the mobility in the extrinsic base region are increased, that is, the base resistance is further reduced, to thus form a very high speed heterojunction bipolar transistor with the more increased maximum oscillation frequency.

By forming an emitter region of a single crystalline region and a polycrystalline region, and bringing an emitter electrode in contact with both the single crystalline region and the polycrystalline region, it is possible to make smaller the area of the single crystalline emitter region than that of the emitter electrode, and hence to easily decrease the size of the emitter region. This is due to the effect resulting from the fact that, even when n-type impurities are added to a III–V polycrystalline compound semiconductor in a high concentration, the resistance is difficult to be reduced, and the emitter current mainly flows through the emitter single crystalline region.

Although in the above description, the extrinsic base region is formed by either of a molecular beam epitaxy method, organometallic vapor phase epitaxy method and organometallic molecular beam epitaxy method under the condition that the substrate temperature is 450° C. or less, and the ratio of partial pressure of a V-group element to a III-group element is 50 or more, the same effect can be obtained by a method wherein a semiconductor with at least one molecular layer is formed between the above extrinsic base region and the dielectric film by the molecular beam epitaxy method, and the above extrinsic base region is formed by the organometallic vapor phase epitaxy method or organometallic molecular beam epitaxy method under the condition that the substrate temperature is 450° C. or less, and the ratio of partial pressure of a V-group element of a III-group element is 50 or more. The reason why the semiconductor with at least one molecular layer is formed between the extrinsic base region and the dielectric film by the molecular beam epitaxy method is that the uniform growth of the semiconductor layer on the dielectric film is difficult to be obtained by the organometallic vapor phase epitaxy method or the organometallic molecular beam epitaxy method. By the presence of the semiconductor with at least one molecular layer, the polycrystalline semiconductor layer is allowed to grow while making the above semiconductor as a nucleus by the organometallic vapor phase epitaxy method or the organometallic molecular beam epitaxy method.

Further, as for the formation of a collector layer, a very high speed HBT can be fabricated without any problem such as breakage in the vicinity of an extrinsic base region by either of methods of: (a) forming a dielectric film pattern on a single crystalline semiconductor substrate, and selectively forming by epitaxy growth a collector layer composed of a semiconductor layer with a first conductivity or a second conductivity of an impurity concentration not more than $1\times10^{17}/cm^3$ only on a region where a dielectric film is not present, and depositing the dielectric film on the collector layer and flattening the surface by etching; (b) processing the collector layer formed over the whole surface of the single crystalline substrate in such a shape as having a side surface with an acute angle against the substrate; and depositing the dielectric film and flattening the surface by etching; and (c) forming on the single crystalline semiconductor substrate a dielectric film pattern having a side surface with an acute angle against the substrate, and forming a collector layer on the single crystalline semiconductor substrate and the dielectric film.

Namely, in the above process (a), a space between an inclined semiconductor surface against the (100) substrate face, such as {100} face emerged in the selective epitaxial growth of the collector layer, and the side surface of the dielectric film vertically processed is filled with a new dielectric film, so that the semiconductor is deposited in the space to form a spacer layer, which prevents the base-collector short circuit or breakage.

In the above process (b), since the space is not fabricated between the collector layer and the dielectric film as distinguished from the process (a), but the side surface of the collector layer is embedded with the dielectric film, the base-collector short circuit or breakage is prevented. Further, in the above process (c), by forming the side surface of the dielectric film pattern with the acute angle against the substrate, it is possible to prevent the breakage in the vicinity of the extrinsic base region.

In the case of the above surface emitting laser diode, on the n-type single crystalline semiconductor substrate, there are formed both the region where the n-type semiconductor distributed Bragg reflection layer, semiconductor active layer and p-type semiconductor distributed Bragg reflection layer are sequentially layered, and the region where the dielectric film is deposited; and both the regions are connected to each other by a III-V polycrystalline compound semiconductor layer containing Be or C as impurities in an amount of at least $4\times10^{20}/cm^3$ which is formed by either of a molecular beam epitaxy method, organometallic vapor phase epitaxy method, and organometallic molecular beam epitaxy method under the condition that the substrate temperature is 450° C. and the ratio of partial pressure of a V-group element to a III-group element is 50 or more. This makes it possible to realize the perfect current-confinement structure without the oxygen ion implantation, and hence to extremely improve the characteristics of the surface emitting laser diode.

In the above hetero-insulated gate field effect transistor, by forming on the single crystalline semiconductor substrate the p-type semiconductor channel layer, the barrier layer composed of the semiconductor with a carrier concentration not less than $1\times10^{17}/cm^3$ and having an energy gap larger than in the semiconductor forming the above channel layer, and the gate electrode composed of a p-type III-V polycrystalline compound semiconductor containing Be or C as impurities in the concentration of $4\times10^{20}/cm^3$ formed by the molecular beam epitaxy method or organometallic vapor phase epitaxy method, through process without exposure to the air under an ultra-high vacuum or high-purity-hydrogen atmosphere, it is possible to reduce the density of interface states between the barrier layer and the gate electrode, and hence to reduce the variation in the density of interface states depending on the fabricating condition. Further, since the gate electrode is made from the semiconductor, as compared with that made from a metal, it can be decreased in size, thus facilitating the high integration of the devices.

As described above, by use of a polycrystalline compound semiconductor as a low resistance conducting material, it is possible to achieve the high performance of various semiconductor devices other than the above semiconductor devices. In particular, by forming a low resistance polycrystalline compound semiconductor on a dielectric film, a larger effect can be obtained.

Further, by forming an electronic circuit using the above HBT and hetero-insulated gate field effect transistor as all of transistors or as at least a differential amplifier circuit, it is possible to provide an electronic circuit enabling a very high speed operation.

Additionally, in the case of the electronic circuit using the above hetero-insulated gate field effect transistor, the III-V polycrystalline compound semiconductor for the gate electrode can be used as the wiring, thereby simplifying the processes and reducing the fabrication cost as compared with the prior art in which the wiring is made from a metal.

DETAILED DESCRIPTION OF THE PREFERRED EMBODIMENTS

Embodiment 1

Figure 1:
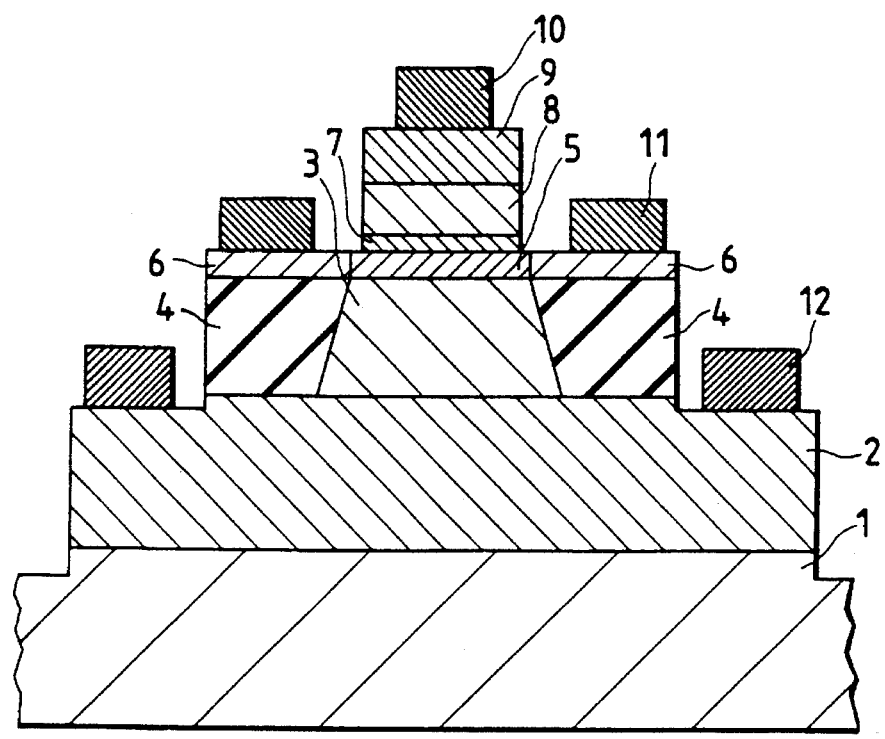
FIG. 1 is a sectional view of an AlGaAs/GaAs heterojunction bipolar transistor shown in Embodiment 1.

A first embodiment of the present invention will be described with reference to FIG. 1. FIG. 1 is a vertical sectional view of an AlGaAs/GaAs HBT in which a base electrode is contacted with only a polycrystalline region. A GaAs (100) substrate was used as a single crystalline semiconductor substrate 1. On the intrinsic portion of the transistor, there were formed a heavily doped GaAs layer 2 (Si concentration; $5\times10^{18}/cm^3$, film thickness; 500 nm) as a subcollector layer, an n-type doped GaAs layer 3 (Si concentration; $5\times10^{16}/cm^3$, film thickness; 400 nm) as a collector layer, a heavily doped p-type GaAs layer 5 (Be concentration; $4\times10^{20}/cm^3$, film thickness; 100 nm) as a base layer, an undoped GaAs layer 7 (film thickness; 50 nm) as a spacer layer (which prevents the diffusion of Be from base to emitter), an n-type doped AlGaAs layer 8 (AlAs mole ratio; 0.3, Si concentration; $1\times10^{18}/cm^3$, film thickness; 150 nm) as an emitter layer, and a heavily doped n-type GaAs layer 9 (Si concentration; $5\times10^{18}/cm^3$, film thickness; 200 nm) as a cap layer for forming an emitter-ohmic contact.

A $SiO_2$ film 4 (film thickness; 400 nm) was formed on an extrinsic collector region, and a heavily doped p-type polycrystalline GaAs layer 6 (Be concentration; $4\times10^{20}/cm^3$, film thickness; 100 nm) was formed on an extrinsic base region.

An AuGe film (film thickness; 200 nm) was used as an emitter electrode 10 and a collector electrode 12, and an AuZu film (film thickness; 200 nm) was used as a base electrode 11.

In this embodiment, the $SiO_2$ film with a low relative dielectric constant was used as the extrinsic collector region, and the polycrystalline GaAs layer with the Be concentration of $4\times10^{20}/cm^3$ or more was used as the extrinsic base region. This makes it possible to reduce the extrinsic base-collector capacitance to be about one-third as less as that of the prior art HBT without significantly increasing the base resistance. As a result, the maximum oscillation frequency becomes about 1.7 times as much as that of the prior art HBT.

Figure 2:
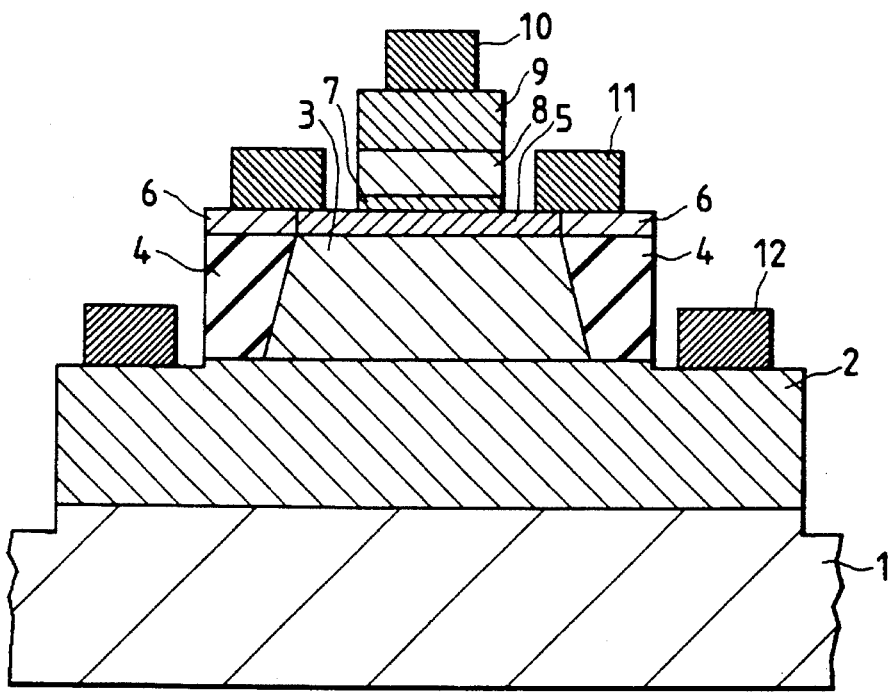
FIG. 2 is a sectional view of the other AlGaAs/GaAs heterojunction bipolar transistor shown in Embodiment 1.
Figure 3:
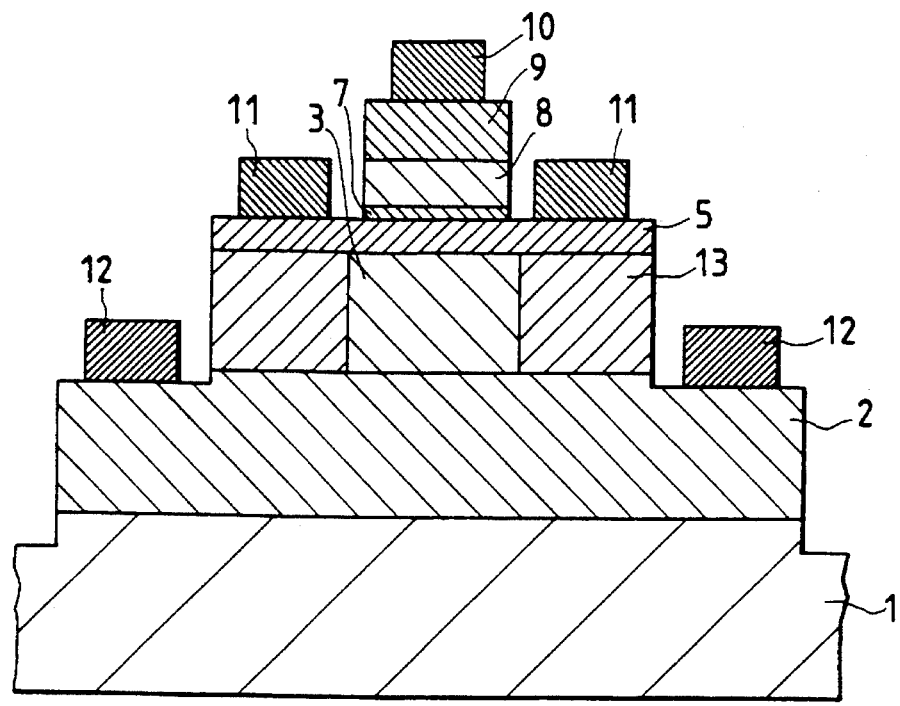
FIG. 3 is a sectional view of an AlGaAs/GaAs heterojunction bipolar transistor fabricated by a prior art.

FIG. 2 shows an HBT having such a structure that the width of the collector region is broaden and the base electrode is contacted with both the polycrystalline region and the single crystalline region. In FIG. 2, the parts corresponding to those in FIG. 1 are indicated at the same symbols. With the structure shown in FIG. 2, while the extrinsic basecollector capacitance is increased by several percentages as compared with that shown in FIG. 1, the contact resistivity of the base electrode is lowered, thus obtaining substantially the same characteristic.

Embodiment 2

An AlGaAs/GaAs HBT using a polycrystalline compound semiconductor having the other sectional structure will be described with reference to FIG. 5.

Figure 5:
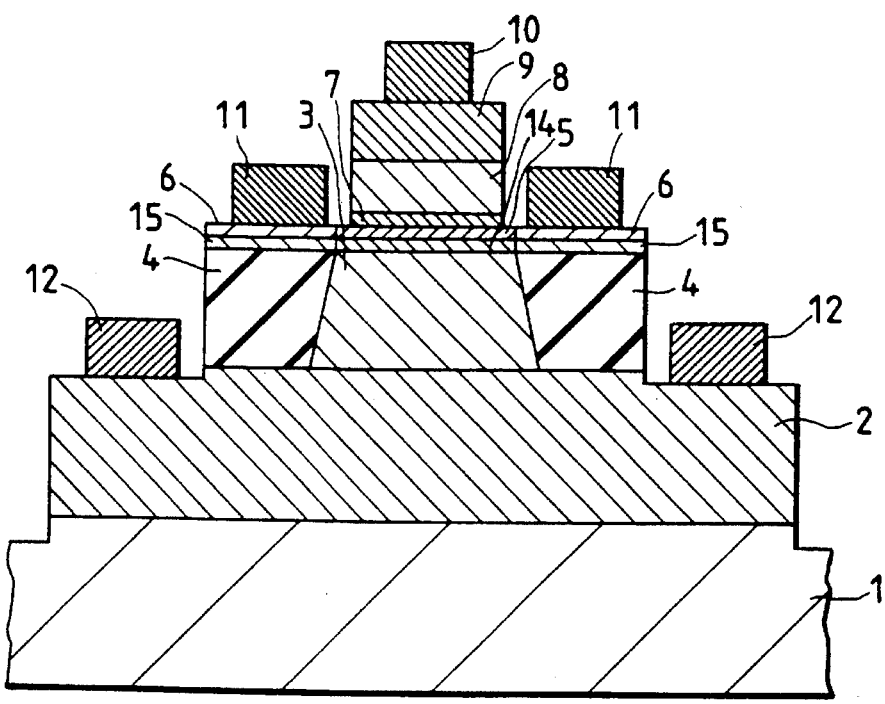
FIG. 5 is a sectional view of an AlGaAs/GaAs heterojunction bipolar transistor shown in Embodiment 2.
Figure 4:
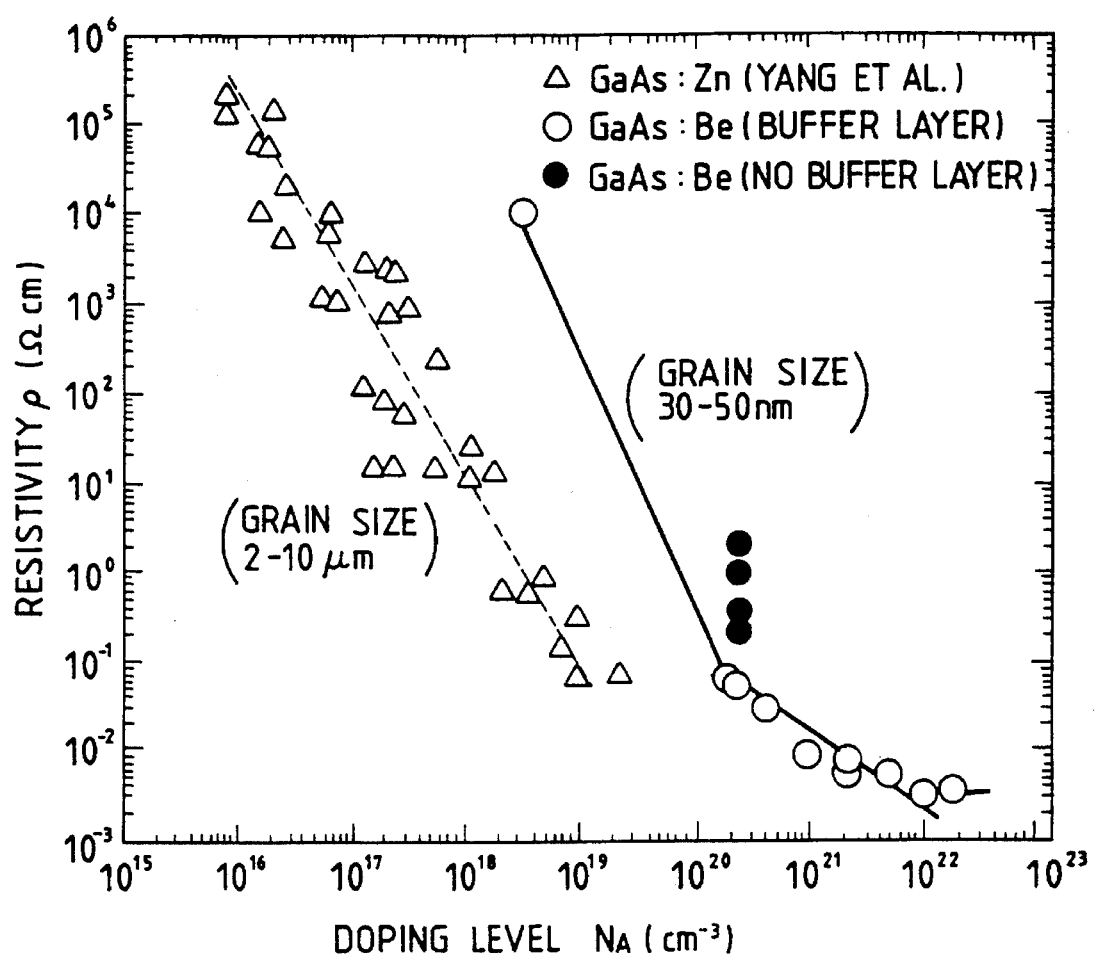
FIG. 4 is a graph showing the doping level dependency on the resistivity of a polycrystalline GaAs.

The HBT shown in FIG. 5 is the same in the layer structure as in that shown in FIG. 1, except that the film thicknesses of the heavily doped p-type GaAs layer 5 and the heavily doped p-type polycrystalline GaAs layer 6 are made thinner from 100 nm to 70 nm, and an n-type GaAs layer 14 (Si concentration; $5\times10^{16}/cm^3$, film thickness; 30 nm) and an n-type polycrystalline GaAs layer 15 (Si concentration; $5\times10^{16}/cm^3$, film thickness; 30 nm) are respectively formed between the $SiO_2$ film 4 and layers 5 and 6.

According to this embodiment, although the thickness of the extrinsic base region is thin (70 nm), the buffer layer with a thickness of 30 nm is present on the dielectric film. Accordingly, the thickness of the base layer can be made thin without increasing the base resistance due to the discontinuity of the polycrystalline boundaries, and also the base-collector extrinsic capacitance can be reduced using the $SiO_2$ with a lower relative dielectric constant as the extrinsic collector region. This makes it possible to realize a very high speed HBT being high in both the cutoff frequency and maximum oscillation frequency.

Embodiment 3

Figure 6:
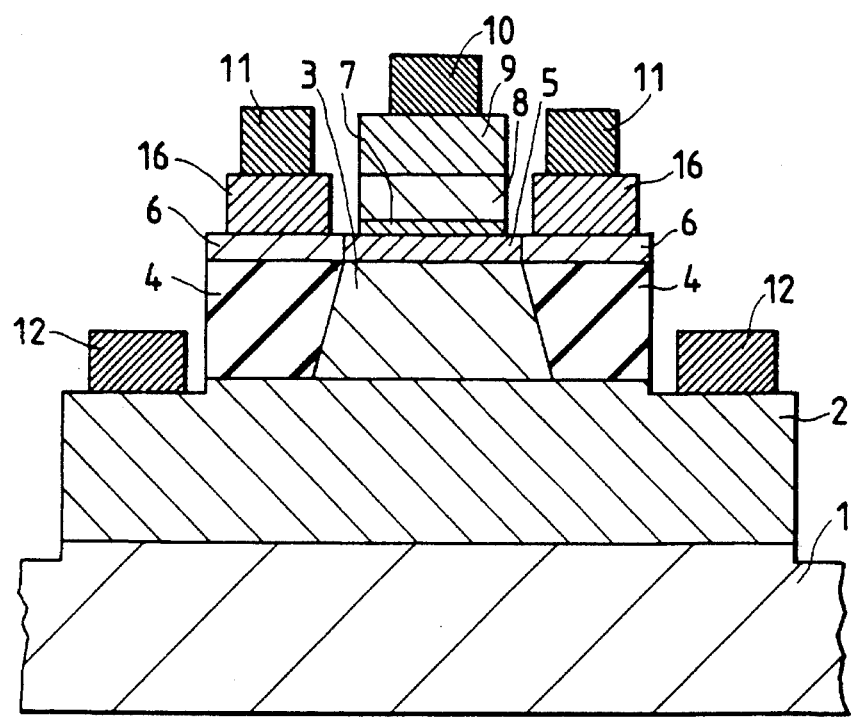
FIG. 6 is a sectional view of an AlGaAs/GaAs heterojunction bipolar transistor shown in Embodiment 3.

A third embodiment of the present invention will be described with reference to FIG. 6. FIG. 6 shows a sectional structure of an AlGaAs/GaAs HBT. In this structure shown in FIG. 1, on the heavily doped p-type polycrystalline GaAs layer 6, a heavily doped polycrystalline GaAsSb layer 16 (GaSb mole ratio; 0.8, C concentration; $4\times10^{20}/cm^3$, film thickness; 200 nm) with an energy gap smaller than that of the p-type GaAs layer 6 is provided as part of the extrinsic base region. The other layer structure is the same as that in FIG. 1.

According to this embodiment, since the minimum value (about 0.7 eV at room temperature) of the energy gap in the extrinsic base region can be made smaller than the minimum value (about 1.43 eV at room temperature) of the energy gap in the base layer, the carrier concentration and mobility in the extrinsic base region are increased, so that the base resistance is further reduced as compared with the Embodiment 1, thus making it possible to realize a very high speed HBT.

Although the polycrystalline GaAsSb (GaSb mole ratio; 0.8) is used as the layer 16 in this embodiment, the alloy composition is not limited thereto. In place of GaAsSb, the other polycrystalline semiconductor with a small energy gap such as InGaAs, InAsSb and SiGe may be used.

Embodiment 4

Figure 7:
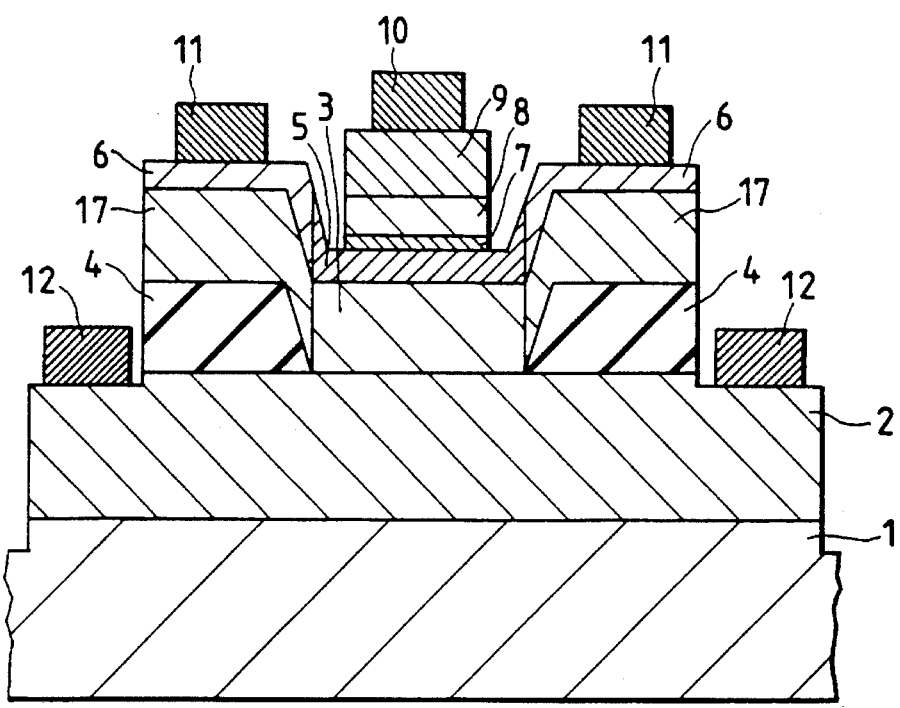
FIG. 7 is a sectional view of an AlGaAs/GaAs heterojunction bipolar transistor shown in Embodiment 4.

A fourth embodiment of the present invention will be described with reference to FIG. 7. FIG. 7 is a sectional view of an AlGaAs/GaAs HBT. The HBT shown in FIG. 7 has such a structure that an n-type polycrystalline GaAs layer 17 (Si concentration; $5\times10^{16}/cm^3$, film thickness; 400 nm) is interposed between the heavily doped p-type polycrystalline GaAs layer 6 and the SiO₂ layer 4 shown in FIG. 1, and the side surface of the SiO₂ film 4 is made acute against the substrate 1.

Since the carriers in the layer 17 are depleted, the extrinsic base-collector capacitance is reduced to be about four-fifth that of the HBT shown in FIG. 1 and about four-fifteenth that of the prior art HBT.

According to this embodiment, the depleted semiconductor layer 17 is used as the extrinsic base region together with the dielectric film 4, the extrinsic base-collector capacitance is further reduced as compared with the case of using only the dielectric film, which makes it possible to further increase the maximum oscillation frequency.

Embodiment 5

Figure 8:
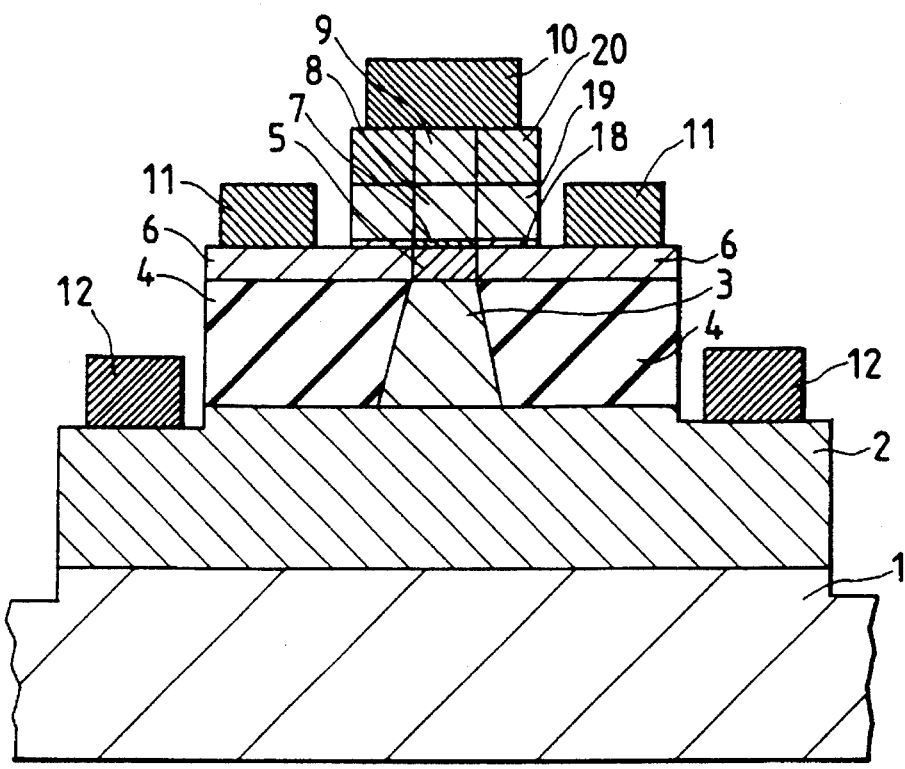
FIG. 8 is a sectional view of an AlGaAs/GaAs heterojunction bipolar transistor shown in Embodiment 5.

A fifth embodiment of the present invention will be described with reference to FIG. 8. FIG. 8 is a sectional view of an AlGaAs/GaAs heterojunction HBT. The HBT shown in FIG. 8 has such a structure that the width of the collector region of the HBT shown in FIG. 1 is narrowed, and an undoped polycrystalline GaAs layer 18 (film thickness; 50 nm), an n-type polycrystalline AlGaAs layer 19 (AlAs mole ratio; 0.3, Si concentration; $1\times10^{18}/cm^3$, film thickness; 150 nm) and a heavily doped n-type polycrystalline GaAs layer 20 (Si concentration; $5\times10^{18}/cm^3$, film thickness; 200 nm) are formed around the single crystalline layers 7, 8 and 9, respectively.

As a result of measurement for the current-voltage characteristic of the HBT under the condition that the emitter area is changed, it is confirmed that the emitter current mainly flows through the layers 7, 8 and 9 as the single crystalline regions for the emitter, and is little flows through the layers 18, 19 and 20.

According to this embodiment, since the emitter electrode is contacted with both the single crystalline region and the polycrystalline region, the area of the emitter single crystalline region can be made smaller than the emitter area, as a result of which the size of the emitter region is decreased, and also the size of the whole device is easily decreased, which makes it possible to realize a very high speed HBT with a small extrinsic capacitance.

Although the above-described embodiments 1 to 5 show the AlGaAs/GaAs HBT, the present invention may be similarly applied to be HBTs using the other III–V compound semiconductors such as InAlAs/InGaAs or InP/InGaAs. In this case, C may be used as the base layer impurities in place of Be. Further, the SiO₂ film is used as the extrinsic collector region in this embodiment; however, the other dielectric film such as a Si₃N₄ film may be used. Additionally, the GaAs (100) face is used as the substrate in this embodiment; however, the other material and the other crystal orientation may be used.

Embodiment 6

A fabrication method for the AlGaAs/GaAs HBT shown in Embodiment 1 will be described with reference to FIGS. 9 to 15.

First, a GaAs (100) substrate 1 was etched using an etchant composed of a mixed solution of sulfuric acid, hydrogen peroxide and water, and washed by flowing water, after which it was introduced in a molecular beam epitaxy system. The substrate 1 was heated at 580° C. with As₄ molecular beam to remove a native oxide present on the surface of the substrate 1, and then a heavily doped n-type GaAs layer 2 (Si concentration; $5\times10^{18}/cm^3$, film thickness; 500 nm) was formed by epitaxial growth under the condition that the substrate temperature was 580° C. and the ratio of partial pressure of As₄ to Ga was 15.

Subsequently, the substrate 1 was removed from the molecular beam epitaxy system, an SiO₂ film 4 (film thickness; 300 nm) was deposited by a thermally resolved chemical vapor deposition method (see FIG. 9).

The substrate 1, in which an opening was formed on the SiO₂ film 4 using the known photolithography and dry etching, was inserted in an organometallic vapor phase epitaxy system, and an n-type GaAs layer 3 (Si concentration; $5\times10^{16}/cm^3$, film thickness; 400 nm) was selectively formed only in the above opening using a selective epitaxial growth method (see FIG. 10).

Figure 11:
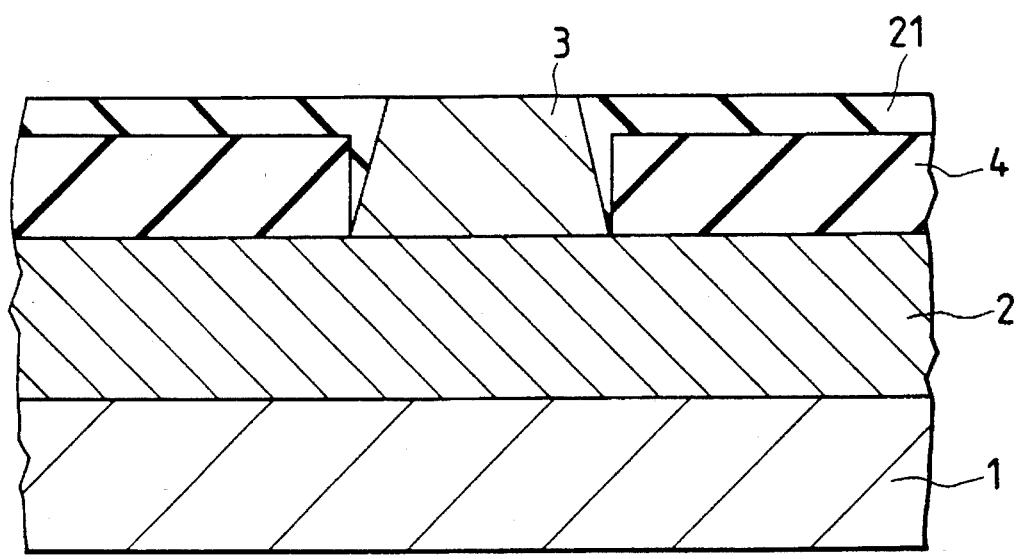

Then, a spin-on-glass 21 (SOG film, film thickness; 2 μm) was coated over the surface to flatten the surface, and the dry etching was made over the surface, to expose the surface of the above n-type GaAs layer 3 (see FIG. 11).

The substrate 1 was introduced in the molecular beam epitaxy system again, and was heated at 580° C. with As₄ molecular beam, to remove a native oxide on the surface of the substrate 1. Then, a heavily doped p-type GaAs layer 5 (Be concentration; $4\times10^{20}/cm^3$, film thickness; 100 nm) and a heavily doped p-type polycrystalline GaAs layer 6 (Be concentration; $4\times10^{20}/cm^3$, film thickness; 100 nm) were simultaneously formed under the condition that the substrate temperature was decreased to 450° C. and the ratio of partial pressure of As₄ to Ga was 100. Subsequently, an undoped GaAs layer 7 (film thickness; 50 nm) and an undoped polycrystalline GaAs layer 18 (film thickness; 50 nm), an n-type AlGaAs layer 8 (AlAs mole ratio; 0.3, Si concentration; $1\times10^{18}/cm^3$, film thickness; 150 nm) and an n-type polycrystalline AlGaAs layer 19 (AlAs mole ratio; 0.3, Si concentration; $1\times10^{18}/cm^3$, film thickness; 150 nm), and a heavily doped n-type GaAs layer 9 (Si concentration; $5\times10^{18}/cm^3$, film thickness; 200 nm) an a heavily doped n-type polycrystalline GaAs layer 20 (Si concentration; $1\times10^{18}/cm^3$, film thickness; 150 nm) were simultaneously formed under the condition that the substrate temperature was 450° C. and the ratio of partial pressure of $As_4$ to Ga was 15, respectively see FIG. 12).

Figure 13:
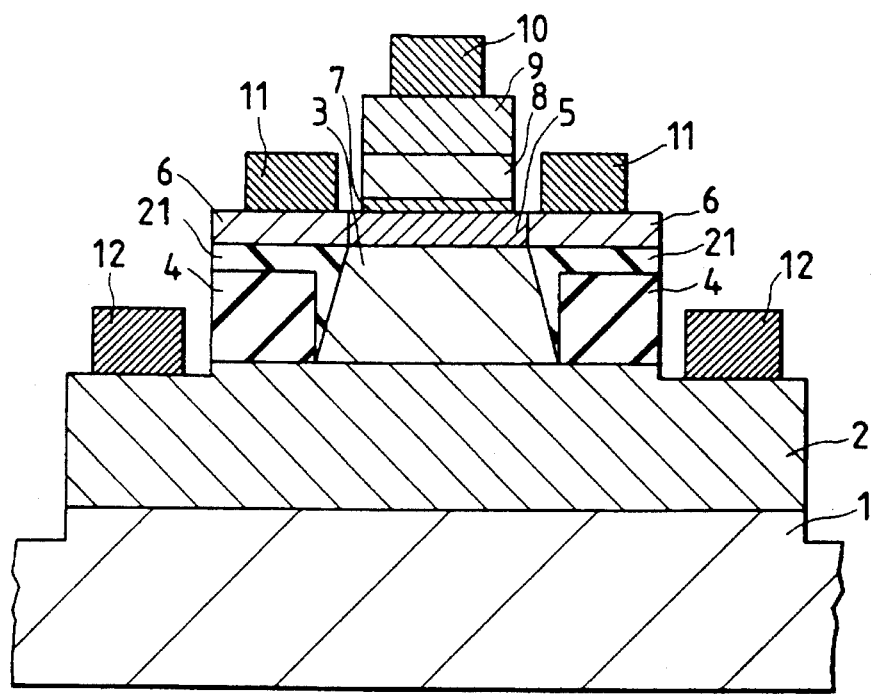

After the substrate 1 was removed from the molecular beam epitaxy system, the surfaces of the extrinsic base region and the subcollector layer were respectively exposed using photolithography and dry etching, and an emitter electrode 10, a base electrode 11 and a collector electrode 12 were formed, to thus fabricate an HBT (see FIG. 13).

Figure 14A:
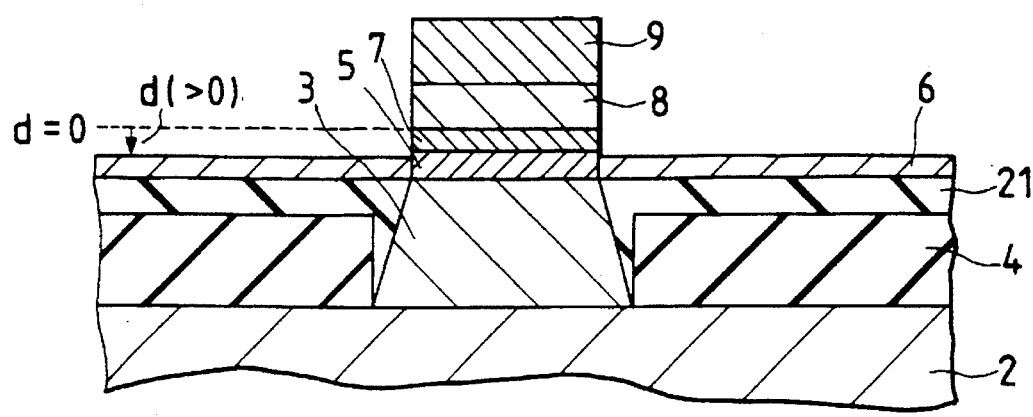
FIGS. 14a and 14b are views for explaining the fabrication method for the AlGaAs/GaAs heterojunction bipolar transistor shown in FIG. 13.
Figure 14B:
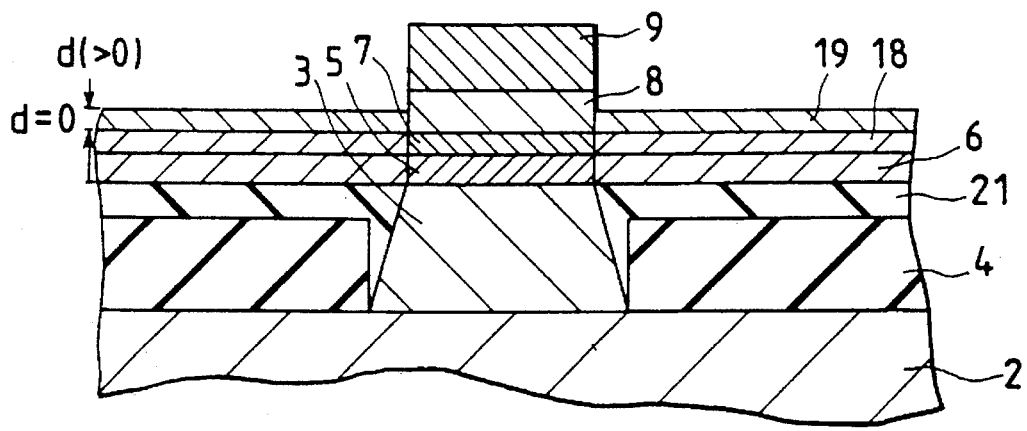
Figure 15:
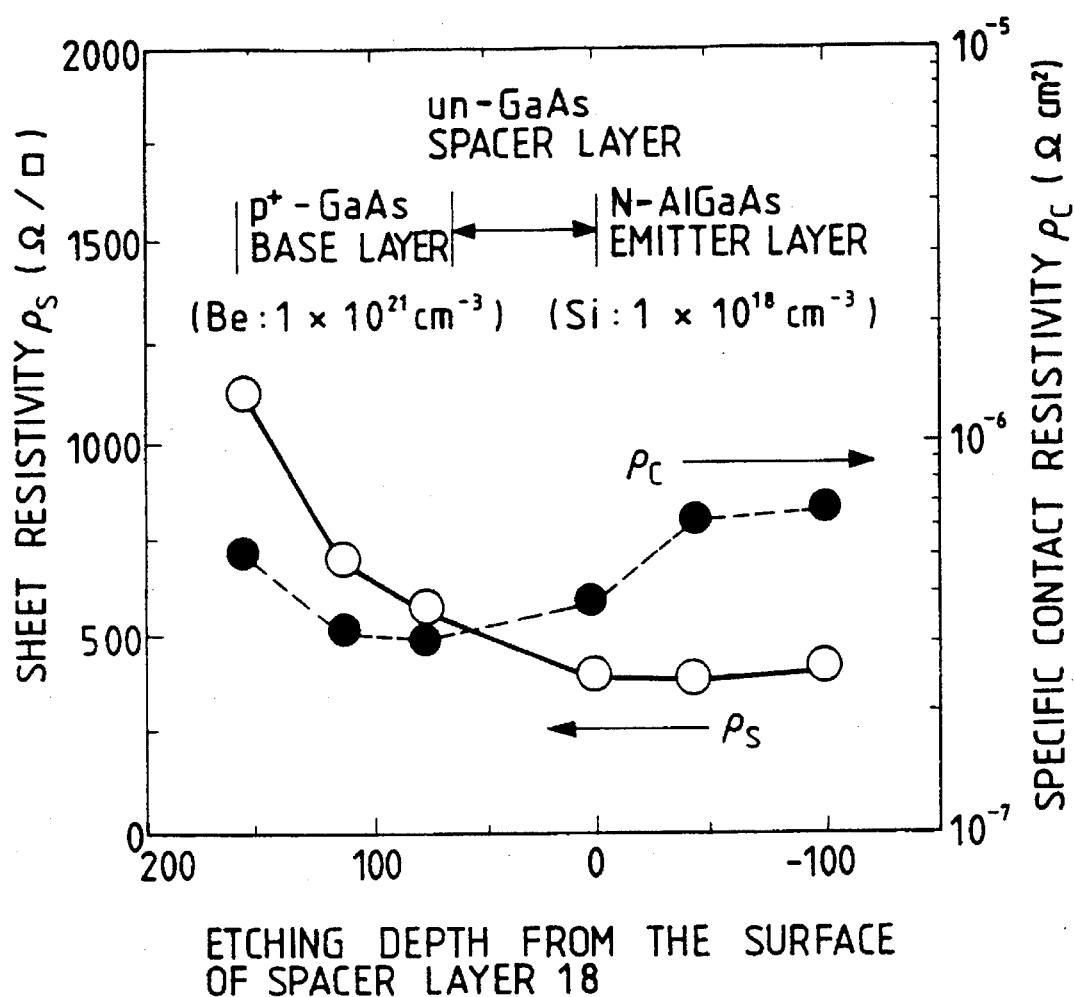
FIG. 15 is a graph showing the dependency of an etching depth in an extrinsic base region on the sheet resistivity of a heavy doped polycrystalline GaAs layer and the specific constant resistivity of a base electrode.

Here, in the etching for exposing the surface of the extrinsic base region, the termination of the etching is not necessarily required to be accurately controlled on the surface of the p-type polycrystalline GaAs layer 6 as shown in FIG. 13. This is dependent on the result of the experiment in which the dependency of the etching depth on the sheet resistivity of the heavily doped p-type polycrystalline GaAs layer 6 and the specific contact resistivity of the base electrode, and will be described with reference to FIGS. 14 and 15. FIG. 14($a$) shows the vicinity of the emitter-base region in the case that the layer 6 is over-etched to expose the surface of the extrinsic base region; and FIG. 14($b$) shows the vicinity of the emitter-base region in the case that the etching is made while parts of the layers 18 and 19 are left. Assuming that the etching depth from the surface of the layer 18 is taken as d, the etching to expose the surface of the extrinsic base region is accurately performed when d is ds (ds is a film thickness of the layer 18, and is 70 nm in this experiment). The result of the experiment in which an AuZn based alloy electrode is used as the base electrode and Be is used as the base layer impurities is shown in FIG. 15. It is revealed that, when d is specified in the range of −100 nm<d<80 nm, that is, when the over-etched depth of the layer 6 in FIG. 14($a$) is 80 nm or less, or when the unetched thickness of the layers 18 and 19 is 100 nm or less, the sheet resistivity is kept to be low, and the increase in the specific contact resistivity is not at stake so much. This is true for the case of using the AuZu based alloy electrode even when C is used as the impurities doped in the base layer, and for the case of using Be as the impurities doped in the base layer even when the non-alloy electrode such as W or Al is used as the base electrode. The former may be considered to be dependent on the effect of the diffusion of the p-type impurities Zn to the layer 6, and the latter may be considered to be dependent on the diffusion of Be to the layers 18 and 19.

In this embodiment, and in the explanatory views of the other embodiments relating to the fabrication methods for the HBTs described later, for simplification, there will be shown the cases that the surfaces of the extrinsic base regions are accurately exposed; however, they include the allowable range of −100 nm<d<80 nm.

According to this embodiment, since the extrinsic base region is formed by the molecular beam epitaxy method under the condition that the substrate temperature is 450° C. or less and the ratio of partial pressure of a V-group element to a III-group element is 50 or more, there can be fabricated an ultra-high speed HBT being small in the extrinsic base-collector capacitance without significantly increasing the base resistance even if the extrinsic base region is polycrystal. Further, since the space between the inclined semiconductor surface such as {111} face emerged in the selective epitaxial growth for the collector layer and the vertically formed side surface of the dielectric film is filled with the spin-on-glass, when the base layer is formed, there is no fear of causing the base-collector short circuit or breakage by the deposition of the semiconductor layer within the spacer, thus making is possible to fabricate the HBT with high yield.

Embodiment 7

Figure 16:
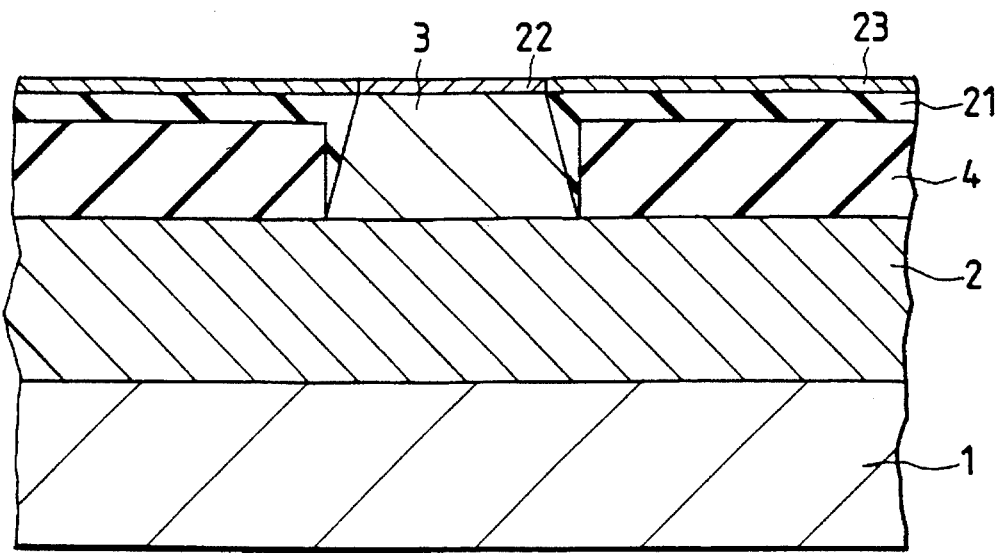
FIGS. 16 to 18 are flow diagrams showing another fabrication method for the AlGaAs/GaAs heterojunction bipolar transistor shown in FIG. 1.
Figure 17:
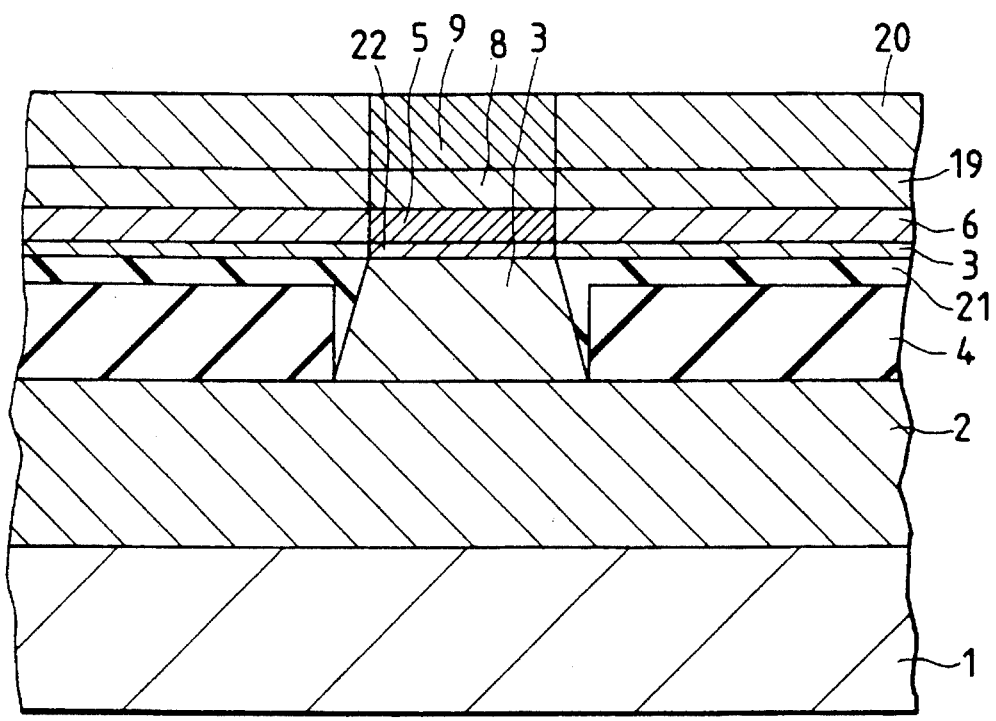

Another fabrication method for the AlGaAs/GaAs HBT shown in Embodiment 1 will be described with reference to FIGS. 16 to 18.

First, the substrate 1 in the state shown in FIG. 11 was inserted in the molecular beam epitaxy system, and then heated at 580° C. with $As_4$ molecular beam to remove a native oxide present on the surface of the substrate 1. After that, an undoped GaAs one molecular layer 22 and an undoped polycrystalline GaAs one molecular layer 23 were simultaneously formed under the condition that the substrate temperature was 450° C. and the ratio of partial pressure of $As_4$ to Ga was 50 (see FIG. 16). In addition, the film thicknesses of the layers 22 and 23 may be made thick insofar as one molecular layer or more.

The above substrate 1 was removed from the molecular beam epitaxy system, and was inserted in an organometallic vapor phase epitaxy system or an organometallic molecular beam epitaxy system. Then, a heavily doped p-type GaAs layer 5 (C concentration; $4\times10^{20}/cm^3$, film thickness; 100 nm) and a heavily doped p-type polycrystalline GaAs layer 6 (C concentration; $4\times10^{20}/cm^3$, film thickness; 100 nm) were simultaneously formed under the condition that the substrate temperature was 450° C. and the ratio of partial pressure of $As_4$ to Ga was 50. Subsequently, a doped n-type AlGaAs layer 8 (AlAs mole ratio; 0.3, Si concentration; $1\times10^{18}/cm^3$, film thickness; 150 nm) and a doped n-type polycrystalline AlGaAs layer 19 (AlAs mole ratio; 0.3, Si concentration; $1\times10^{18}/cm^3$, film thickness; 150 nm), and a heavily doped n-type GaAs layer 9 (Si concentration; $5\times10^{18}/cm^3$, film thickness; 200 nm) and a heavily doped n-type polycrystalline GaAs layer 20 (Si concentration; $1\times10^{18}/cm^3$, film thickness; 200 nm) were simultaneously formed under the condition that the substrate temperature was 450° C. and the ratio of partial pressure of $As_4$ to Ga was 15, respectively (see FIG. 17).

Figure 18:
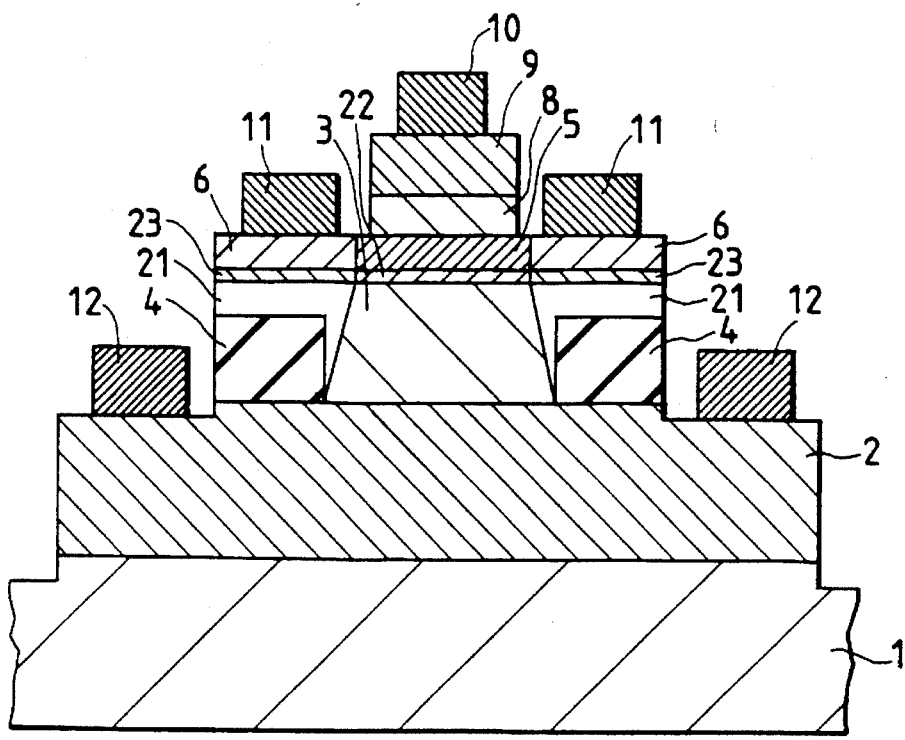
Figure 19:
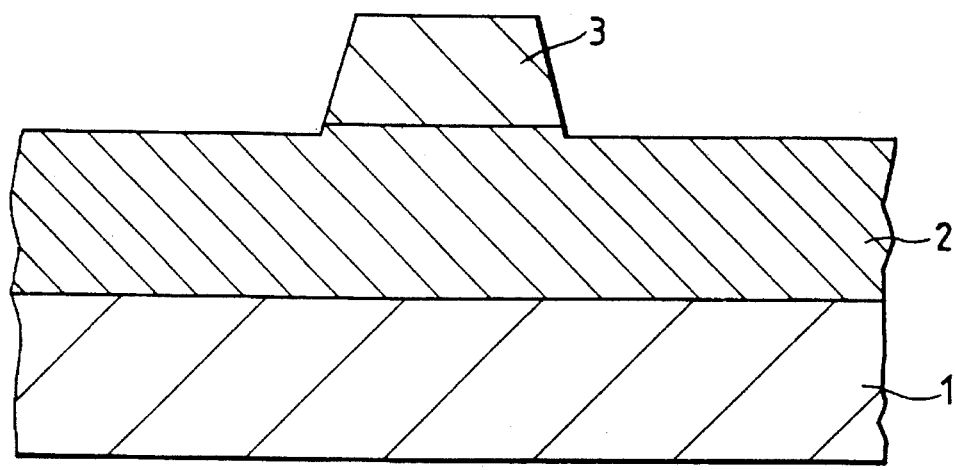
FIGS. 19 to 23 are flow diagrams showing the other fabrication method for the AlGaAs/GaAs heterojunction bipolar transistor having the sectional structure shown in FIG. 1.

The above substrate 1 was removed from the organometallic vapor phase epitaxy system or the organometallic molecular beam epitaxy system, and the surfaces of an extrinsic base region 6 and a sub-collector layer 2 were exposed by the known photoetching (photolithography), after which an emitter electrode 10, a base electrode 11 and a collector electrode 12 were formed, to thus fabricate the HBT (see FIG. 18).

According to this embodiment, since at least one molecular layer of the semiconductor is formed between the extrinsic base region and the dielectric film by a molecular beam epitaxy method, it is possible to grow the polycrystalline semiconductor layer with the semiconductor layer formed on the dielectric film as a nucleus of crystal growth even using the organometallic vapor phase epitaxy method or the organometallic molecular beam epitaxy method which are difficult to grow the semiconductor layer on the dielectric film. By use of the organometallic vapor phase epitaxy method or the organometallic molecular beam epitaxy method, it is possible to utilize C, which is difficult to be doped in high concentration by the molecular beam epitaxy method, as the p-type impurities. Since C is difficult to be diffused as compared with Be, in Embodiment 6, the layers 7 and 18 used as the spacer layer for preventing the diffusion of Be from base to emitter are eliminated, and also there can be fabricated the HBT excellent in the repeatability of the device characteristics and in the reliability. Further, since the space between the inclined semiconductor surface such as {111} face emerged in the selective epitaxial growth for the collector layer and the side surface of the dielectric film is filled with the spin-on-glass, there can be fabricated the HBT with high yield without the problem of causing the base-collector short circuit or breakage due to the deposition of the semiconductor layer of the base layer in the spacer.

Embodiment 8

The other fabrication method for the AlGaAs/GaAs HBT shown in Embodiment 1 will be described with reference to FIGS. 19 to 23.

First, a GaAs (100) substrate 1 was etched using an etchant composed of a mixed solution of sulfuric acid, hydrogen peroxide and water, and washed by flowing water, after which it was introduced in a molecular beam epitaxy system. The substrate 1 was heated at 580° C. with $As_4$ molecular beam to remove a native oxide present on the surface of the substrate 1. Then, a heavily doped n-type GaAs layer 2 (Si concentration; $5 \times 10^{18}/cm^3$, film thickness; 500 nm) and a n-type GaAs layer 3 (Si concentration; $5 \times 10^{16}/cm^3$, film thickness; 400 nm) were formed by epitaxial growth under the condition that the substrate temperature was 580° C. and the ratio of partial pressure of $As_4$ to Ga was 15. Subsequently, the substrate 1 was removed from the molecular beam epitaxy system, and the side surface of the layer 3 was processed to be acute against the substrate 1 using the known photoetching (see FIG. 19).

Figure 20:
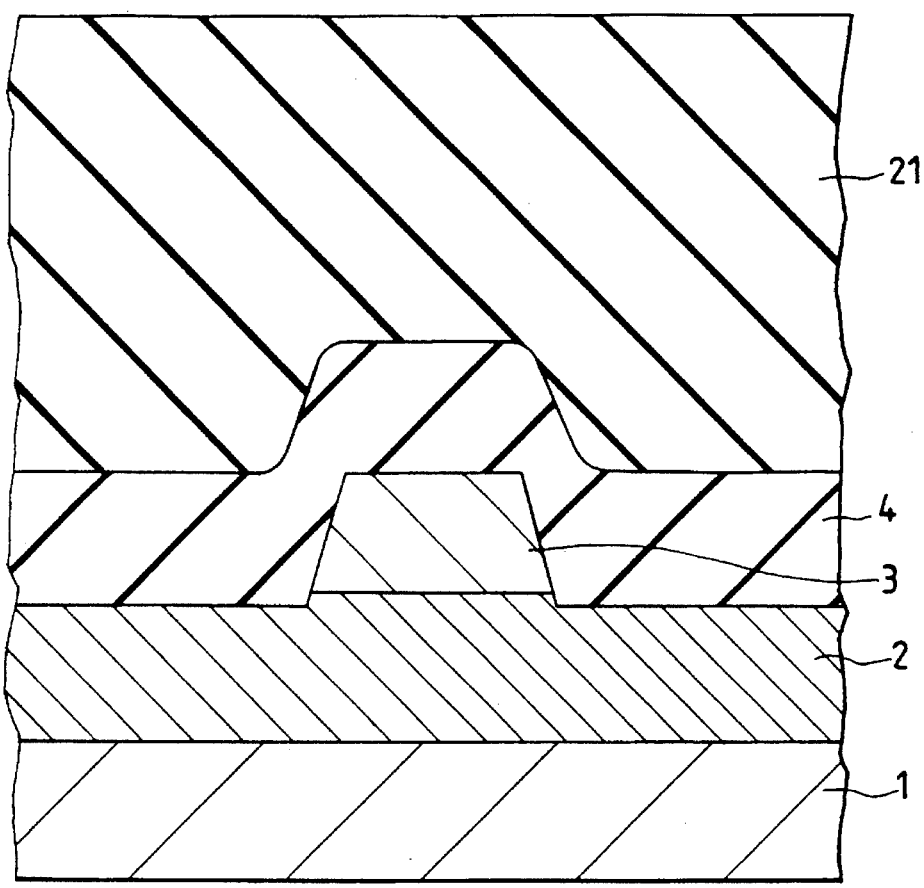
Figure 21:
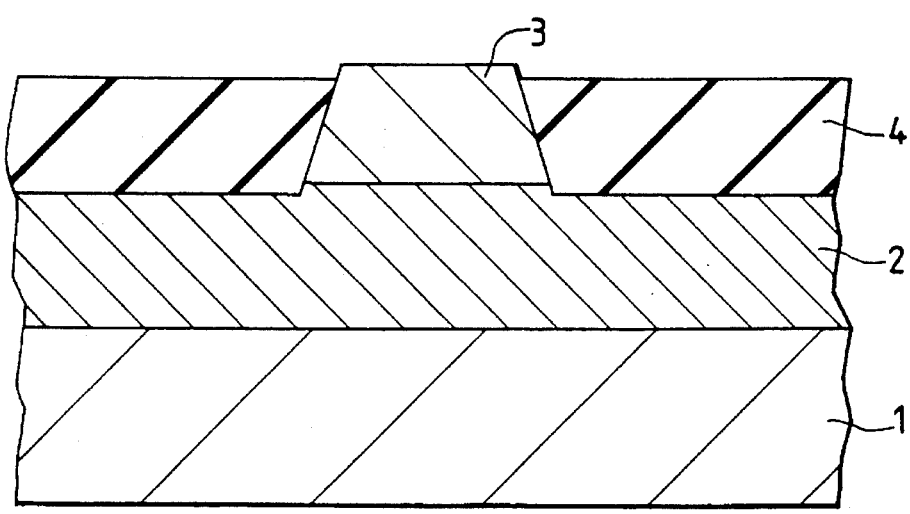
Figure 22:
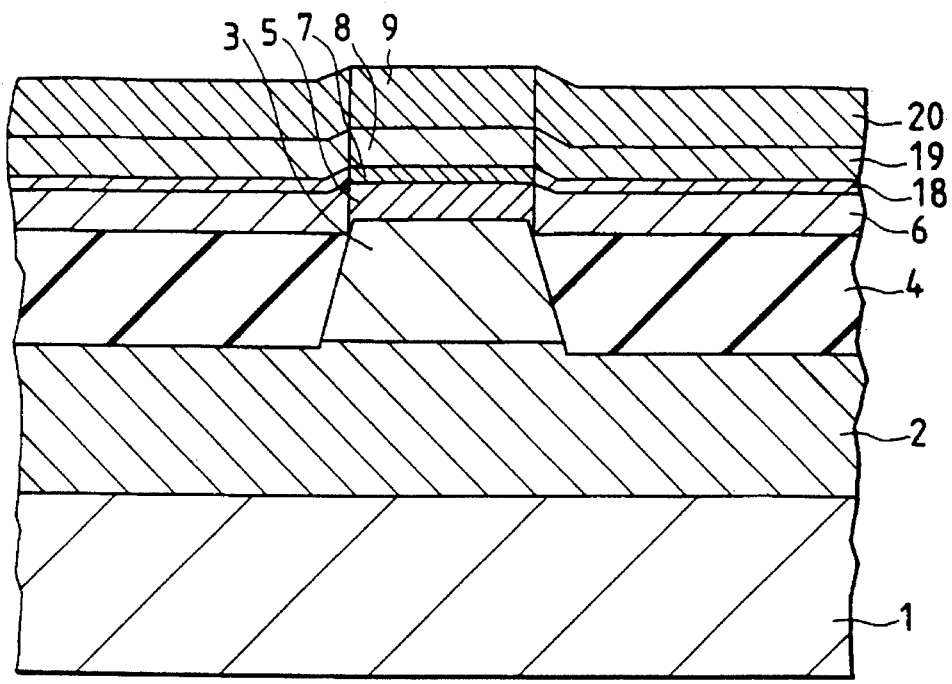

An $SiO_2$ film 4 (film thickness; 400 nm) was deposited by a thermally resolved chemical vapor deposition method, and then a spin-on-glass 21 (film thickness; 2 μm) was coated to flatten the surface (see FIG. 20).

The anisotropic etching was made over the whole surface, to expose the surface of the layer 3 (see FIG. 21), after which the substrate 1 was introduced in the molecular beam epitaxy system.

The substrate 1 was heated at 580° C. with $As_4$ molecular beam, to remove a native oxide on the surface of the substrate 1. Then, a heavily doped p-type GaAs layer 5 (Be concentration; $4 \times 10^{20}/cm^3$, film thickness; 100 nm) and a heavily doped p-type polycrystalline GaAs layer 6 (Be concentration; $4 \times 10^{20}/cm^3$, film thickness; 100 nm) were simultaneously formed under the condition that the substrate temperature was decreased to 450° C. and the ratio of partial pressure of $As_4$ to Ga was 150. Subsequently, an undoped GaAs layer 7 (film thickness; 50 nm) and an undoped polycrystalline GaAs layer 18 (film thickness; 50 nm), an n-type AlGaAs layer 8 (AlAs mole ratio; 0.3, Si concentration; $1 \times 10^{18}/cm^3$, film thickness; 150 nm) and an n-type polycrystalline AlGaAs layer 19 (AlAs mole ratio; 0.3, Si concentration; $1 \times 10^{18}/cm^3$, film thickness; 150 nm), and a heavily doped n-type GaAs layer 9 (Si concentration; $5 \times 10^{18}/cm^3$, film thickness; 200 nm) and a heavily doped n-type polycrystalline GaAs layer 20 (Si concentration; $1 \times 10^{18}/cm^3$, film thickness; 200 nm) were simultaneously formed under the condition that the substrate temperature was 450° C. and the ratio of partial pressure of $As_4$ to Ga was 15, respectively (see FIG. 22).

Figure 23:
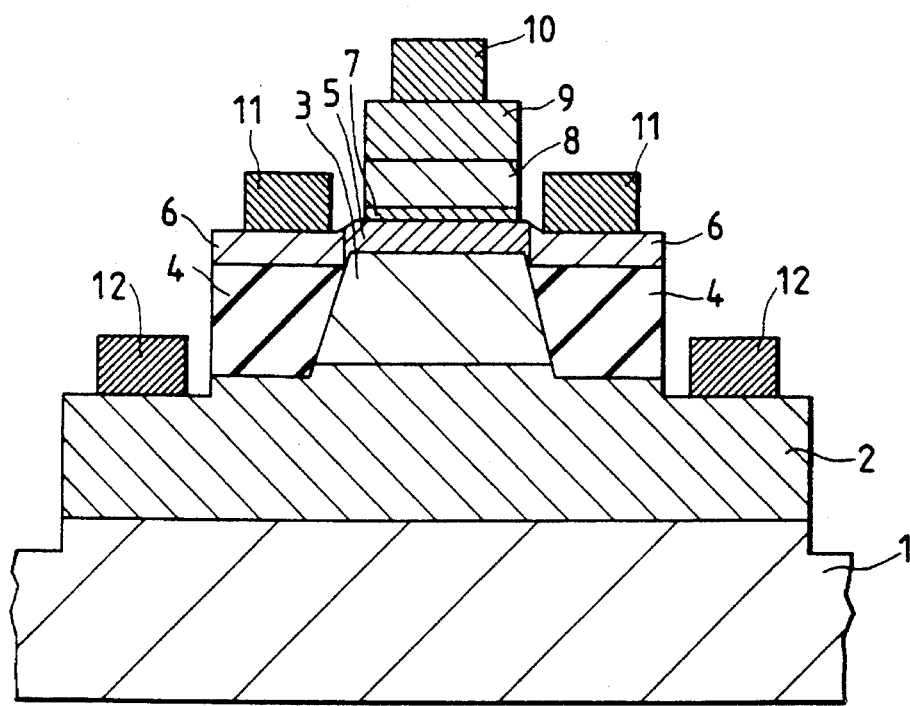
Figure 24:
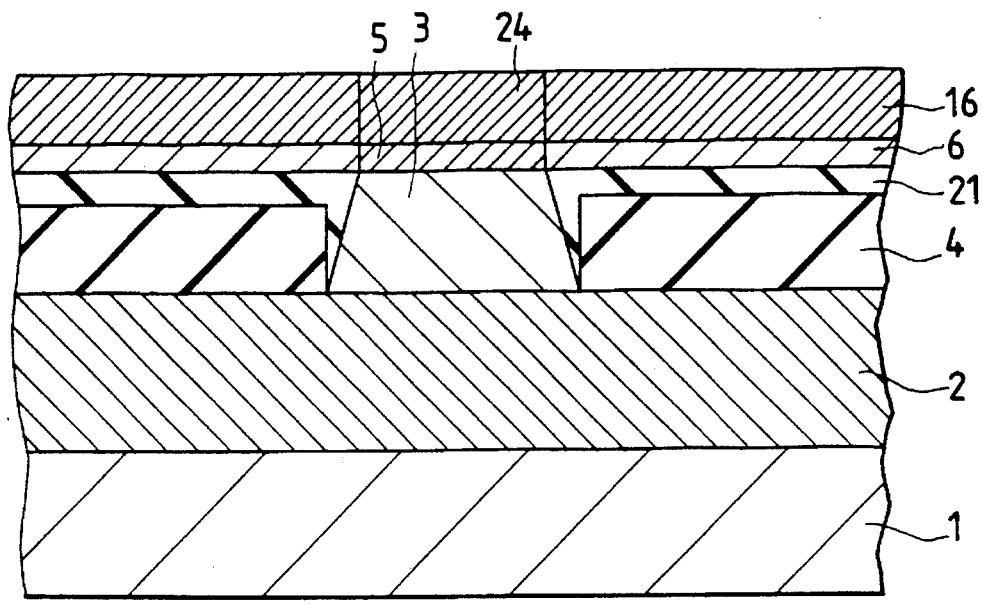
FIGS. 24 to 27 are flow diagrams showing a fabrication method for the AlGaAs/GaAs heterojunction bipolar transistor having the sectional structure shown in FIG. 6.
Figure 25:
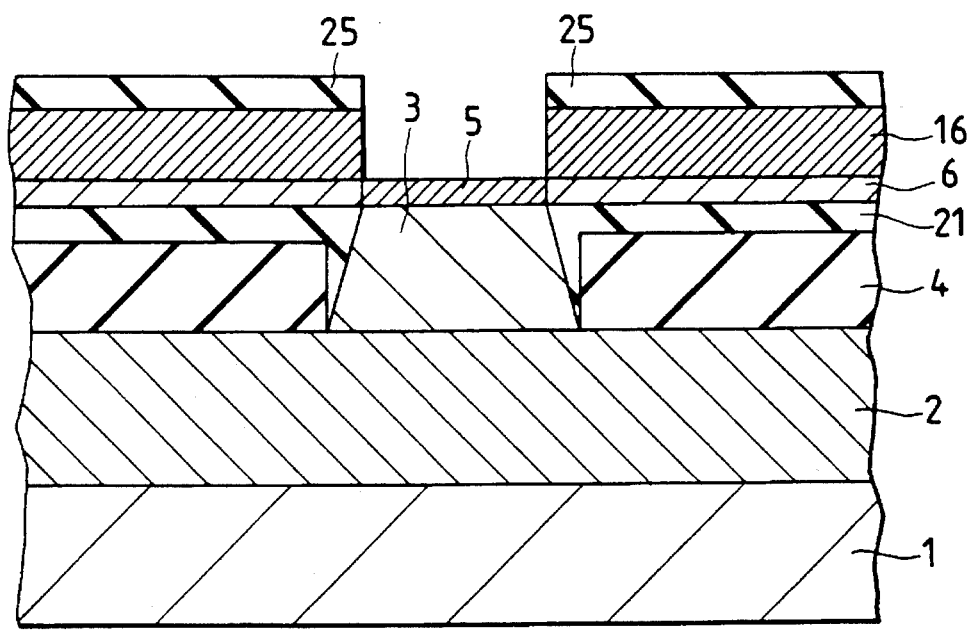
Figure 26:
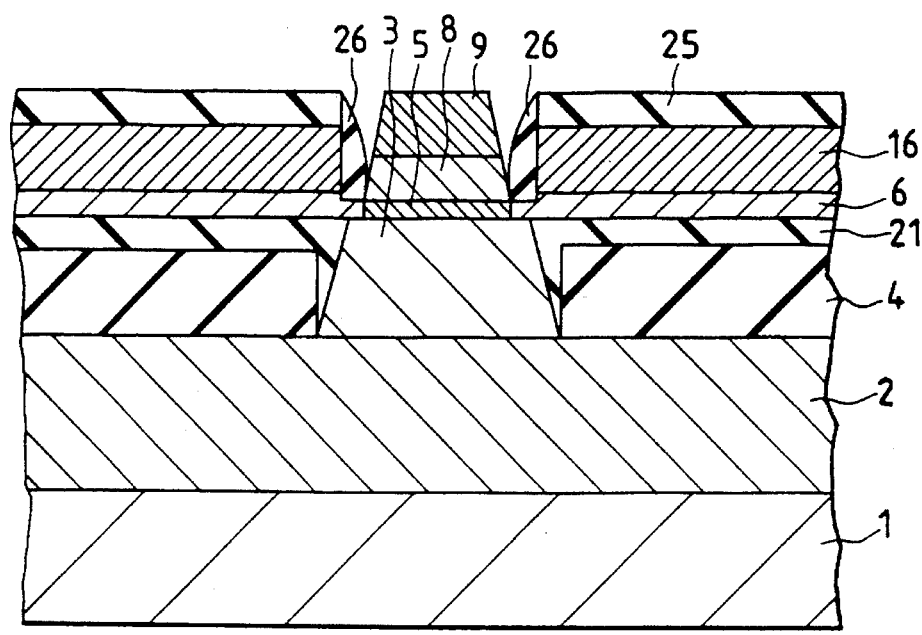

After the substrate 1 was removed from the molecular beam epitaxy system, the surfaces of an extrinsic base region and a sub-collector layer were respectively exposed using the known photoetching, and an emitter electrode 10, a base electrode 11 and a collector electrode 12 were formed, to thus fabricate an HBT (see FIG. 23).

According to this embodiment, since the extrinsic base region is formed by a molecular beam epitaxy method under the condition that the substrate temperature is 450° C. or less and the ratio of partial pressure of a V-group element to a III-group element is 50 or more, even if the extrinsic base region is polycrystal using the $SiO_2$ film with a low relative dielectric constant in the extrinsic collector region, there can be fabricated a very high speed HBT being small in the extrinsic base-collector capacitance without significantly increasing the base resistance. Further, by the processes of making acute the angle between the side surface of the collector layer and the substrate and of flattening the surface by means of deposition of the dielectric film and the etching, the side surface of the collector layer can be perfectly embedded by the dielectric film, which makes it possible to fabricate the HBT with high yield without the problem of causing the base-collector short circuit or breakage.

Embodiment 9

A fabrication method for the AlGaAs/GaAs HBT shown in Embodiment 2 will be described with reference to FIGS. 9 to 13, FIGS. 16 to 18, and FIGS. 19 to 23.

The fabrication method for the AlGaAs HBT having the sectional structure shown in FIG. 5 is basically the same as in the first example (Embodiment 6, FIGS. 9 to 13), the second example (Embodiment 7, FIGS., 16 to 18) and the third example (Embodiment 8, FIGS. 19 to 23) of the fabrication methods for the AlGaAs/GaAs HBT having the sectional structure shown in FIG. 1. In this embodiment, the film thicknesses of the layers 5 and 6 in Embodiments 6 to 8 were made in 70 nm, and before the layers 5 and 6 were formed on the dielectric film, an n-type GaAs layer 14 (Si concentration; $5 \times 10^{16}/cm^3$, film thickness; 30 nm) and an n-type polycrystalline GaAs layer 15 (Si concentration; $5 \times 10^{16}/cm^3$, film thickness; 30 nm) were simultaneously formed using a molecular beam epitaxy method under the condition that the substrate temperature was 450° C., and the ratio of partial pressure of $As_4$ to Ga was 200.

In this embodiment, even when the film thickness of the extrinsic base region 6 formed together with the base layer 5 is made thin to be 70 nm, there is not generated a problem of increasing the resistivity due to the discontinuity of polycrystal grain boundaries. This makes it possible to obtain both the effects of increasing the cutoff frequency due to the thinning of the base layer and of increasing the maximum oscillation frequency due to reduction of the base resistance, and hence to fabricate a very high speed HBT.

Further, as for the formation of a collector layer, a very high speed HBT can be fabricated with high yield while eliminating the problem such as breakage in the vicinity of the extrinsic base region by either of methods of: (a) forming a dielectric film pattern on a single crystalline semiconductor substrate, and selectively forming by epitaxy growth a collector layer composed of an n-type semiconductor layer or a p-type semiconductor layer of an impurity concentration not more than $1 \times 10^{17}/cm^3$ only on a region where any dielectric film is not present, and depositing the dielectric film on the collector layer and flattening the surface by etching; and (b) processing a collector layer formed over the whole surface of the single crystalline substrate in such a shape as having a side surface with an acute angle against the substrate, and depositing the dielectric film and flattening the surface by etching.

Embodiment 10

A fabrication method for the AlGaAs/GaAs HBT shown in Embodiment 3 will be described with reference to FIGS. 24 to 27.

Figure 9:
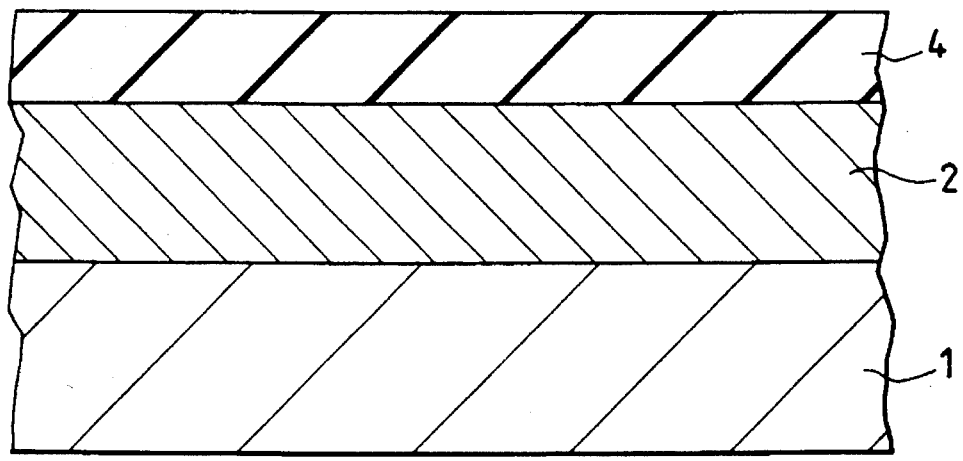
FIGS. 9 to 13 are flow diagrams showing a fabrication method for the AlGaAs/GaAs heterojunction bipolar transistor shown in FIG. 1.
Figure 10:
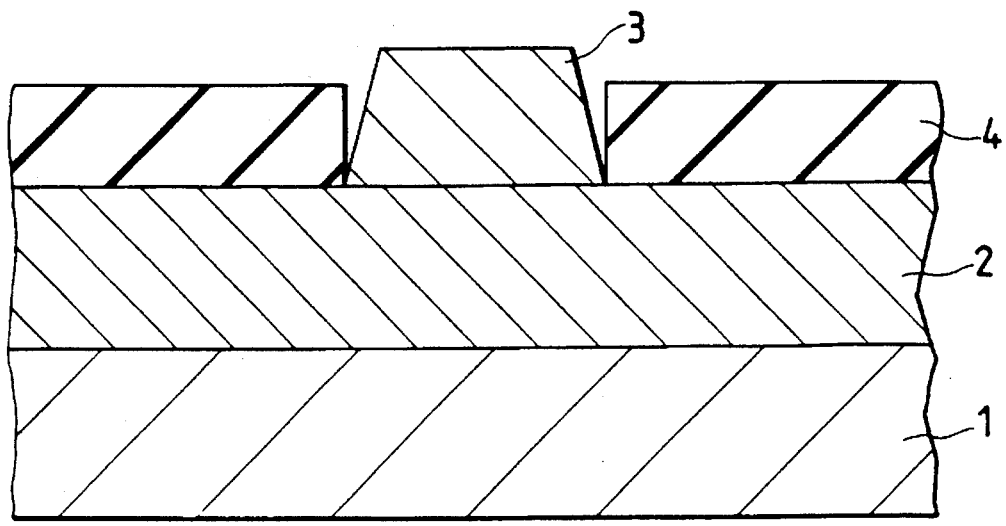

The processes before those shown in FIGS. 9 to 11 are the same in Embodiment 6. In such a state as shown in FIG. 11, a heavily doped p-type GaAs layer 5 (Be concentration; $4\times10^{20}/cm^3$, film thickness; 100 nm) and a heavily doped p-type polycrystalline GaAs layer 6 (Be concentration; $4\times10^{20}/cm^3$, film thickness; 100 nm), and a heavily doped p-type GaAsSb layer 24 (GaSb mole ratio; 0.8, Be concentration; $4\times10^{20}/cm^3$, film thickness; 200 nm) and a heavily doped p-type polycrystalline GaAsSb layer 16 (GaSb mole ratio; 0.8, Be concentration; $4\times10^{20}/cm^3$, film thickness; 200 nm) were simultaneously formed using a molecular beam epitaxy method under the condition that the substrate temperature was 450° C. and the ratio of partial pressure of $As_4$ to Ga was 50 (see FIG. 24).

The above substrate 1 was removed from the molecular beam epitaxy system, and a $SiO_2$ film 25 (film thickness; 100 nm) was deposited and layers 25, 16 and 6 were selectively removed by the known photoetching (FIG. 25), after which a $SiO_2$ side wall 26 (maximum width; 0.3 μm) was formed by the known technique using the deposition and the etching of the $SiO_2$ film.

The above substrate 1 was transferred in an organometallic vapor phase epitaxy system or an organometallic molecular beam epitaxy system. Then, an n-type AlGaAs layer 8 (AlAs mole ratio; 0.3, Si concentration; $1\times10^{18}/cm^3$, film thickness; 150 nm) and a heavily doped n-type GaAs layer 9 (Si concentration; $5\times10^{18}/cm^3$, film thickness; 200 nm) were formed by a selective epitaxial growth method under the condition that the substrate temperature was decreased to 550° C. and the ratio of partial pressure of $As_4$ to Ga was 15 (see FIG. 26).

Figure 27:
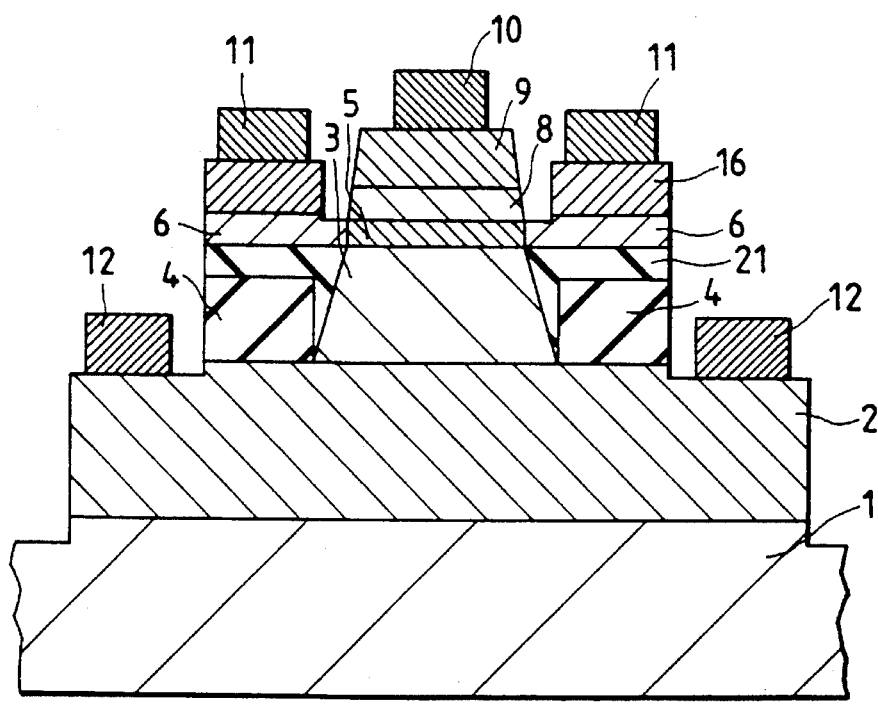

The above substrate 1 was removed from the organometallic vapor phase epitaxy system or the organometallic molecular beam epitaxy system, and the surfaces of an extrinsic base region and a sub-collector layer were exposed by the known photoetching, after which an emitter electrode 10, a base electrode 11 and a collector electrode 12 were formed, to thus fabricate the HBT (see FIG. 27).

According to this embodiment, since the minimum value (about 0.7 eV at room temperature) of the energy gap in the extrinsic base region is made smaller than the minimum value (about 1.43 eV at room temperature) in the base layer, the carrier concentration and the mobility in the extrinsic base region are increased, which makes it possible to fabricate a very high speed HBT being small in the base resistance and in the base-collector capacitance. Further, since the space between the inclined semiconductor surface such as {111} face emerged in the selective epitaxial growth for the collector layer and the side surface of the dielectric film is filled with the spin-on-glass, there can be fabricated the HBT with high yield while eliminating the problem of causing the base-collector short circuit or breakage due to the deposition of the semiconductor layer in the spacer.

Although the polycrystalline GaAsSb (GaSb mole ratio; 0.8) is used as the layer 16 in this embodiment, the other alloy composition may be used. In place of GaAsSb, the other polycrystalline semiconductor with a smaller energy gap such as InGaAs, InAsSb or SiGe may be used.

Embodiment 11

Figure 28:
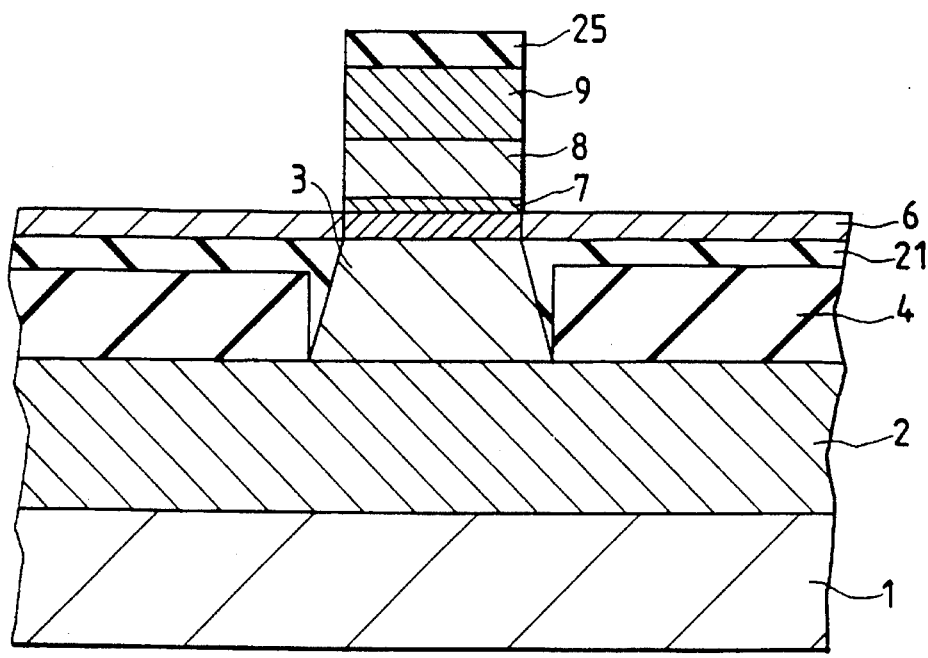
FIGS. 28 to 30 are flow diagrams showing another fabrication method for the AlGaAs/GaAs heterojunction bipolar transistor having the sectional structure shown in FIG. 6.
Figure 29:
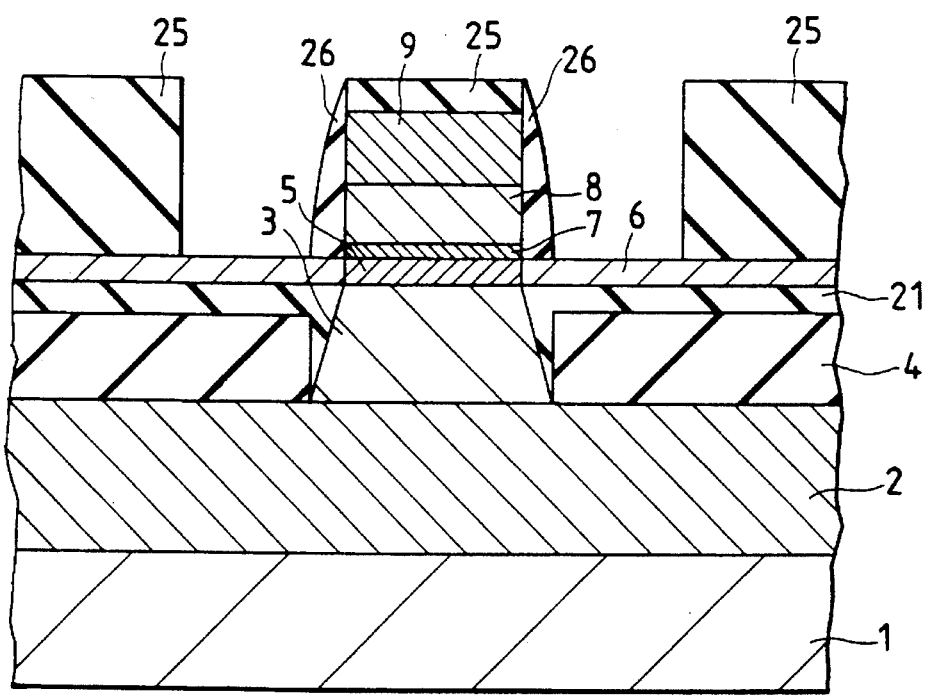
Figure 30:
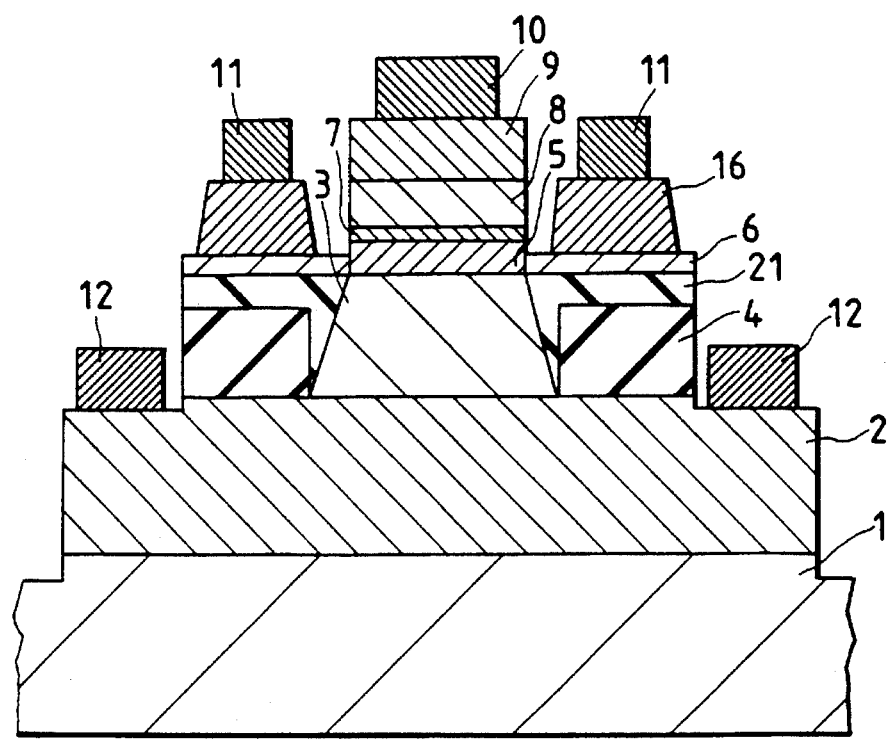
Figure 31:
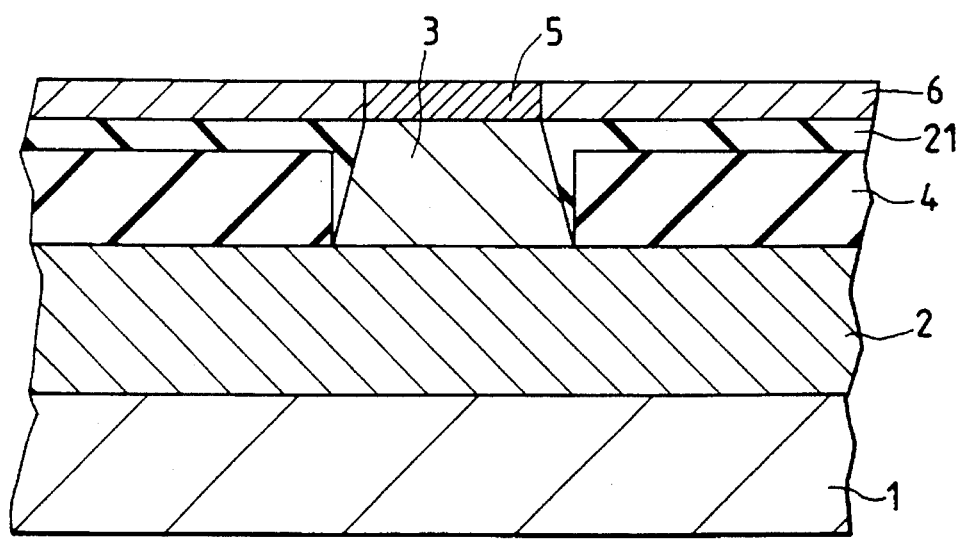
FIGS. 31 to 37 are flow diagrams showing the other fabrication method for the AlGaAs/GaAs heterojunction bipolar transistor having the sectional structure shown in FIG. 6.

Another fabrication method for the AlGaAs/GaAs HBT shown in Embodiment 3 will be described with reference to FIGS. 28 to 30.

Figure 12:
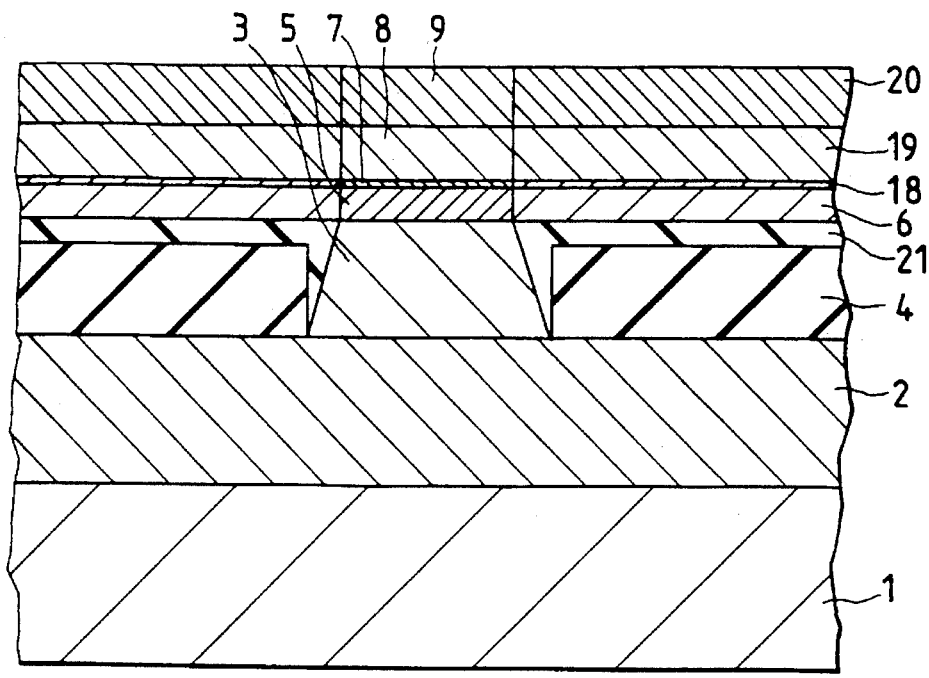

The processes before those shown in FIGS. 9 to 12 are the same in Embodiment 6. In such a state as shown in FIG. 12, a $SiO_2$ film 25 (film thickness; 100 nm) was deposited, and layers 20, 19 and 18 were selectively removed by the known photoetching (see FIG. 28). After that, a $SiO_2$ film 25 (film thickness; 500 nm) was newly deposited, and then a $SiO_2$ side wall 26 (maximum width; 0.3μ) was formed using the known photoetching (see FIG. 29).

The above substrate 1 was transferred in an organometallic vapor phase epitaxy system or an organometallic molecular beam epitaxy system. Then, a heavily doped p-type GaAsSb layer 16 (GaSb mole ratio; 0.8, C concentration; $4\times10^{20}/cm^3$, film thickness; 200 nm) was formed by a selective epitaxial growth method under the condition that the substrate temperature was 500° C. and the ratio of partial pressure of $(As_4+Sb_4)$ to Ga was 50. The above substrate was removed from the organometallic vapor phase epitaxy system or the organometallic molecular beam epitaxy system, and the layers 25 and 26 were removed, after which the surfaces of an extrinsic base region and a subcollector layer were exposed by the known photoetching, and an emitter electrode 10, a base electrode 11 and a collector electrode 12 were formed, to thus fabricate the HBT (see FIG. 30).

According to this embodiment, since the minimum value (about 0.7 eV at room temperature) of the energy gap in the extrinsic base region is made smaller than the minimum value (about 1.43 eV at room temperature) in the base layer, the carrier concentration and mobility in the extrinsic base region are increased. This makes it possible to fabricate a very high speed HBT being small in the base resistance and in the base-collector capacitance. Further, since the space between the inclined semiconductor surface such as {111} face emerged in the selective epitaxial growth for the collector layer and the side surface of the dielectric film is filled with the spin-on-glass, there can be fabricated the HBT with high yield while eliminating the problem of causing the base-collector short circuit or breakage due to the deposition of the semiconductor layer in the spacer.

Although the polycrystalline GaAsSb (GaSb mole ratio; 0.8) is used as the layer 16 in this embodiment, the other alloy composition may be used. In place of GaAsSb, the other polycrystalline semiconductor with a smaller energy gap such as InGaAs, InAsSb or SiGe may be used.

Embodiment 12

The other fabrication method for the AlGaAs/GaAs HBT shown in Embodiment 3 will be described with reference to FIGS. 31 to 37.

FIGS. 31 to 37 are flow diagrams showing the other fabrication method for the AlGaAs/GaAs HBT having the sectional structure shown in FIG. 6. Just as in Embodiment 6, the processes were made in the manner shown in FIGS. 9 to 11. Then, in such a state as shown in FIG. 11, a heavily doped p-type GaAs layer 5 (Be concentration; $4\times10^{20}/cm^3$, film thickness; 100 nm) and a heavily doped polycrystalline GaAs layer 6 (Be concentration; $4\times10^{20}/cm^3$, film thickness; 100 nm) were simultaneously formed on a dielectric film using a molecular beam epitaxy method under the condition that the substrate temperature was 450° C., and the ratio of partial pressure of $As_4$ to Ga was 50 (see FIG. 31).

Figure 32:
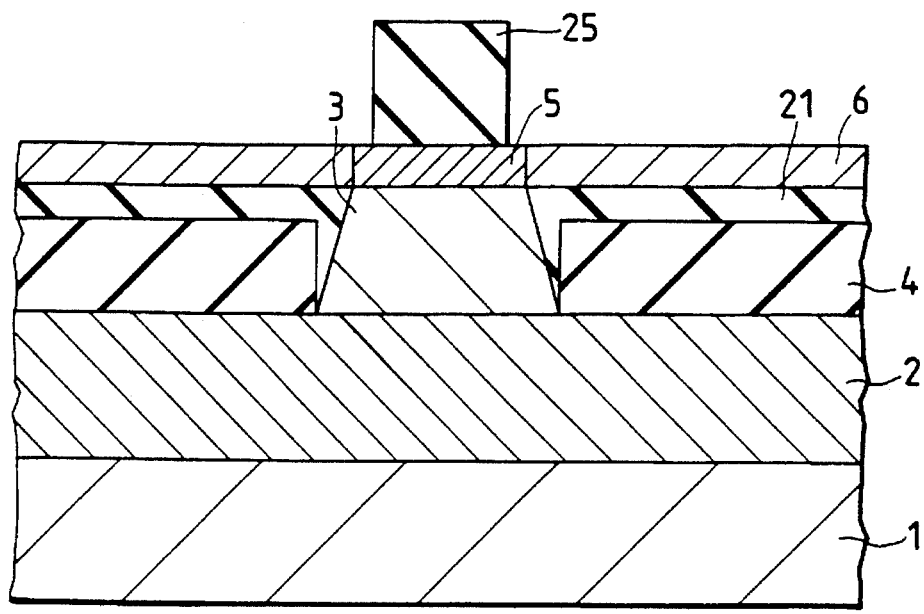

The above substrate 1 was removed from the molecular beam epitaxy system, and a $SiO_2$ film 25 (film thickness; 400 nm) was deposited and the unnecessary portion of the $SiO_2$ film 25 was removed by the known anisotropic photoetching (see FIG. 32).

The above substrate 1 was inserted in the molecular beam epitaxy system again, and a heavily doped p-type polycrystalline GaAsSb layer 16 (GaSb mole ratio; 0.8, Be concentration; $4\times10^{20}/cm^3$, film thickness; 300 nm) was deposited over the whole surface under the condition that the substrate temperature was 450° C. and the ratio of partial pressure of ($As_4+Sb_4$) to Ga was 50. The above substrate 1 was removed from the molecular beam epitaxy system, and a spin-on-glass 21 (film thickness; 2 μm) was coated, to flatten the surface (see FIG. 33).

Figure 34:
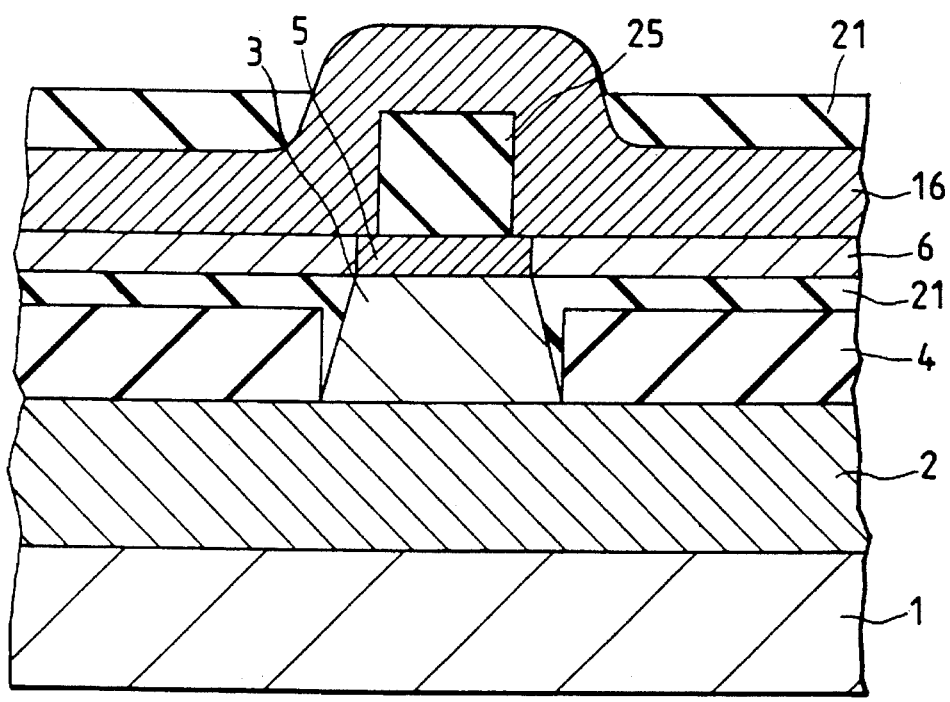
Figure 33:
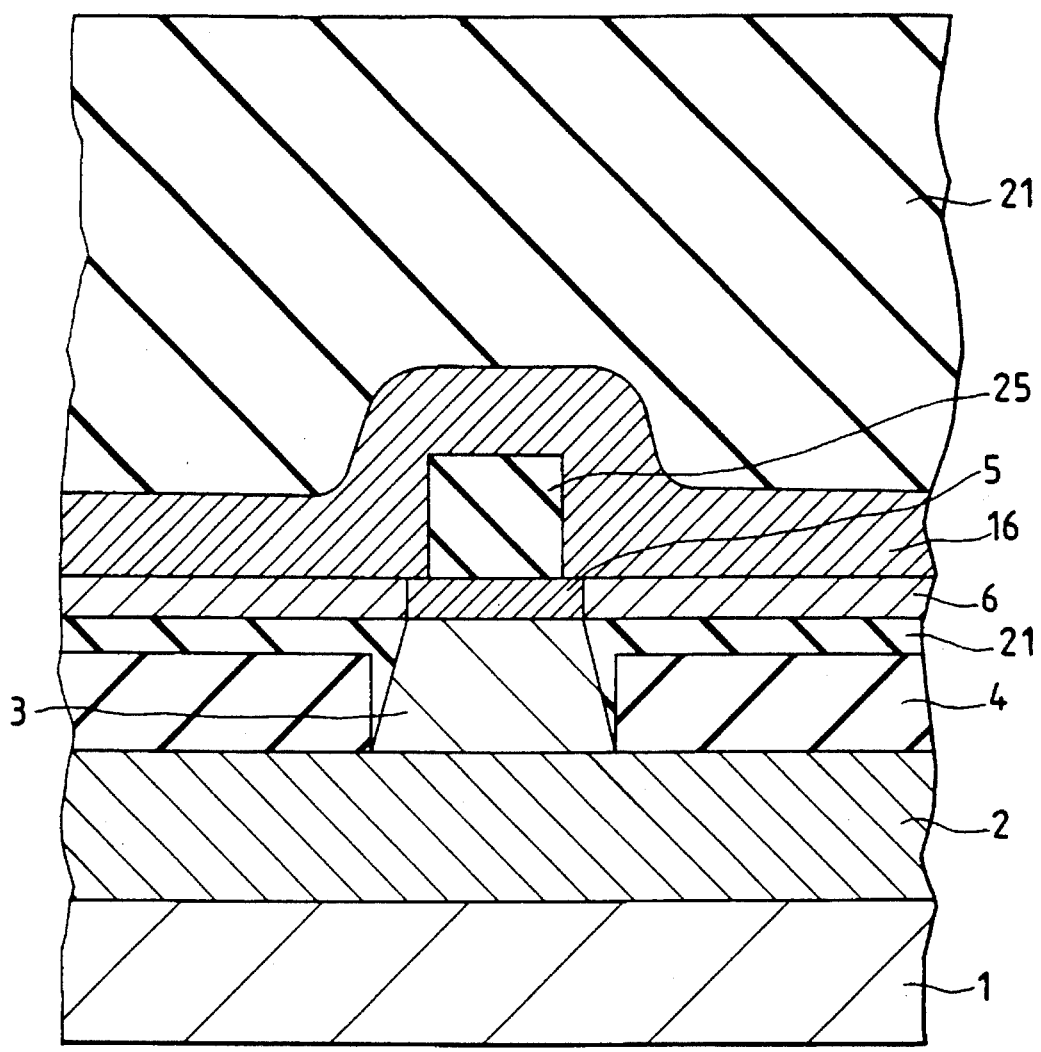
Figure 35:
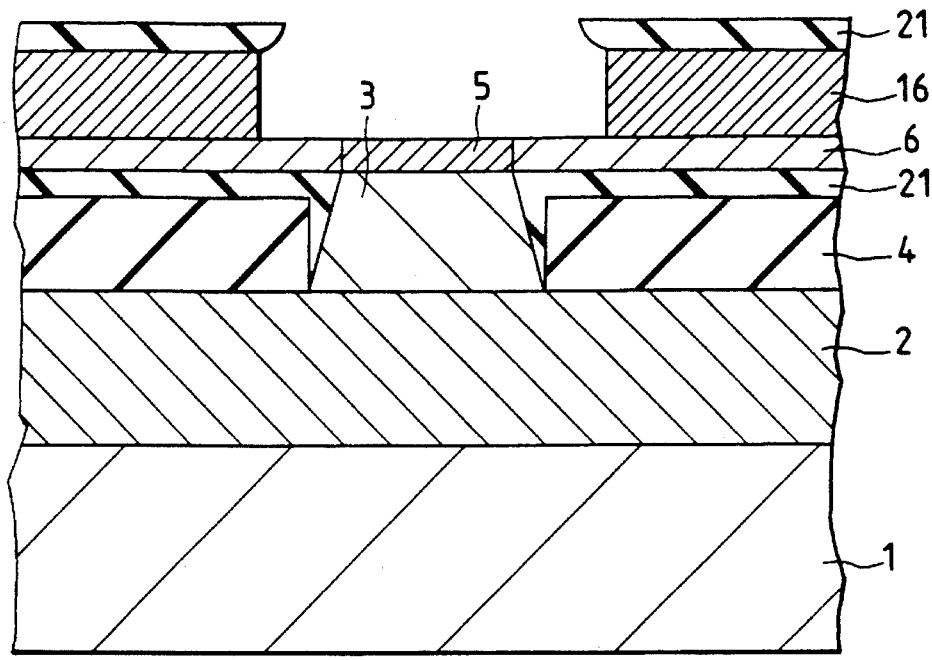
Figure 36:
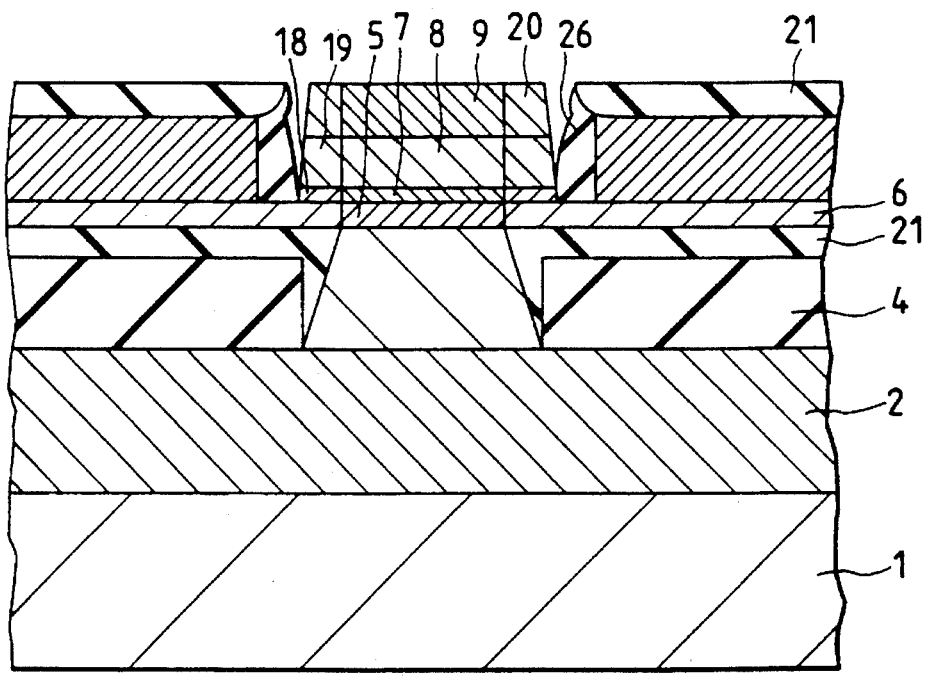

The spin-on-glass 21 was subjected to anisotropic etching for all of the surface, to expose part of the heavily doped p-type polycrystalline GaAsSb layer 16 as shown in FIG. 34, after which the exposed portion of the heavily doped p-type polycrystalline GaAsSb layer 16 was etched to be removed, and further, the $SiO_2$ film 25 was removed by the known photoetching (see FIG. 35).

After the $SiO_2$ film 25 was deposited over the whole surface, a $SiO_2$ side wall 26 (maximum width; 0.3 μm) was formed by anisotropic etching. After that, the above substrate 1 was transferred in an organometallic vapor phase epitaxy system or an organometallic molecular beam epitaxy system. Then, a doped GaAs layer 7 (film thickness; 30 nm), an n-type AlGaAs layer 8 (AlAs mole ratio; 0.3, Si concentration; $1\times10^{18}/cm^3$, film thickness; 150 nm) and a heavily doped n-type GaAs layer 9 (Si concentration; $5\times10^{18}/cm^3$, film thickness; 200 nm) were formed by a selective epitaxial growth method under the condition that the substrate temperature was 550° C. and the ratio of partial pressure of $As_4$ to Ga was 15 (see FIG. 36).

The above substrate 1 was removed from the organometallic vapor phase epitaxy system or the organometallic molecular beam epitaxy system, and the $SiO_2$ film exposed on the surface was removed. After that, the surfaces of the extrinsic base region and the sub-collector layer were exposed by the known etching, to form an emitter electrode 10, a base electrode 11 and a collector electrode 12, thus fabricating the HBT (see FIG. 37).

According to this embodiment, since the minimum value (about 0.7 eV at room temperature) of the energy gap in the extrinsic base region is made smaller than the minimum value (about 1.43 eV at room temperature) in the base layer, the carrier concentration and the mobility in the extrinsic base region are increased. This makes it possible to fabricate a very high speed HBT being small in the base resistance and in the base-collector capacitance. Further, since the space between the inclined semiconductor surface such as {111} face emerged in the selective epitaxial growth for the collector layer and the side surface of the dielectric film is filled with the spin-on-glass, there can be fabricated the HBT with high yield while eliminating the problem of causing the base-collector short circuit or breakage due to the deposition of the semiconductor layer in the spacer.

Figure 37:
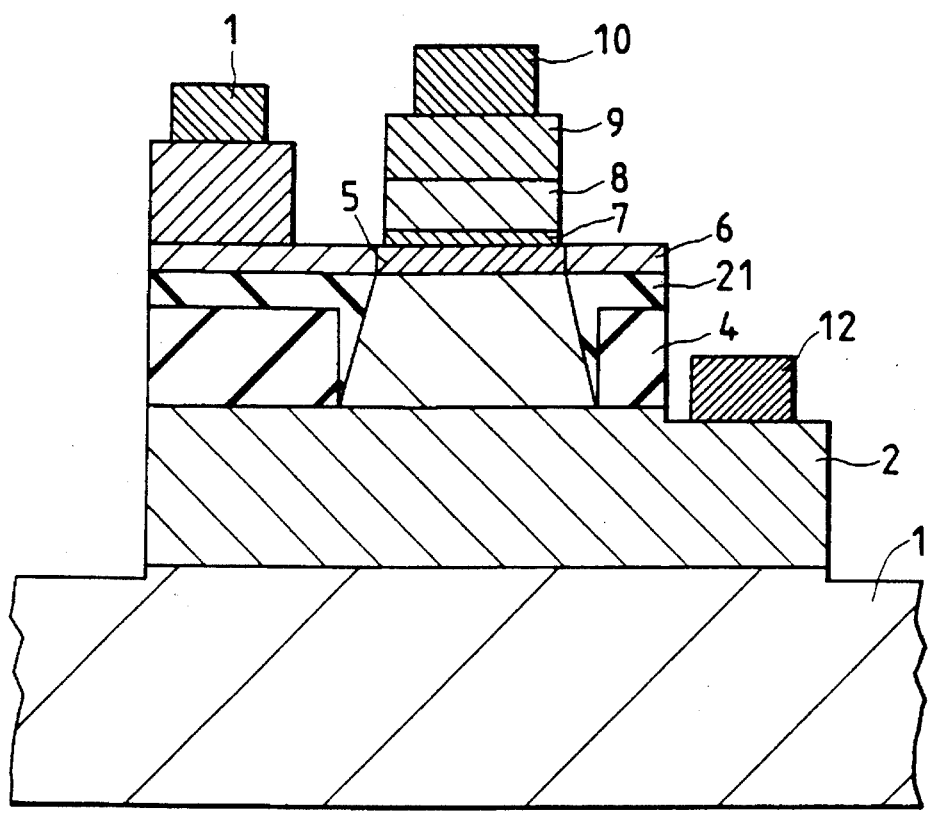

Additionally, in FIG. 37, there is shown the structure where the base electrode 11 and the collector electrode 12 are provided on one side; however, the base electrode 11 and the collector electrode 12 may be respectively provided on both sides. Further, in this embodiment, the polycrystalline GaAsSb (GaSb mole ratio; 0.8) is used as the layer 16; however, the other alloy composition may be used. In place of GaAsSb, the other polycrystalline semiconductor with a smaller energy gap such as InGaAs, InAsSb or SiGe may be used.

Figure 38:
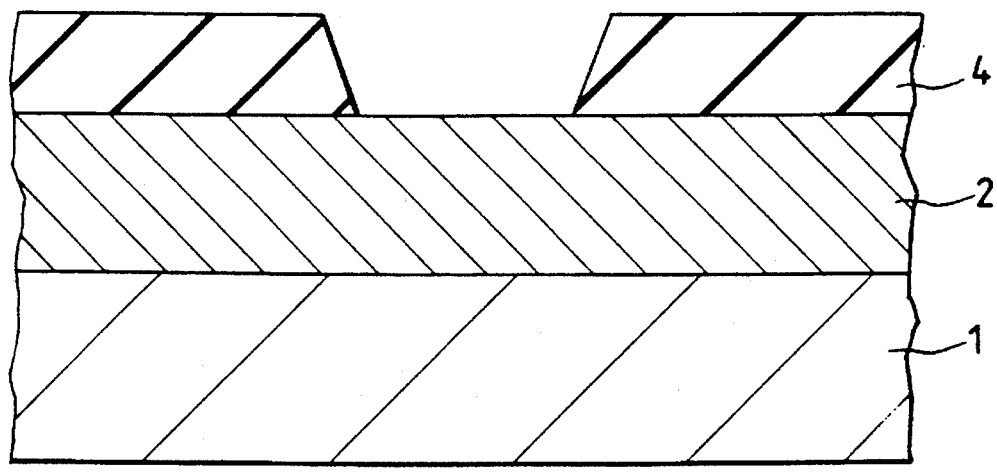
FIGS. 38 to 40 are flow diagrams showing a fabrication method for the AlGaAs/GaAs heterojunction bipolar transistor having the sectional structure shown in FIG. 7.
Figure 39:
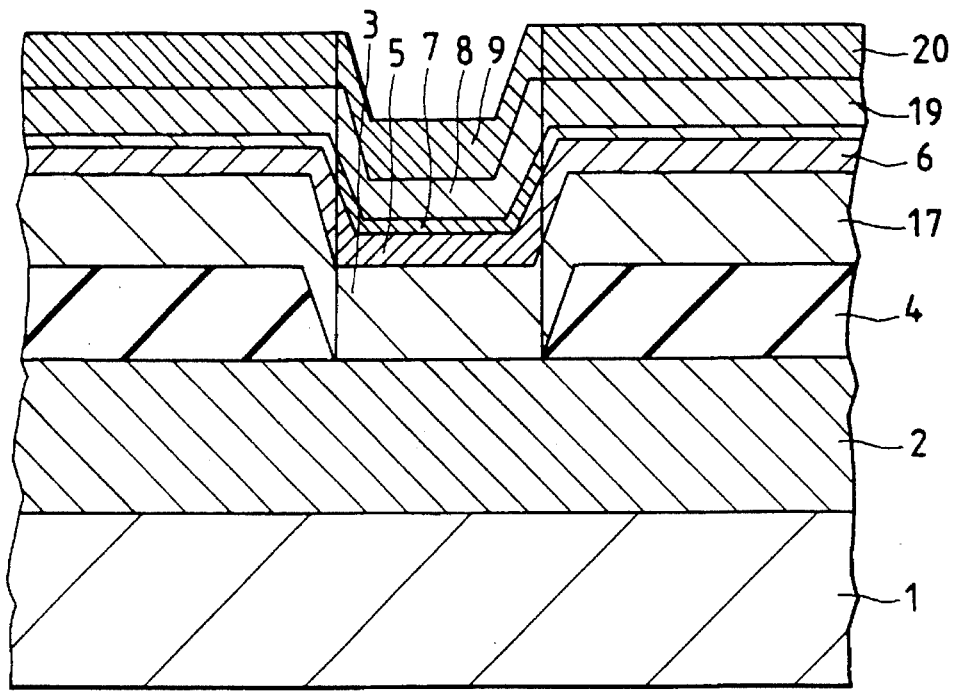
Figure 40:
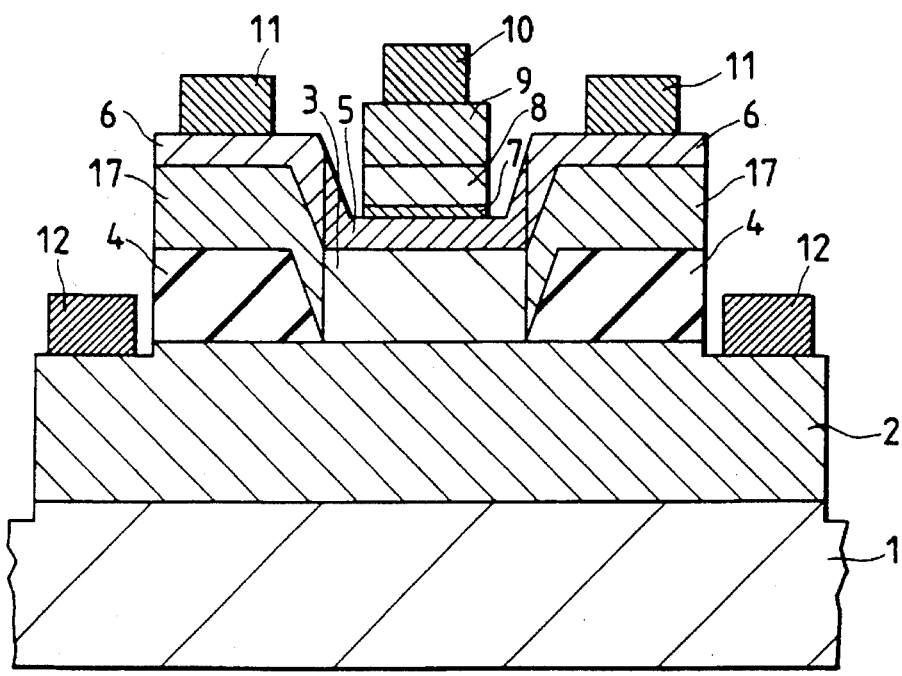

FIGS. 38 to 40 are flow diagrams showing a fabrication method for AlGaAs HBT having such a sectional structure as shown in FIG. 7. The processes were made in the same manner as in Embodiment 6, to form the structure shown in FIG. 9, and an opening portion where the side surface of the $SiO_2$ film 4 was acute against the substrate was formed (see FIG. 38).

The substrate 1 was inserted in a molecular beam epitaxy system, and a n-type GaAs layer 3 (Si concentration; $5\times10^{16}/cm^3$, film thickness; 400 nm) and a n-type polycrystalline GaAs layer 17 (Si concentration; $5\times10^{16}/cm^3$, film thickness; 400 nm) were simultaneously formed under the condition that the substrate temperature was 450° C. and the ratio of partial pressure of $As_4$ to Ga was 15. Subsequently, a heavily doped p-type GaAs layer 5 (Be concentration; $4\times10^{20}/cm^3$, film thickness; 100 nm) and a heavily doped p-type polycrystalline GaAs layer 6 (Be concentration; $4\times10^{20}/cm^3$, film thickness; 100 nm) were simultaneously formed under the condition that the substrate temperature was 450° C. and the ratio of partial pressure of $As_4$ to Ga was 50.

Then, an undoped GaAs layer 7 (film thickness; 50 nm) and an undoped polycrystalline GaAs layer 18 (film thickness; 50 nm), an n-type AlGaAs layer 8 (AlAs mole ratio; 0.3, Si concentration; $1\times10^{18}/cm^3$, film thickness; 150 nm) and an n-type polycrystalline AlGaAs layer 19 (AlAs mole ratio; 0.3, Si concentration; $1\times10^{18}/cm^3$, film thickness; 150 nm), and a heavily doped n-type GaAs layer 9 (Si concentration; $5\times10^{18}/cm^3$, film thickness; 200 nm) and a heavily doped n-type polycrystalline GaAs layer 20 (Si concentration; $5\times10^{18}/cm^3$, film thickness; 200 nm) were simultaneously formed under the original condition that the substrate temperature was 450° C. and the ratio of partial pressure of $As_4$ to Ga was 15, respectively (see FIG. 39).

After the substrate 1 was removed from the molecular beam epitaxy system, the surfaces of an extrinsic base region 6 and a sub-collector layer 2 were respectively exposed using the known photoetching, and an emitter electrode 10, a base electrode 11 and a collector electrode 12 were formed, to thus fabricate an HBT (see FIG. 40).

According to this embodiment, since the extrinsic base region is formed by the molecular beam epitaxy method under the condition that the substrate temperature is 450° C. or less and the ratio of partial pressure of a V-group element to a III-group element is 50 or more, even if the extrinsic base region becomes polycrystal using the $SiO_2$ with a low specific dielectric constant in the extrinsic collector region, there can be fabricated a very high speed HBT being small in the base-collector extrinsic capacitance without significantly increasing the base resistance. Further, by making acute the angle between the side surface of the $SiO_2$ film, it is possible to fabricate the HBT with high yield while eliminating the problem of breakage in the vicinity of the extrinsic base region. Additionally, since the depleted semiconductor is used in the extrinsic collector region together with the $SiO_2$ film, as compared with the case of using only the $SiO_2$ film, it is possible to further reduce the base-collector capacitance and hence to further enhance the maximum oscillation frequency.

Embodiment 13

A fabrication method for the AlGaAs/GaAs HBT shown in Embodiment 4 will be described with reference to FIGS. 38 to 40.

Embodiment 14

The other fabrication method for the AlGaAs/GaAs HBT shown in Embodiment 4 will be described with reference to FIGS. 41 to 43.

Figure 41:
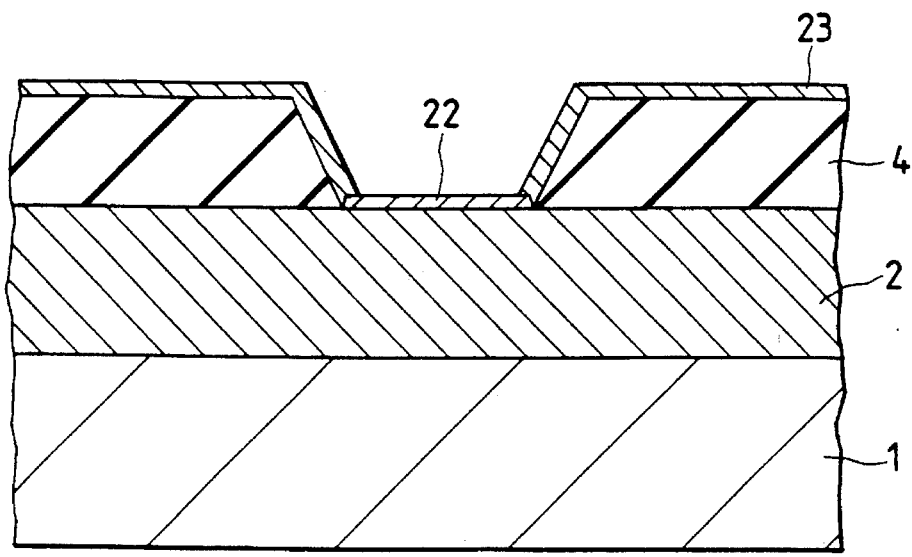
FIGS. 41 to 43 are flow diagrams showing the other fabrication method for the AlGaAs/GaAs heterojunction bipolar transistor having the sectional structure shown in FIG. 7.
Figure 42:
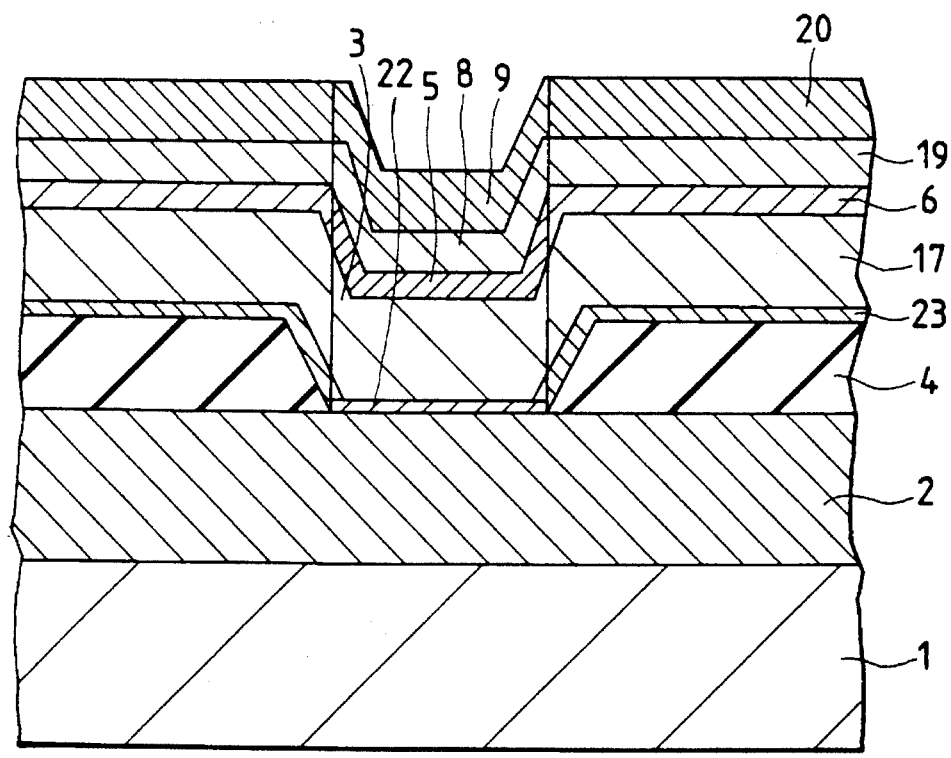
Figure 43:
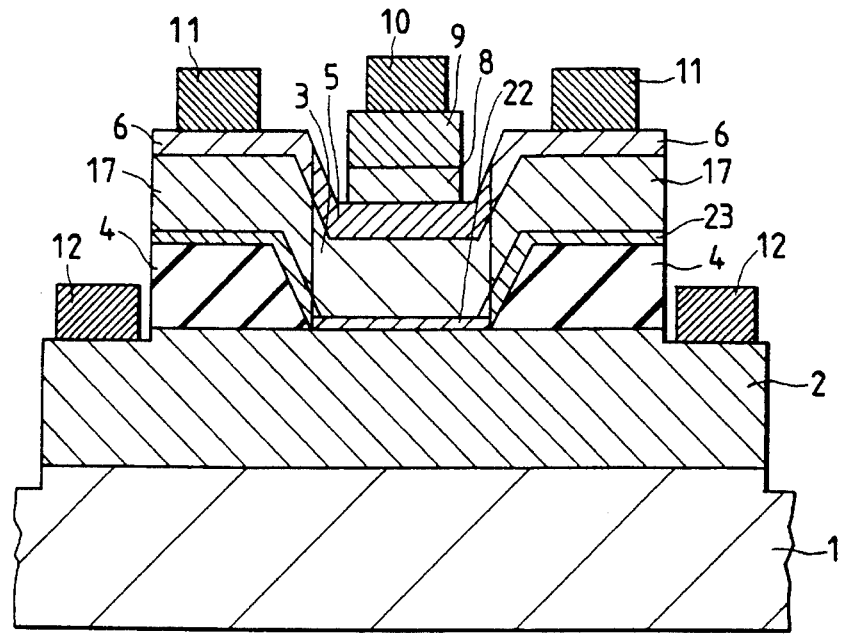

FIGS. 41 and 43 are flow diagrams showing the other fabrication method for the AlGaAs/GaAs HBT having the structure shown in FIG. 7. The processes were made in the same manner as in Embodiment 13, to form the structure shown in FIG. 38. Then, an undoped GaAs one molecular layer 22 and an undoped polycrystalline GaAs one molecular layer 23 were simultaneously formed under the condition that the substrate temperature was 550° C. and the ratio of partial pressure of $As_4$ to Ga was 15 (see FIG. 41). In this case, the film thicknesses of the layers 22 and 23 may be made thick insofar as being one molecular layer or more.

The above substrate 1 was transferred to an organometallic vapor phase epitaxy system or an organometallic molecular beam epitaxy system. Then, an n-type GaAs layer 3 (Si concentration; $5 \times 10^{16}/cm^3$, film thickness; 400 nm) and an n-type polycrystalline GaAs layer 17 (Si concentration; $5 \times 10^{16}/cm^3$, film thickness; 400 nm) were simultaneously formed under the condition that the substrate temperature was 450° C. and the ratio of partial pressure of $As_4$ to Ga was 15.

Next, a heavily doped p-type GaAs layer 5 (Be concentration; $4 \times 10^{20}/cm^3$, film thickness; 100 nm) and a heavily doped p-type polycrystalline GaAs layer 6 (Be concentration; $4 \times 10^{20}/cm^3$, film thickness; 100 nm) were simultaneously formed under the condition that the substrate temperature was 450° C. and the ratio of partial pressure of $As_4$ to Ga was 50. Subsequently, an n-type AlGaAs layer 8 (AlAs mole ratio; 0.3, Si concentration; $1 \times 10^{18}/cm^3$, film thickness; 150 nm) and an n-type polycrystalline AlGaAs layer 19 (AlAs mole ratio; 0.3, Si concentration; $1 \times 10^{18}/cm^3$, film thickness; 150 nm), and a heavily doped n-type GaAs layer 9 (Si concentration; $5 \times 10^{18}/cm^3$, film thickness; 200 nm) and a heavily doped n-type polycrystalline GaAs layer 20 (Si concentration; $5 \times 10^{18}/cm^3$, film thickness; 200 nm) were simultaneously formed under the original condition that the substrate temperature was 450° C. and the ratio of partial pressure of $As_4$ to Ga was 15, respectively (see FIG. 42).

The above substrate 1 was removed from the molecular beam epitaxy system, and the surfaces of an extrinsic base region 6 and a sub-collector layer 2 are exposed by the known photoetching, after which an emitter electrode 10, a base electrode 11 and a collector electrode 12 were formed, to thus fabricate the HBT (see FIG. 43).

According to this embodiment, since the extrinsic base region is formed by the molecular beam epitaxy method under the condition that the substrate temperature is 450° C. or less and the ratio of partial pressure of a V-group element to a III-group element is 50 or more, even if the extrinsic base region becomes polycrystal, there can be fabricated a very high speed HBT being small in the extrinsic base-collector capacitance without significantly increasing the base resistance. Further, by making acute the angle between the side surface of the $SiO_2$ film, it is possible to prevent the generation of breakage in the vicinity of the extrinsic base region and hence to fabricate the HBT with high yield. Additionally, since the depleted semiconductor is used in the extrinsic collector region together with the $SiO_2$ film, as compared with the case of using only the $SiO_2$ film, it is possible to further reduce the extrinsic base-collector capacitance and hence to further enhance the maximum oscillation frequency.

Further, by the effect of the semiconductor of at least one molecular layer formed between the extrinsic base region and the dielectric film as a nucleus, the polycrystalline semiconductor layer is allowed to grow by the organometallic vapor phase epitaxy method or the organometallic molecular beam epitaxy method. Accordingly, C being difficult to be doped in high concentration by the molecular beam epitaxy method can be used as the p-type impurities. Since C is difficult to be diffused as compared with Be, the layers 7 and 18 as the spacer layers for preventing the diffusion of Be from base to emitter are eliminated, and also there can be fabricated the HBT excellent in the repeatability of the device characteristics and the reliability.

In the above embodiments 6 to 14, the grain size of the obtained polycrystalline compound semiconductor is in the range of 30 to 50 nm. Additionally, although the embodiments 6 to 14 show the fabrication methods for the AlGaAs/GaAs HBT, the present invention may be similarly applied to the fabrication methods using the other III–V compound semiconductors such as InAlAs/InGaAs and InP/InGaAs. Further, carbon (C) may be used in place of Be as the base impurities. In this embodiment, the $SiO_2$ film is used as the extrinsic base region; however, the other dielectric film such as a $Si_3N_4$ film may be used. Additionally, in this embodiment, the GaAs (100) face is used as the substrate; however, the other material and the other crystal orientation may be used.

Embodiment 15

A differential amplifier circuit using the AlGaAs/GaAs HBT shown in each of the above embodiments will be described with reference to FIG. 44.

Figure 44:
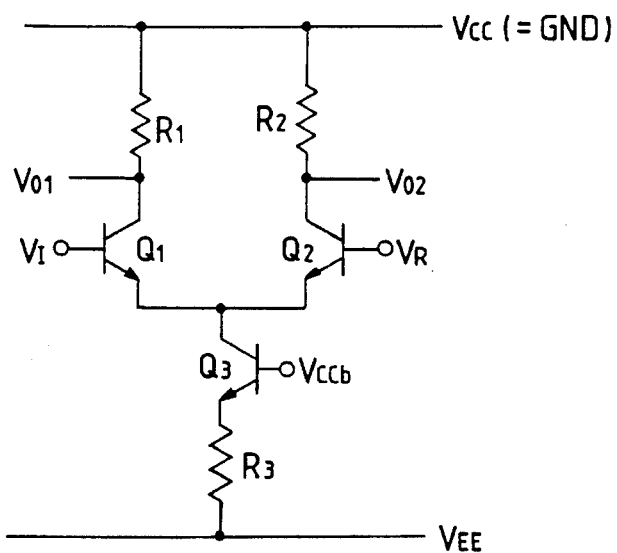
FIG. 44 is a circuit diagram of a differential amplifier using an AlGaAs/GaAs heterojunction bipolar transistor of the present invention.

A differential amplifier circuit using either of the AlGaAs/GaAs HBTs shown in Embodiments 1 to 6 as transistors Q1, Q2 and Q3 in FIG. 44 was fabricated. In addition, $V_i$ indicates an input voltage; $V_{O1}$ and $V_{O2}$ are output voltages; $V_R$ is a reference voltage; and $V_{CCb}$ is a constant voltage.

According to this embodiment, since the differential amplifier circuit can be formed using the HBT being small in both the base resistance and the extrinsic base-collector capacitance, and being large in the maximum oscillation frequency, it is possible to provide a differential amplifier circuit enabling a very high speed operation and to provide an electronic circuit system using the differential amplifier as the basic unit.

In addition, although this embodiment shows the differential amplifier circuit using the AlGaAs/GaAs HBT, the same effect can be obtained using the HBT composed of the other III–V compound semiconductors such as InAlAs/InGaAs and InP/InGaAs.

Embodiment 16

The embodiment in which the present invention applied to a surface emitting laser diode will be described with reference to FIGS. 45 to 51.

FIGS. 45 to 50 are flow diagrams showing a fabrication method for a surface emitting laser diode. First, an n-type distributed Bragg reflection layer 32, an undoped (n-type with the effective carrier concentration being about $2 \times 10^{15}/cm^3$) InGaAs strained quantum well layer (active layer) 33 and a p-type distributed Bragg reflection layer 34 were allowed to grow on a heavily doped n-type GaAs (100) substrate 31 at a substrate temperature of 550° C. using a molecular beam epitaxy method (see FIG. 45a).

Figure 45A:
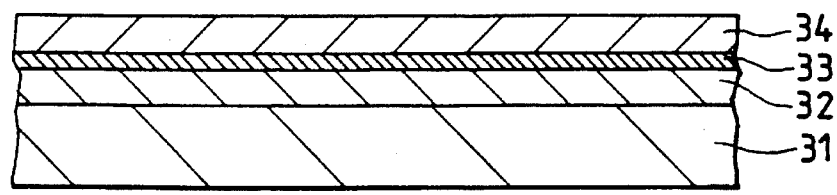
FIGS. 45a to 50 are flow diagrams showing a fabrication method for a surface emitting laser diode of the present invention.
Figure 45B:
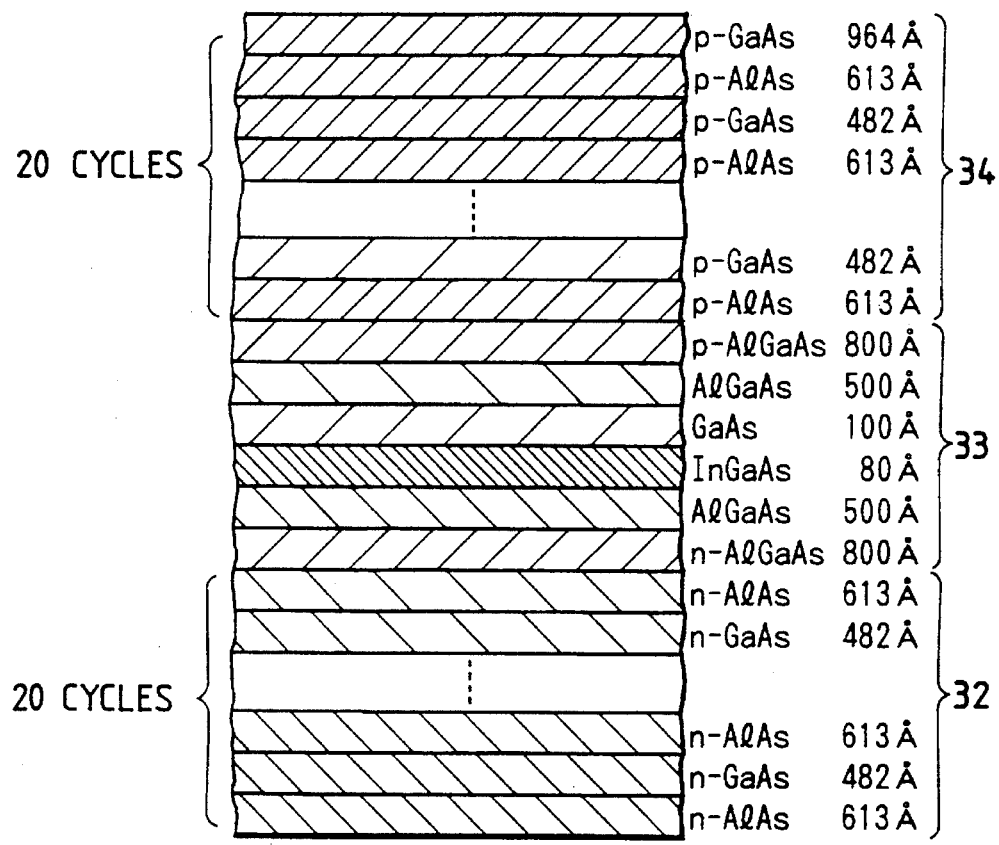

The above layers 32, 33 and 34 have the layered structures shown in FIG. 45b. Namely, the layer 32 is a distributed Bragg reflection layer composed of a super lattice with 20 cycles of p-type GaAs 482 Å/p-type AlAs 613 Å (Be concentration; $4 \times 10^{18}/cm^3$) (uppermost surface layer: GaAs 964 Å); the layer 34 is a distributed Bragg reflection layer composed of a super lattice with 20 cycles of n-type GaAs 482 Å/n-type AlAs 613 Å (Si concentration; $4 \times 10^{18}/cm^3$); and the layer 33 is an InGaAs strained quantum well layer composed of an undoped InGaAs 80 Å (InAs mole ratio; 0.2) as a well layer, and an undoped GaAs 100 Å and an undoped GaAs 500 Å as a barrier layer.

Figure 46:
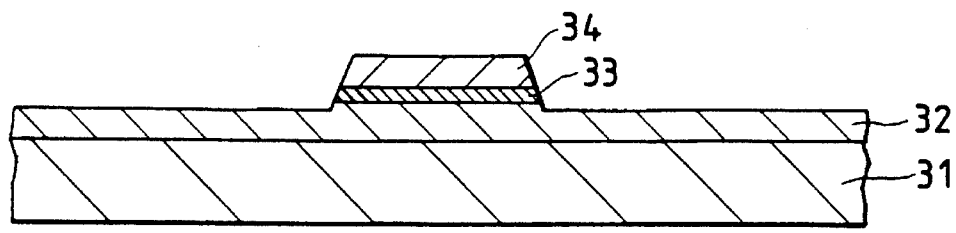
Figure 47:
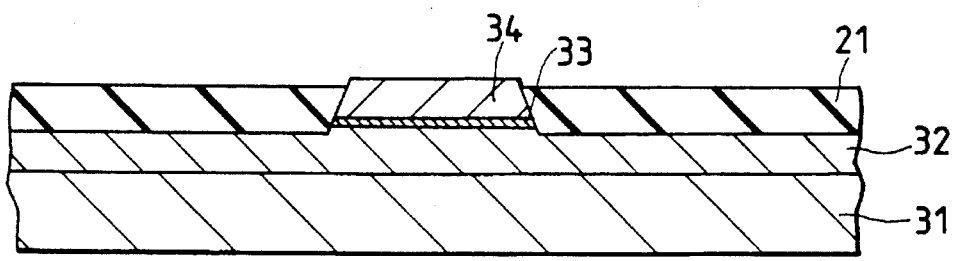

The substrate was removed from the molecular beam epitaxy system, and the unnecessary portions of the above layers 33 and 34 were selectively removed by the known photoetching (see FIG. 46). Then, a spin-on-glass 21 was coated by a thickness of 1 µm to flatten the surface, after which the whole surface of the layer 34 was exposed by anisotropic etching (see FIG. 47).

Figure 48:
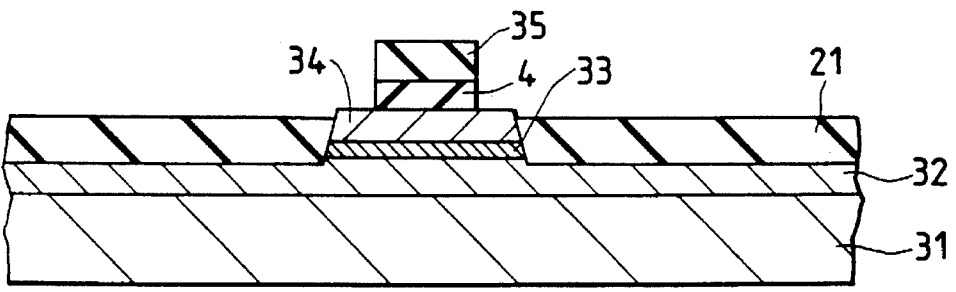
Figure 49:
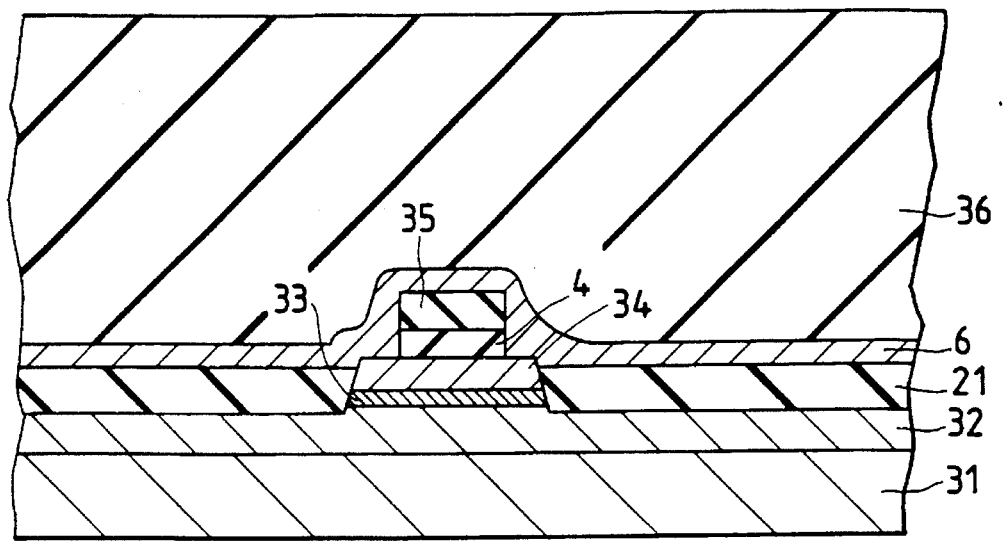

After a SiO$_2$ film 4 (film thickness; 800 nm) and an Al$_2$O$_3$ film 35 (film thickness; 200 nm) as surface reflection films were deposited, the unnecessary portions of the above SiO$_2$ film 4 and the Al$_2$O$_3$ film 35 were selectively removed using the known photoetching (see FIG. 48).

The substrate was inserted in the molecular beam epitaxy system, and a heavily doped p-type polycrystalline GaAs layer 6 (Be concentration; $4 \times 10^{20}/cm^3$, film thickness; 150 nm) was deposited under the condition that the substrate temperature was 450° C. and the ratio of partial pressure of As$_4$ to Ga was 50. After that, the substrate was removed from the molecular beam epitaxy system, and a photoresist film 36 (film thickness; 2 µm) was coated over the whole surface, to flatten the surface (see FIG. 49).

Figure 50:
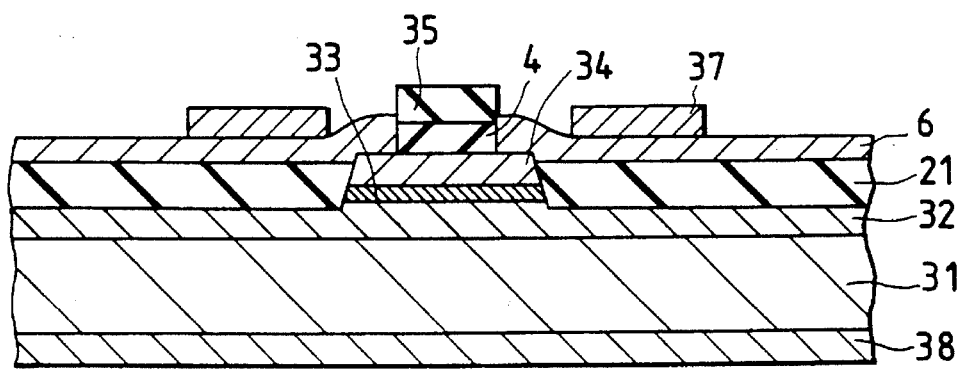

After the whole surfaces of the Al$_2$O$_3$ film 35 and the heavily doped p-type GaAs layer 6 were exposed by anisotropic etching, a p-type electrode 37 and an n-type electrode 38 were formed, to thus form a surface emitting laser diode (see FIG. 50).

Figure 51:
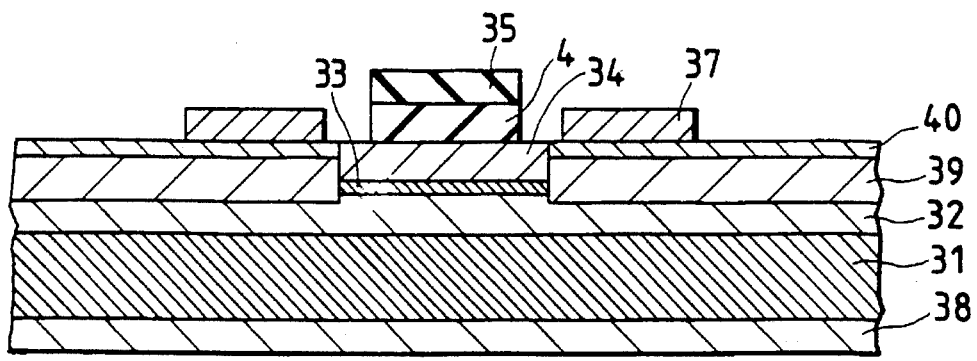
FIG. 51 is a sectional view of a surface emitting laser diode fabricated by a prior art.
Figure 52:
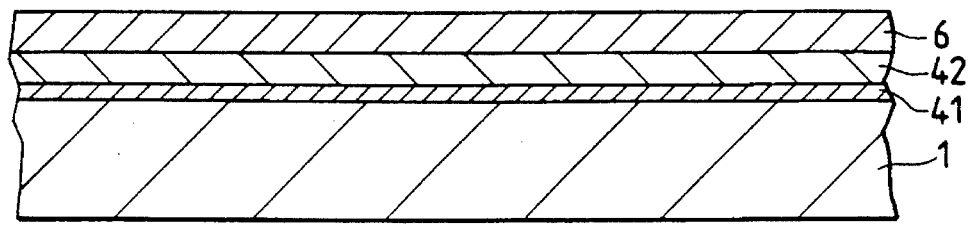
FIGS. 52 to 56 are flow diagrams showing a fabrication method for a p-channel hetero-insulated gate field effect transistor of the present invention.

FIG. 51 shows a sectional structure of a surface emitting laser diode fabricated by a prior art. While a current-confinement structure is essential for improving the characteristics of a surface emitting laser diode, in the prior art, this structure was formed of an oxygen ion-implanted region 39. This technique uses such a phenomenon that the resistance is increased by the presence of crystal defect generated by the oxygen ion implantation. The prior art, however, has such disadvantages that a leak current is generated in the region 39 because the increase in the resistance is not necessarily sufficient; and it is difficult to decrease the size of the current-confinement region and to achieve the integration of the surface emitting laser diode because the influence of the ion implantation exerts on the range extending from several µm to –10 µm in the lateral direction. Further, in the prior art, a Be ion implanted region 40 is used as the extrinsic base region; however, since the activity ratio due to the ion implantation of Be is low (several %), which makes it difficult to reduce the resistance of the extrinsic base region.

On the other hand, in the present invention, since the dielectric film 21 is used in place of the oxygen ion-implanted region 39 in the prior art, and a heavily doped p-type polycrystalline GaAs 6 is used in place of the Be ion-implanted region 40, the influences due to the leak current and the crystal effect are eliminated, thus making it possible to achieve the high integration and also to reduce the resistance of the p-type extrinsic base region. This makes it possible to obtain an ultra-high integration surface emitting laser diode excellent in high frequency response and reliability.

Although this embodiment shows the InGaAs strained quantum well surface emitting laser diode (InAs mole ratio; 0.2), the InAs mole ratio may be different from the above value, and the present invention may be similarly applied to surface emitting laser diodes using the other III–V compound semiconductor alloys. Further, in this embodiment, Be is used as the impurities in the layer 6 and the molecular beam epitaxy method is used as the growth method; however, there may be used such a technique that an undoped GaAs layer of at least one molecular layer thickness is formed by the molecular beam epitaxy method, and then a C-doped polycrystalline GaAs is formed by an organometallic vapor phase epitaxy method or an organometallic molecular beam epitaxy method. Additionally, although the GaAs (100) face is used as the substrate in this embodiment, the other material and the other substrate orientation may be used.

Embodiment 17

An example in which the present invention is applied to a hetero-insulated gate field effect transistor will be described with reference to FIGS. 52 to 56.

FIGS. 52 to 56 show views showing a fabrication method for an hetero-insulated gate field effect transistor of the present invention.

First, a p-type GaAs channel layer 41 (Be concentration; $5 \times 10^{18}/cm^3$, film thickness; 20 nm) and an undoped AlGaAs 42 (AlAs mole ratio; 0.3, film thickness; 100 nm) were formed on an undoped GaAs (100) substrate 1 at a substrate temperature of 550° C. by a molecular beam epitaxy method. After that, the substrate temperature was lowered to be 100° C., and a Be doped amorphous GaAs layer 6 (Be concentration; $4 \times 10^{20}/cm^3$, film thickness; 100 nm) was deposited. Then, the substrate 1 was annealed at a substrate temperature of 580° C. for 20 min at an As atmosphere, to transform the above Be doped amorphous GaAs layer 6 from the amorphous structure into the polycrystalline structure (see FIG. 52). The transformation of the Be doped amorphous GaAs layer 6 from the amorphous structure to the polycrystalline structure was confirmed by the observation using a reflection high-energy electron-diffraction.

Figure 53:
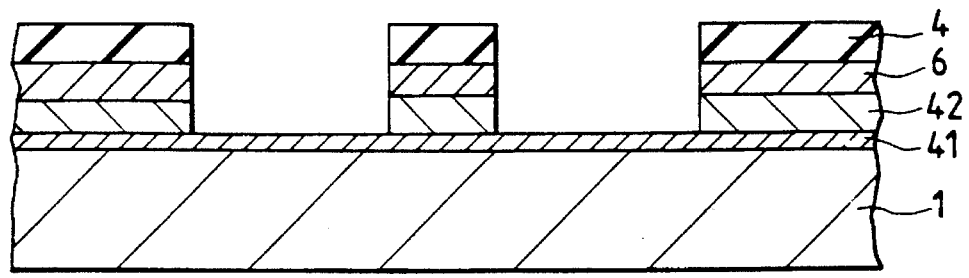

The substrate was removed from the molecular beam epitaxy system, and a SiO$_2$ film 4 (film thickness; 100 nm) was deposited, after which the specified portions of the layers 4, 6 and 42 were selectively removed using the known photoetching (see FIG. 53).

Figure 54:
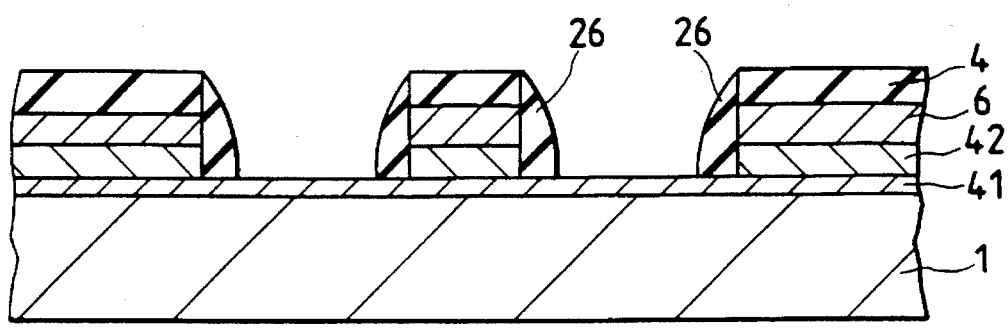

After the SiO$_2$ film was deposited over the whole surface, the portion formed on the horizontal portion of the SiO$_2$ film was removed by anisotropic etching for all the surface, to leave only a SiO$_2$ side wall 26 (see FIG. 54).

Figure 55:
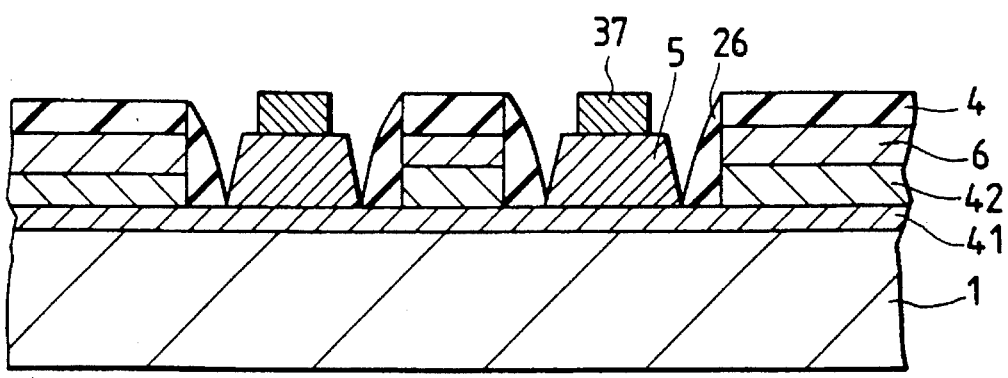

The substrate was transferred to an organometallic vapor phase epitaxy system or an organometallic molecular beam epitaxy system, and a heavily doped p-type GaAs layer 5 was selectively formed by epitaxy growth on the exposed portion of the p-type GaAs channel layer 41 at a substrate temperature of 600° C., after which the substrate was removed from the epitaxy system, to form a p-type electrode 35 (see FIG. 55).

Figure 56:
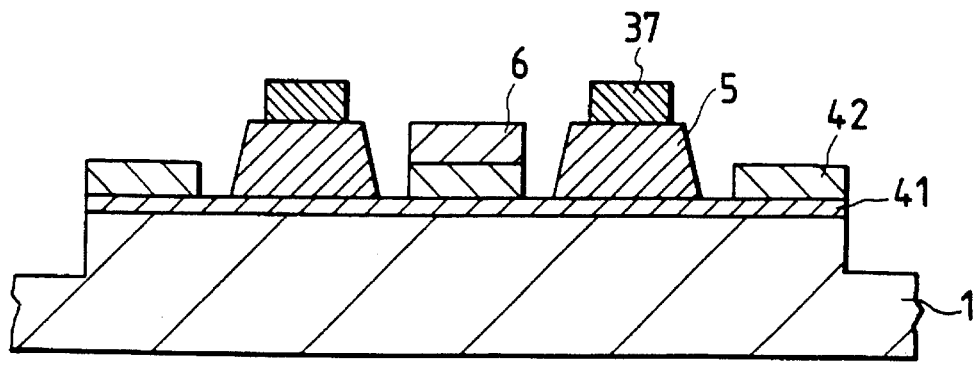

The SiO$_2$ film 4 and the SiO$_2$ side wall 26 were removed, and the specified portion of the GaAs layer 6 was selectively removed by the known photoething, after which the device separation was made by the known manner, to thus fabricate a hetero-insulated gate field effect transistor having such a structure as shown in FIG. 56.

According to this embodiment, since the barrier layer-gate electrode interface can be formed in an ultra-high vacuum, as compared with the prior art technique in which the surface of the barrier layer is once exposed in atmospheric air and the gate electrode is formed, it is possible to extremely reduce the density of interface states at the above interface, and hence to reduce the variation of the density of interface states depending on the fabrication condition for the gate electrode.

Although the barrier layer-gate electrode interface is formed in the molecular beam epitaxy system in this embodiment, it may be similarly made in an organometallic vapor phase epitaxy system without any problem insofar as being formed in a high-purity-hydrogen atmosphere. Further, although this embodiment shows the AlGaAs/GaAs hetero-insulated gate p-channel field effect transistor, the present invention may be similarly applied to hetero-insulated gate field effect transistors using an n-channel or the other material such as InP/InGaAs.

Embodiment 18

An example in which the present invention is applied to a wiring using a polycrystalline GaAs will be described with reference to FIG. 57.

Figure 57:
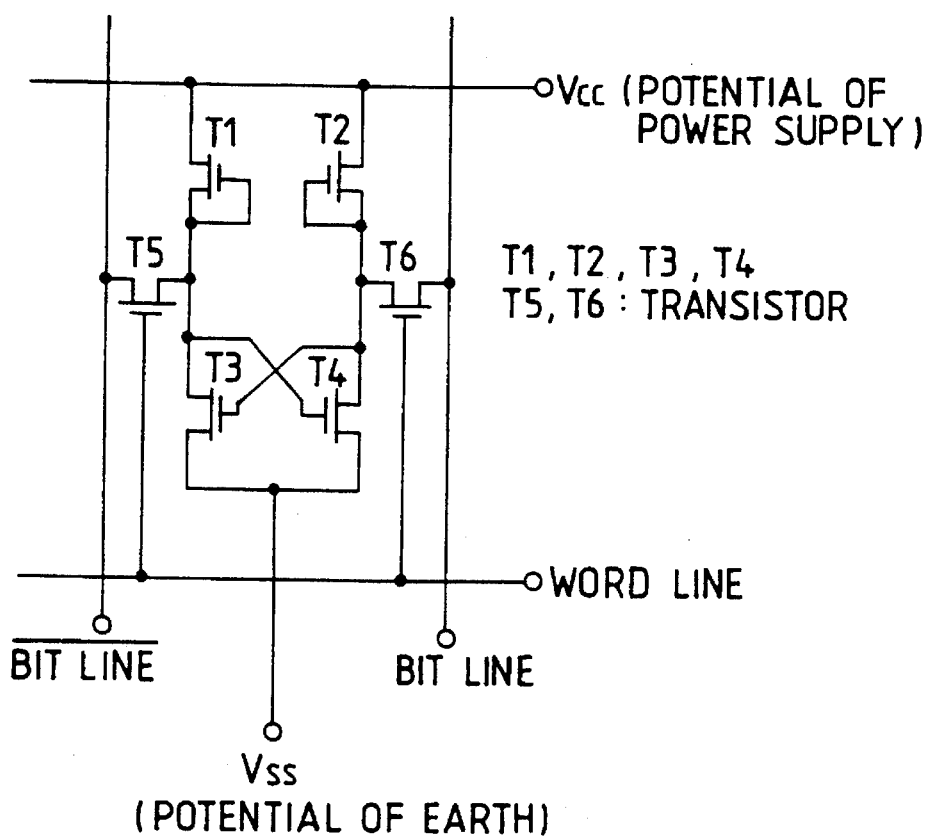
FIG. 57 is a circuit diagram showing an example of a wiring using a polycrystalline GaAs of the present invention.

FIG. 57 is a circuit diagram of a memory cell using a hetero-insulated gate field effect transistor, wherein a symbol Vcc is a potential of power supply; Vss is a potential of earth; and T1, T2, T3, T4, T5 and T6 are hetero-insulated gate field effect transistors fabricated in the method shown in Embodiment 16.

In the memory cell shown in FIG. 57, there exist a word line and a bit line. In this embodiment, the gate electrode and the word line of the above hetero-insulated gate field effect transistor are simultaneously formed of a polycrystalline GaAs layer (thickness; 100 nm) containing C in an amount of $4 \times 10^{20}/cm^3$.

According to this embodiment, since the gate electrode and the word line are simultaneously formed using the polycrystalline GaAs, the fabrication processes are simplified as compared with the prior art using a metal wiring, thus reducing the fabrication cost for the electronic circuit. Further, since semiconductor can be easily decreased in size as compared with metal, it is possible to shorten the gate length and the wiring interval less than those in the prior art, and hence to improve the performance of the electronic circuit and to achieve the high integration of the device.

In this embodiment, C is used as the impurities in the polycrystalline GaAs; however, Be may be used insofar as the concentration thereof is more than $4 \times 10^{20}/cm^3$. Further, by use of a material with a reduced energy gap such as a polycrystalline GaAsSb in place of the polycrystalline GaAs, it is possible to further reduce the resistances of the wiring and the gate electrode, and hence to obtain the electronic circuit being further improved in its performance. Additionally, the electronic circuit using the hetero-insulated gate field effect transistor and the heterojunction bipolar transistor shown in this embodiment and Embodiment 15 may be connected to the surface emitting laser diode and the integration photocircuit within a chip or between the chips, to be thus operated as a photo-electronic integrated circuit.

By use of an organometallic vapor phase epitaxy method or organometallic molecular beam epitaxy method, a III–V compound semiconductor layer such as GaAs, GaP and InP can be selectively formed by epitaxial growth only on a portion with no mask of a single crystalline semiconductor substrate partially covered with the mask. This technique has been disclosed, for example, in Japanese Journal of Applied Physics Vol. 24 (1985) pp. 1666–1671, wherein the mask is formed of a dielectric film or a heat resistant metal.

The above prior art uses the fact that, in the case of the III–V compound semiconductors such as GaAs, GaP and InP or the alloy thereof, any substance is not grown or a layer composed of polycrystal grains in a trace amount is stuck on the mask depending on the growth condition. Accordingly, the epitaxial layer grown on the portion where the mask is not present was not formed to be connected to the film on the mask.

Consequently, in the semiconductor thin film forming method by the organometallic vapor phase epitaxy or organometallic molecular beam epitaxy using III–V compound semiconductors and the alloy thereof as a material, it is required to electrically connect the epitaxial layer grown on the portion where the mask is not present to the layer formed on the mask.

There is extremely available a contact structure using the structure in which the above layers are electrically connected to each other as an extrinsic base region from part of the semiconductor device, or the semiconductor device having the base region of the bipolar transistor and the extrinsic base region therefrom.

The electrical connection between the epitaxial layer grown on the portion where the mask is not present and the layer formed on the mask can be made by a method wherein, before a semiconductor thin film composed of III–V compound semiconductors or the alloy thereof is formed, an AlAs layer or an InAs layer is previously formed by the organometallic vapor phase epitaxy method or organometallic molecular beam epitaxy system, and in formation of the semiconductor thin film, C is contained as impurities in an amount of $4 \times 10^{20}/cm^3$ or more.

Further, the above AlAs or InAs may be formed by use of an atomic layer epitaxial growth method (ALE method).

AlAs or InAs grows as a single crystalline layer on the portion where the mask is not present, and a polycrystalline film grows on the portion where the mask is present. When a semiconductor thin film composed of III–V compound semiconductors or an alloy thereof is formed on these films, it is possible to form a single crystalline film on the portion where the mask is not present and a polycrystalline semiconductor thin film on the portion where the mask is present, independently of the kind of the semiconductor. Further, the semiconductor thin film composed of III–V compound semiconductors or an alloy thereof containing C in an amount of $4 \times 10^{20}/cm^3$ or more is low in its resistance even in the polycrystalline state. Thus, as for the III–V compound semiconductors and the alloy thereof, the single crystalline portion thereof formed on the portion where the mask is not present and the polycrystalline portion thereof formed on the mask are electrically connected to each other.

In the case that the single crystalline portion of the III–V compound semiconductors or the alloy thereof constitutes part of a semiconductor device, the polycrystalline portion connected to the above single crystalline portion can be used as the extrinsic base region from part of the semiconductor device.

Further, there can be obtained a bipolar transistor using the above single crystalline portion of the III–V compound semiconductors or the alloy thereof as the base region and the above polycrystalline portion thereof as the extrinsic base region from the base region.

When AlAs or InAs is formed by an atomic layer epitaxial growth method (ALE method), a single crystalline AlAS layer with one molecular layer thickness grows on the portion where the mask is not present and an alloy layer in which As is slightly mixed with Al is formed on the mask, and further, when a semiconductor thin film composed of III–V compound semiconductors or an alloy thereof is formed on these films, the single crystalline portion formed on the portion where the mask is not present, the polycrystalline portion on the mask and the Al alloy layer are electrically connected to each other. In addition, AlAs layer is formed by alternately supplying dimethyl aluminum hydride ($(CH_3)_2AlH$, DMAIH) and arsine ($AsH_3$) with purge time therebetween on the substrate. In the ALE method, even if the amount of DMAIH is one molecular layer or more, only one molecular layer is grown on the semiconductor for each cycle including the supply of DMAIH, purge, supply of arsine and purge. However, on the $SiO_2$ film, the supplied DMAIH are all decomposed, and an alloy layer in which As is slightly mixed with Al is formed.

Further, in the case that the single crystalline portion of the III–V compound semiconductors and the alloy thereof constitutes part of a semiconductor device, the polycrystalline portion and Al alloy portion can be used as the extrinsic base region from part of the semiconductor device.

Additionally, there can be obtained a bipolar transistor using the single crystalline portion of the III–V compound semiconductors or the alloy thereof as the base region of the bipolar transistor, and the polycrystalline portion and the Al alloy layer as the extrinsic base region from the base region.

When only the III–V compound semiconductors or the alloy thereof are used as part of the semiconductor device, the film thickness of the AlAs layer or InAs layer may be thicker insofar as being one molecular layer or more. However, when being used as the extrinsic base region from the base region in the bipolar transistor, the above thickness is, preferably, one molecular layer or more and 10 molecular layers or less. The reason for this is that since the single crystalline AlAs or InAs layer constitutes part of the active region of the bipolar transistor which does not use these materials essentially, the structure of the active region becomes different, and when the thickness exceeds 10 molecular layers, there appears an influence exerted on the operational characteristic of the bipolar transistor.

Embodiment 19

This embodiment will be described with reference to FIGS. 58a to 58d. First, the surface of a GaAs (100) substrate 101 was etched by an etchant composed of a mixed solution of sulfuric acid, hydrogen peroxide and water, and was washed by flowing water. Subsequently, a $SiO_2$ film 2 was deposited by a thermally-resolved chemical vapor phase deposition method, and an opening was formed by the known photolithography and dry etching (see FIG. 58a).

Figure 58A:
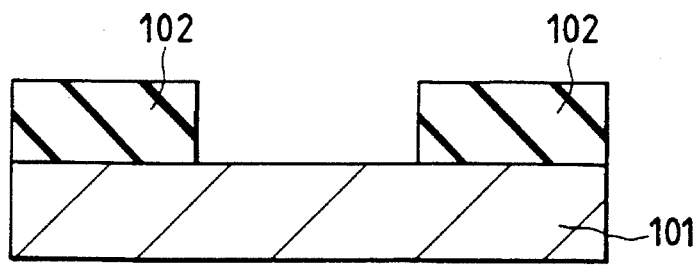
FIGS. 58a to 58d are flow diagrams for explaining Embodiment 19.
Figure 58B:
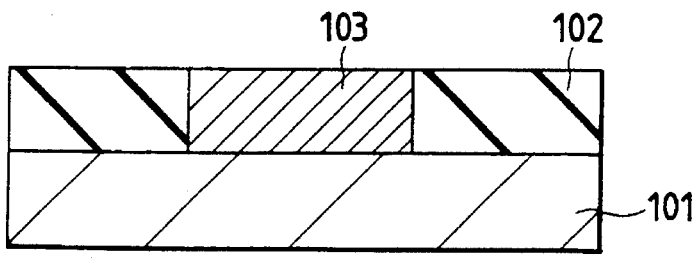
Figure 58C:
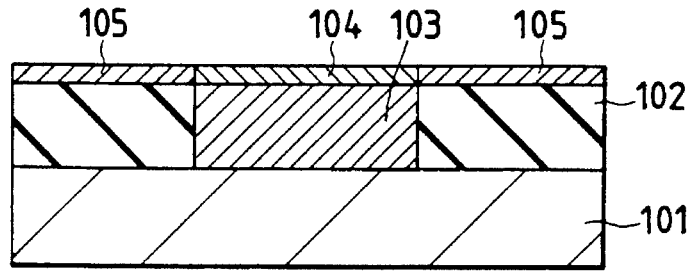
Figure 58D:
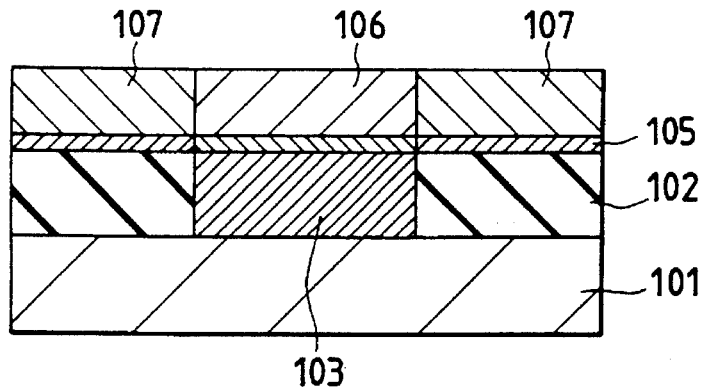

Next, the substrate 101 was inserted in an organometallic vapor phase epitaxy system or organometallic molecular beam epitaxy system, and a GaAs layer 103 was selectively formed by epitaxial growth on a portion where the $SiO_2$ film was not present (see FIG. 58b). Subsequently, a single crystalline AlAs layer 104 and a polycrystalline AlAs layer 105 were formed by one molecular layer thickness on the GaAs layer 3 and the $SiO_2$ film 102, respectively (see FIG. 58c).

Next, in the same system, a GaAs layer containing carbon as impurities in an amount of $4\times10^{20}/cm^3$ was allowed to grow. Thus, on the $SiO_2$ film 102, a polycrystalline layer 107 was allowed to grow with AlAs being as a nucleus, and a single crystalline GaAs layer 106 was formed on the portion where the $SiO_2$ film 102 was not present by epitaxial growth (see FIG. 58d).

Consequently, the single crystalline GaAs 106 and the polycrystalline GaAs layer 107, which are electrically connected to each other, can be formed on the $SiO_2$ film 102.

Here, there has been described the case that the $SiO_2$ film was used as the mask; however, in place of the $SiO_2$ film, a $Si_3N_4$ film, W film, WSi film or the layered film thereof may be used. Further, in place of the AlAs film, an InAs layer may be used. Additionally, as the substrate, selective epitaxial layer and the layer growing on the AlAs layer, the other III–V compound semiconductors other than GaAs may be used.

Embodiment 20

Figure 59A:
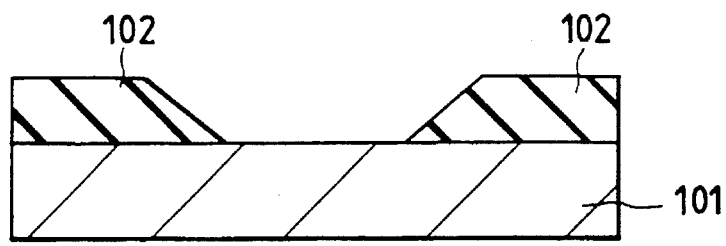
FIGS. 59a to 59c are flow diagrams for explaining Embodiment 20.
Figure 59B:
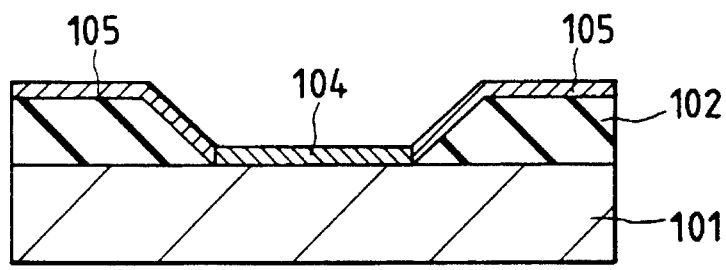
Figure 59C:
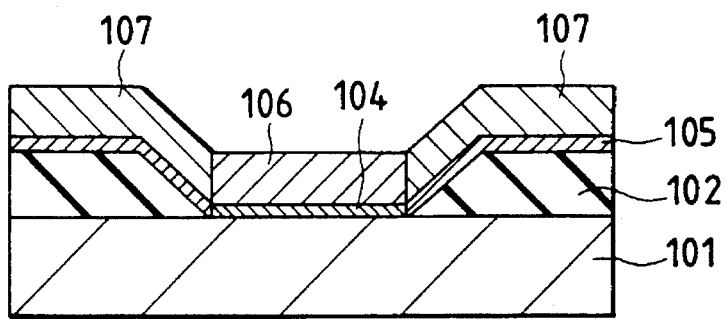
Figure 60A:
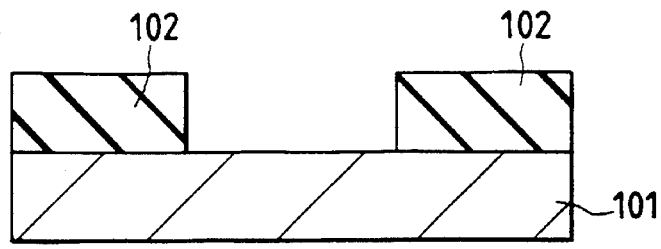
FIGS. 60a to 60d are flow diagrams for explaining Embodiment 21.
Figure 60B:
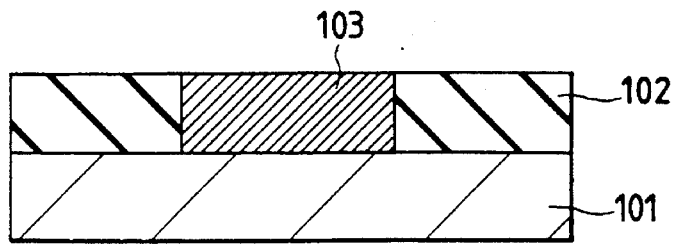
Figure 60C:
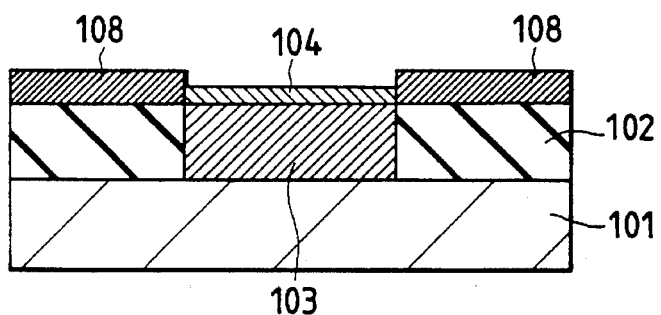
Figure 60D:
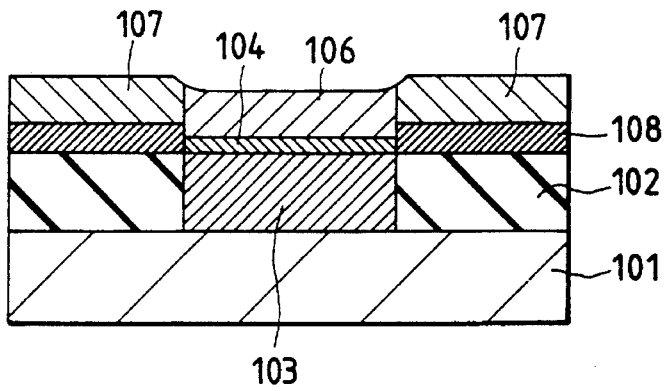

This embodiment will be described with reference to FIGS. 59a to 59c. First, the surface of a GaAs (100) substrate 101 was etched by an etchant composed of a mixed solution of sulfuric acid, hydrogen peroxide and water, and was washed by flowing water. Subsequently, a $SiO_2$ film 102 was deposited by a thermally-resolved chemical vapor phase deposition method. Then, an opening in which the side surface of the $SiO_2$ film 102 was made acute against the substrate 101 was formed by the known photoetching (see FIG. 2(a)).

Subsequently, the substrate was inserted in an organometallic vapor phase epitaxy system or organometallic molecular beam epitaxy system, and AlAs layers 104 and 105 were respectively formed on the $SiO_2$ film 102 and semiconductor substrate 101 by one molecular layer (see FIG. 59b).

Next, in the same system, a GaAs layer containing carbon as impurities in an amount of $4\times10^{20}/cm^3$ was allowed to grow. Thus, on the $SiO_2$ film 102, a polycrystalline GaAs layer 107 was allowed to grow with AlAs being as a nucleus. In this case, a single crystalline GaAs layer 106 was formed by expitaxial growth on the portion where the $SiO_2$ film 102 was not present as the underlayer (see FIG. 59c).

Consequently, the single crystalline GaAs layer 106 and the polycrystalline GaAs layer 107, which are electrically connected to each other, can be formed on the $SiO_2$ film 102.

In this embodiment, there has been described the case that the $SiO_2$ film was used as the mask; however, in place of the $SiO_2$ film, a $Si_3N_4$ film, W film, WSi film or the layered film thereof may be used. Further, in place of the AlAs film, an InAs layer may be used. Additionally, as the substrate, selective epitaxial layer and the layer growing on the AlAs layer, the other III–V compound semiconductors other than GaAs may be used.

Embodiment 21

This embodiment will be described with reference to FIGS. 60a to 60d. First, the surface of a GaAs (100) substrate 101 was etched by an etchant composed of a mixed solution of sulfuric acid, hydrogen peroxide and water, and was washed by flowing water. Subsequently, a $SiO_2$ film 102 was deposited by a thermally-resolved chemical vapor phase deposition method. An opening was formed on the $SiO_2$ film 102 by the known photolithography and dry etching (see FIG. 60a). After that, the substrate 101 was inserted in an organometallic vapor phase epitaxy system or organometallic molecular beam epitaxy system, and a GaAs layer 103 was selectively formed by epitaxial growth on a portion where the $SiO_2$ film was not present (see FIG. 60b).

Next, by alternately supplying dimethyl aluminum hydride ($(CH_3)_2AlH$, DMAIH) and arsine ($AsH_3$) with purge time therebetween on the substrate 101, an AlAs layer was formed by one molecular layer thickness through the ALE method. Thus, a single crystalline AlAs layer 104 was allowed to grow by one molecular layer thickness on the portion where the mask was not present, and an alloy layer 108 in which As was slightly mixed with Al was formed on the mask (see FIG. 60c).

In the same system, a GaAs layer containing carbon as impurities in an amount of $4\times10^{20}/cm^3$ was allowed to grow. Thus, on the $SiO_2$ film 102, a polycrystalline GaAs layer 107 was allowed to grow with AlAs being as a nucleus. In this case, the epitaxial growth was generated on the portion where the $SiO_2$ film 102 was not present as the underlayer, to grow a single crystalline layer 6 (see FIG. 60*d*).

Consequently, the single crystalline GaAs 106 and the polycrystalline GaAs layer 107, which are electrically connected to each other, can be formed on the $SiO_2$ film 102.

In this embodiment, there has been described the case that the $SiO_2$ film was used as the mask; however, in place of the $SiO_2$ film, a $Si_3N_4$ film, W film, WSi film or the layered film thereof may be used. Further, in place of the AlAs film, an InAs layer may be used. Additionally, as the substrate, selective epitaxial layer and the layer growing on the AlAs layer, the other III–V compound semiconductors other than GaAs may be used.

Embodiment 22

Figure 61A:
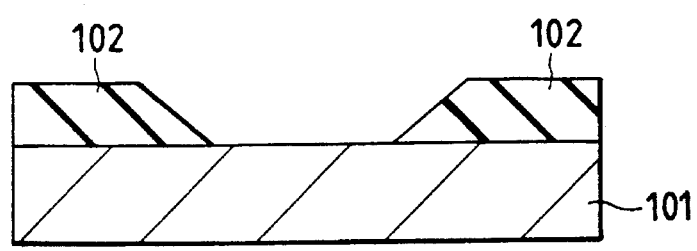
FIGS. 61a to 61c are flow diagrams for explaining Embodiment 22.
Figure 61B:
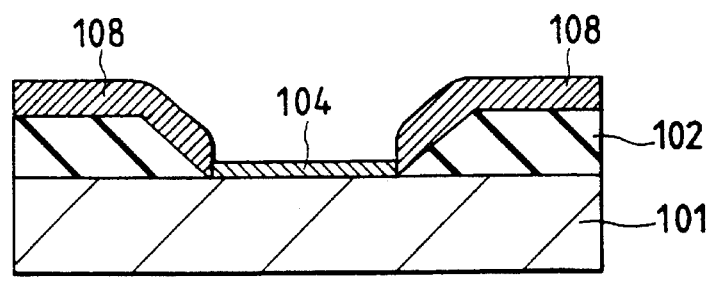
Figure 61C:
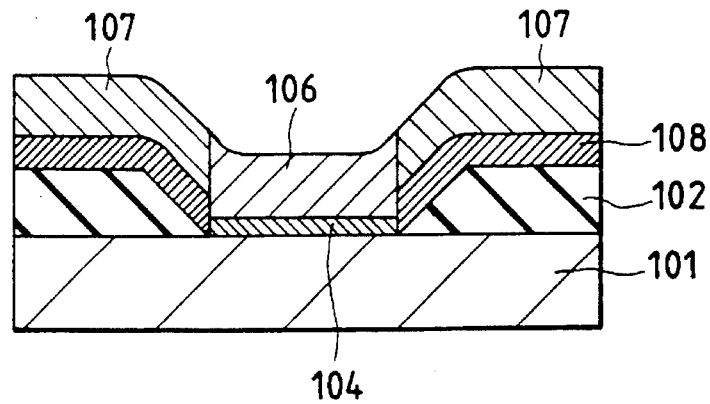

This embodiment will be described with reference to FIGS. 61*a* to 61*c*. First, the surface of a GaAs (100) substrate 101 was etched by an etchant composed of a mixed solution of sulfuric acid, hydrogen peroxide and water, and was washed by flowing water. Subsequently, a $SiO_2$ film 102 was deposited on the surface of the substrate 101 by a thermally-resolved chemical vapor phase deposition method. Then, after an opening of the $SiO_2$ film 102 was formed by the known photolithography and dry etching (see FIG. 61*a*), the substrate 101 was inserted in an organometallic vapor phase epitaxy system or organometallic molecular beam epitaxy system.

By alternately supplying dimethyl aluminum hydride (($CH_3)_2AlH$, DMAIH) and arsine ($AsH_3$) with purge time therebetween on the substrate 101, an AlAs layer was formed by one molecular layer thickness through the ALE method. Thus, a single crystalline AlAs layer 104 was allowed to grow by one molecular layer thickness on the portion where the $SiO_2$ film 102 was not present, and an alloy layer 108 in which As was slightly mixed with Al was formed on the $SiO_2$ film 102 (see FIG. 61*b*).

Next, in the same system, a GaAs layer containing carbon as impurities in an amount of $4\times10^{20}/cm^3$ was allowed to grow. Thus, on alloy layer 108, a polycrystalline layer 107 was allowed to grow with the Al alloy being as a nucleus. In this case, the epitaxial growth was generated on the portion where the $SiO_2$ film 102 was not present as the underlayer, to grow a single crystalline layer 106 (see FIG. 61*c*).

Consequently, the single crystalline GaAs 106 and the polycrystalline GaAs layer 107, which are electrically connected to each other, can be formed on the $SiO_2$ film 102.

In this embodiment, the $SiO_2$ film was used as the mask; however, a $Si_3N_4$ film, W film, WSi film or the layered film thereof may be used. Further, in place of the AlAs film, an InAs layer may be used. Additionally, as the substrate, selective epitaxial layer and the layer growing on the AlAs layer, the other III–V compound semiconductors other than GaAs may be used.

Embodiment 23

The embodiment of an HBT in which the present invention is applied to an extrinsic base region from a base layer will be described with reference to FIGS. 62*a* to 62*e*.

First, the surface of a GaAs (100) substrate 101 was etched by an etchant composed of sulfuric acid, hydrogen peroxide and water, and was washed by flowing water. Then, the substrate 101 was inserted in an organometallic vapor phase epitaxy system or organometallic molecular beam epitaxy system. A heavily doped n-type GaAs layer 109 (Si concentration; $5\times10^{18}/cm^3$, film thickness; 500 nm) as a subcollector layer of an HBT was formed by epitaxial growth, and subsequently the substrate 101 was removed from the growth system, and a $SiO_2$ film 102 (film thickness; 300 nm) was deposited by a thermally-resolved chemical vapor phase deposition method (see FIG. 62*a*).

An opening with the vertical side surface was formed on the $SiO_2$ film 102 by the known photolithography and anisotropic dry etching. After that, the substrate 101 was inserted in an organometallic vapor phase epitaxy system or organometallic molecular beam epitaxy system, and an n-type doped GaAs layer 110 (C concentration; $5\times10^{16}/cm^3$, film thickness; 400 nm) as a collector layer of the HBT was formed by an selective epitaxial growth method (see FIG. 62*b*). Subsequently, in the same system, an AlAs one molecular layer 104 and a polycrystalline AlAs one molecular layer 105 were simultaneously formed on the $SiO_2$ film (see FIG. 62*c*).

In this case, the film thickness of the AlAs layer 104 may be thicker than one molecular layer insofar as being 10 molecular layers or less. Further, the same effect may be obtained by using an InAs layer in place of the AlAs layer.

Next, a heavily doped GaAs layer 111 (C concentration; $4\times10^{20}/cm^3$, film thickness; 100 nm) and a heavily doped p-type polycrystalline GaAs layer 112 (C concentration; $4\times10^{20}/cm^3$, film thickness; 100 nm), as a base layer of the HBT, were simultaneously formed. Subsequently, an n-type doped AlGaAs layer 113 (AlAs mole ratio; 0.3, Si concentration; $1\times10^{18}/cm^3$, film thickness; 150 nm) and a doped n-type polycrystalline AlGaAs layer 114 (AlAs mole ratio; 0.3, Si concentration; $1\times10^{18}/cm^3$, film thickness; 100 nm), as an emitter layer of the HBT, were simultaneously formed.

A heavily doped n-type GaAs layer 115 (Si concentration; $1\times10^{18}/cm^3$, film thickness; 200 nm) and a heavily doped n-type polycrystalline GaAs layer 116 (Si concentration; $5\times10^{18}/cm^3$, film thickness; 200 nm), as a cap layer of the HBT, were simultaneously formed (see FIG. 62*d*).

Figure 62A:
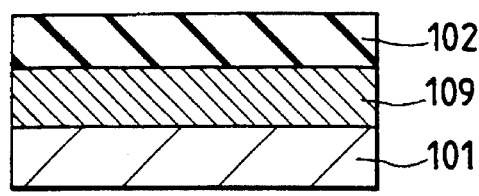
FIGS. 62a to 62e are flow diagrams for explaining Embodiment 23.
Figure 62B:
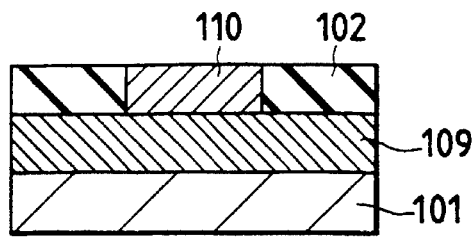
Figure 62C:
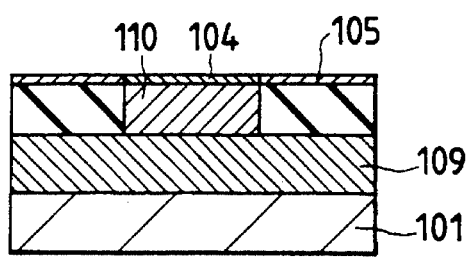
Figure 62D:
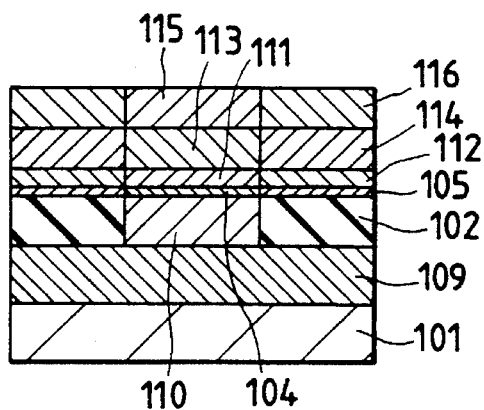
Figure 62E:
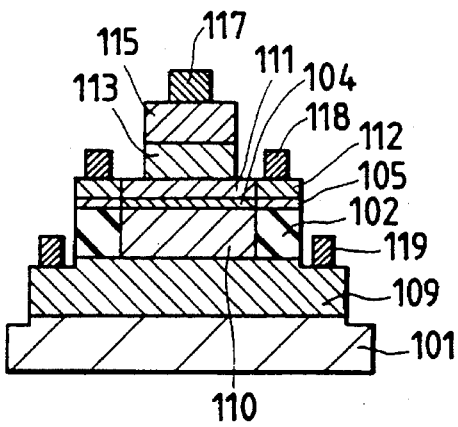

The substrate 101 was removed from the organometallic vapor phase epitaxy system or organometallic molecular beam epitaxy system, after which the surfaces of an extrinsic base region and a subcollector layer were exposed by photolithography and etching, to form an emitter electrode 117 (AuGe, film thickness; 200 nm), a base electrode 118 (AuZn, film thickness; 200 nm) and a collector electrode 119 (AuGe, film thickness; 200 nm), thus fabricating the HBT (see FIG. 62*e*).

According to this embodiment, since the semiconductor layer of one molecular layer thickness is formed between the extrinsic base region and the dielectric film, even using the organometallic vapor phase epitaxy method or organometallic molecular beam epitaxy method being difficult to grow the semiconductor layer on the dielectric film, it is possible to grow the polycrystalline semiconductor layer with the semiconductor on the dielectric film being as the nucleus. Accordingly, in the same organometallic vapor phase epitaxy method or organometallic molecular beam epitaxy method, it is possible to continuously perform the selective epitaxial growth and non-selective epitaxial growth. By use of the organometallic vapor phase epitaxy method or organometallic molecular beam epitaxy method, C enabling heavy doping can be used as a p-type impurities. Since C is smaller in the diffusion constant in the semiconductor as compared with Be used as the p-type dopant of the prior art HBT, there can be fabricated the HBT excellent in the repeatability and the reliability.

Further, since the $SiO_2$ film with a low specific dielectric constant is used as the extrinsic region, and the polycrystalline GaAs layer with the C concentration of $4 \times 10^{20}/cm^3$ or more is used as the extrinsic base region, as compared with the prior art HBT, it is possible to reduce the extrinsic base-collector capacitance without significantly increasing the base resistance. As a result, the maximum oscillation frequency can be significantly enhanced as compared with the prior art one.

Although this embodiment shows the AlGaAs/GaAs HBT, the present invention may be similarly applied to HBTs using the other III–V compound semiconductors such as InAlAs/InGaAs and InP/InGaAs. Further, in this embodiment, the $SiO_2$ film is used as the extrinsic collector region; however, the other dielectric film such as a $Si_3N_4$ film may be used. Additionally, the GaAs (100) face is used as the substrate in this embodiment; however, the other material and the other crystal orientation may be used.

Embodiment 24

The embodiment of an HBT in which the present invention is applied to an extrinsic base region from a base layer will be described with reference to FIGS. 63a to 63f.

First, the surface of a GaAs (100) substrate 101 was etched by an etchant composed of sulfuric acid, hydrogen peroxide and water, and was washed by flowing water. Then, the substrate 101 was inserted in an organometallic vapor phase epitaxy system or organometallic molecular beam epitaxy system. A heavily doped n-type GaAs layer 109 (Si concentration; $5 \times 10^{18}/cm^3$, film thickness; 500 nm) as a subcollector layer of an HBT was formed by epitaxial growth. Subsequently, the substrate 101 was removed from the growth system, and a $SiO_2$ film 102 (film thickness; 300 nm) was deposited by a thermally-resolved chemical vapor phase deposition method, and then a W film 120 (film thickness; 100 nm) was formed by the known sputtering (see FIG. 63a).

An opening with the vertical side surface was formed on the $SiO_2$ film and the W film was formed by photolithography and etching. After that, the substrate 101 was inserted in an organometallic vapor phase epitaxy system or organometallic molecular beam epitaxy system, and an n-type doped GaAs layer 110 (Si concentration; $5 \times 10^{16}/cm^3$, film thickness; 400 nm) as a collector layer of the HBT was formed by an selective epitaxial growth method (see FIG. 63b).

Figure 63A:
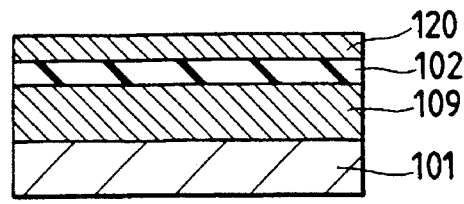
FIGS. 63a to 63f are flow diagrams for explaining Embodiment 24.
Figure 63B:
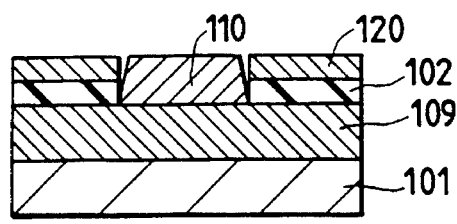
Figure 63C:
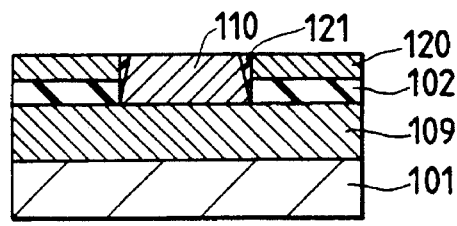

Subsequently, a spin-on-glass 128 (film thickness; 2 μm) was coated to flatten the surface, after which the dry etching was made over the whole surface to expose the surface of the GaAs layer 110 (see FIG. 63c).

Figure 63D:
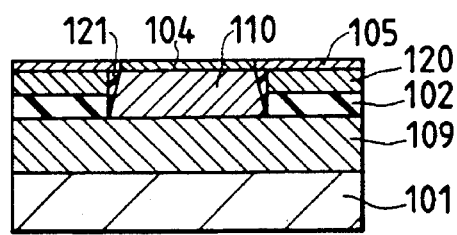
Figure 63E:
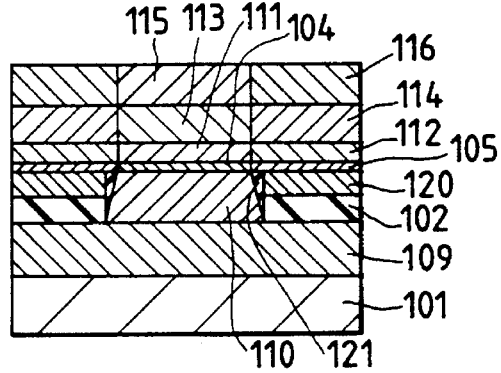

By use of the organometallic vapor phase epitaxy system or organometallic molecular beam epitaxy system, an AlAs one molecular layer 104 and a polycrystalline AlAs one molecular layer were simultaneously formed on the W film 120 (see FIG. 63d). In this case, the film thickness of the AlAs layer may be thicker than one molecular layer insofar as being 10 molecular layers or less. Further, the same effect may be obtained by using an InAs layer in place of the AlAs layer.

Next, a heavily doped GaAs layer 111 (C concentration; $4 \times 10^{20}/cm^3$, film thickness; 100 nm) and a heavily doped polycrystalline GaAs layer 112 (C concentration; $4 \times 10^{20}/cm^3$, film thickness; 100 nm), as a base layer of the HBT, were simultaneously formed. Subsequently, a n-type doped AlGaAs layer 113 (AlAs mole ratio; 0.3, Si concentration; $1 \times 10^{18}/cm^3$, film thickness; 150 nm) and an n-type doped polycrystalline AlGaAs layer 114 (AlAs mole ratio; 0.3, Si concentration; $1 \times 10^{18}/cm^3$, film thickness; 150 nm), as an emitter layer of the HBT, were simultaneously formed. Then, a heavily doped n-type GaAs layer 115 (Si concentration; $1 \times 10^{18}/cm^3$, film thickness; 200 nm) and a heavily doped n-type polycrystalline GaAs layer 116 (Si concentration; $5 \times 10^{18}/cm^3$, film thickness; 200 nm), as a cap layer of the HBT, were simultaneously formed (see FIG. 63e).

Figure 63F:
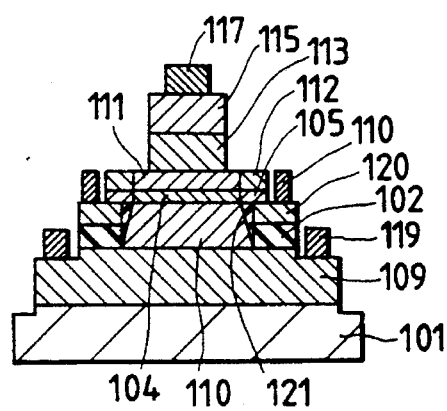

The substrate 101 was removed from the organometallic vapor phase epitaxy system or organometallic molecular beam epitaxy system, after which the surfaces of an extrinsic base region and the subcollector layer were exposed by photolithography and etching, to form an emitter electrode 117 (AuGe, film thickness; 200 nm), a base electrode 118 (AuZn, film thickness; 200 nm) and a collector electrode 119 (AuGe, film thickness; 200 nm), thus fabricating the HBT (see FIG. 63f).

According to this embodiment, since the semiconductor layer of one molecular layer thickness is formed between the extrinsic base region and the dielectric film, even using the organometallic vapor phase epitaxy method or organometallic molecular beam epitaxy method being difficult to grow the semiconductor layer on the dielectric film, it is possible to grow the polycrystalline semiconductor layer with the semiconductor on the dielectric film being as the nucleus. By use of the organometallic vapor phase epitaxy method or organometallic molecular beam epitaxy method, C enabling heavy doping can be used as a p-type impurity. Since C is smaller in the diffusion constant in the semiconductor as compared with Be used as the p-type dopant of the prior art HBT, there can be fabricated the HBT excellent in the repeatability and the reliability. Additionally, since the base electrode is formed on the W film, there can be obtained the low base resistance.

Further, since the space between the inclined semiconductor surface such as the {111} face emerged in the selective epitaxial growth of the collector layer and the vertically formed side surface of the dielectric film is filled with the spin-on-glass, there is no fear of causing the base-collector short circuit or breakage due to the deposition of the base layer semiconductor layer in the space, thus making it possible to fabricate the HBT with high yield.

Although this embodiment shows the AlGaAs/GaAs HBT, the present invention may be similarly applied to HBTs using the other III–V compound semiconductors such as InAlAs/InGaAs and InP/InGaAs. Further, in this embodiment, the $SiO_2$ film is used as the extrinsic collector region; however, the other dielectric film such as a $Si_3N_4$ film may be used. Additionally, the GaAs (100) face is used as the substrate in this embodiment; however the other material and the other crystal orientation may be used.

Embodiment 25

The embodiment of an HBT in which the present invention is applied to an extrinsic base region from a base layer will be described with reference to FIGS. 64a to 64d.

First, the surface of a GaAs (100) substrate 101 was etched by an etchant composed of sulfuric acid, hydrogen peroxide and water, and was washed by flowing water. Then, the substrate 101 was inserted in an organometallic vapor phase epitaxy system or organometallic molecular beam epitaxy system. A heavily doped n-type GaAs layer 109 (Si concentration; $5\times10^{18}$/cm$^3$, film thickness; 500 nm) as a subcollector layer of an HBT was formed by epitaxial growth. Subsequently, the substrate 101 was removed from the growth system, and a SiO$_2$ film 102 (film thickness; 300 nm) was deposited by a thermally-resolved chemical vapor phase deposition method, and then an opening in which the side surface of the SiO$_2$ film 102 is made acute against the substrate 101 was formed by photolithography and etching (see FIG. 64a).

Figure 64A:
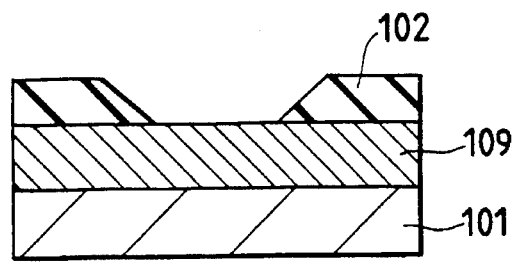
FIGS. 64a to 64d are flow diagrams for explaining Embodiment 25.
Figure 64B:
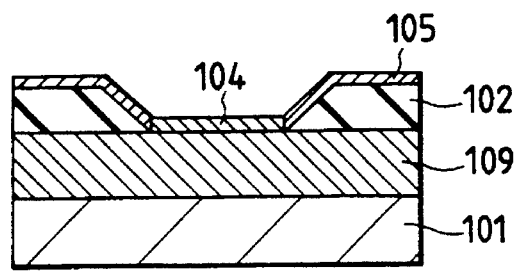
Figure 64C:
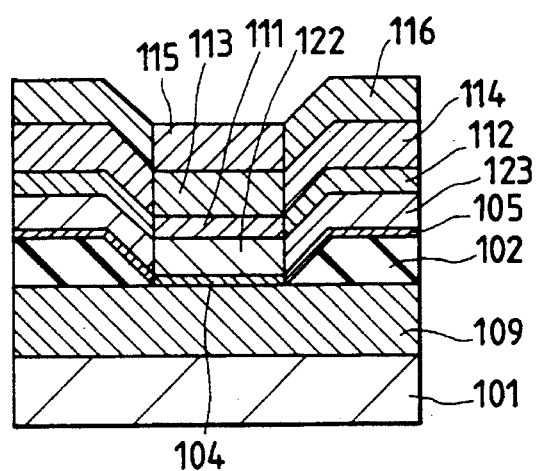
Figure 64D:
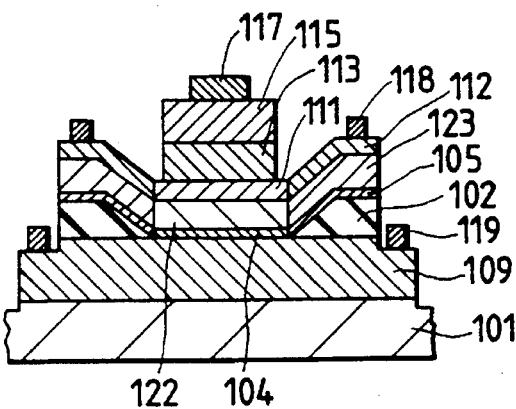

The substrate 101 was inserted in the organometallic vapor phase epitaxy system or organometallic molecular beam epitaxy system, and a single crystalline AlAs one molecular layer 104 and a polycrystalline AlAs one molecular layer 105 were simultaneously formed on the substrate 101 and the SiO$_2$ film 102, respectively (see FIG. 64d).

The substrate 101 was inserted in an organometallic vapor phase epitaxy system or organometallic molecular beam epitaxy system, and a single crystalline AlAs one molecular layer 104 and a polycrystalline AlAs one molecular layer 105 were simultaneously formed on the substrate 101 and the SiO$_2$ film 102, respectively (see FIG. 64b). In this case, the film thickness of the AlAs layer may be thicker than one molecular layer insofar as being 10 molecular layers or less. Further, the same effect may be obtained by using an InAs layer in place of the AlAs layer.

Next, an n-type GaAs layer 122 (Si concentration; $5\times10^{16}$/cm$^3$, film thickness; 400 nm) and an n-type polycrystalline GaAs layer 123 (Si concentration; $5\times10^{16}$/cm$^3$, film thickness; 400 nm), as a collector layer of the HBT, were simultaneously formed. Further, a heavily doped p-type GaAs layer 111 (C concentration; $4\times10^{20}$/cm$^3$, film thickness; 100 nm) and a heavily doped p-type polycrystalline GaAs layer 112 (C concentration; $4\times10^{20}$/cm$^3$, film thickness; 100 nm), as a base layer of the HBT, were simultaneously formed. Subsequently, an n-type AlGaAs layer 113 (AlAs mole ratio; 0.3, Si concentration; $1\times10^{18}$/cm$^3$, film thickness; 150 nm) and an n-type polycrystalline AlGaAs layer 114 (AlAs mole ratio; 0.3, Si concentration; $1\times10^{18}$/cm$^3$, film thickness; 150 nm), as an emitter layer of the HBT, were simultaneously formed.

Then, a heavily doped n-type GaAs layer 115 (Si concentration; $1\times10^{18}$/cm$^3$, film thickness; 200 nm) and a heavily doped n-type polycrystalline GaAs layer 116 (Si concentration; $5\times10^{18}$/cm$^3$, film thickness; 200 nm), as a cap layer of the HBT, were simultaneously formed (see FIG. 64c).

The substrate 101 was removed from the organometallic vapor phase epitaxy system or organometallic molecular beam epitaxy system, after which the surfaces of an extrinsic base region and the subcollector layer were exposed by the known photoetching, to form an emitter electrode 117 (AuGe, film thickness; 200 nm), a base electrode 118 (AuZn, film thickness; 200 nm) and a collector electrode 119 (AuGe, film thickness; 200 nm), thus fabricating the HBT (see FIG. 64d).

According to this embodiment, since the semiconductor layer of one molecular layer thickness is formed between the extrinsic base region and the dielectric film, even using the organometallic vapor phase epitaxy method or organometallic molecular beam epitaxy method being difficult to grow the semiconductor layer on the dielectric film, it is possible to grow the polycrystalline semiconductor layer with the semiconductor on the dielectric film being as the nucleus. By use of the organometallic vapor phase epitaxy method or organometallic molecular beam epitaxy method, C enabling heavy doping can be used as a p-type impurities. Since C is smaller in the diffusion constant in the semiconductor as compared with Be used as the p-type dopant of the prior art HBT, there can be fabricated the HBT excellent in the repeatability and the reliability.

Further, by making acute the angle between the side surface of the SiO$_2$ film and the substrate, it is possible to prevent the breakage in the vicinity of the extrinsic base region, and hence to fabricate a very high speed HBT with high yield. Further, since the depleted semiconductor layer is used as the extrinsic collector region together with the SiO$_2$ film, it is possible to further reduce the extrinsic base-collector capacitance as compared with the case of using only the SiO$_2$ film, and hence to further enhance the maximum oscillation frequency.

Although this embodiment shows the AlGaAs/GaAs HBT, the present invention may be similarly applied to HBTs using the other III–V compound semiconductors such as InAlAs/InGaAs and InP/InGaAs. Further, in this embodiment, the SiO$_2$ film is used as the extrinsic collector region; however, the other dielectric film such as a Si$_3$N$_4$ film may be used. Additionally, the GaAs (100) face is used as the substrate in this embodiment; however, the other material and the other crystal orientation may be used.

Embodiment 26

The embodiment of an HBT in which the present invention is applied to an extrinsic base region from a base layer will be described with reference to FIGS. 65a to 65e.

First, the surface of a GaAs (100) substrate 101 was etched by an etchant composed of sulfuric acid, hydrogen peroxide and water, and was washed by flowing water. Then, the substrate 101 was inserted in an organometallic vapor phase epitaxy system or organometallic molecular beam epitaxy system. A heavily doped n-type GaAs layer 109 (Si concentration; $5\times10^{18}$/cm$^3$, film thickness; 500 nm) as a subcollector layer of an HBT was formed by the known epitaxial growth method.

The substrate 101 was removed from the growth system, and a SiO$_2$ film 102 (film thickness; 300 nm) was formed by the known thermally-resolved chemical vapor phase deposition method.

Figure 65A:
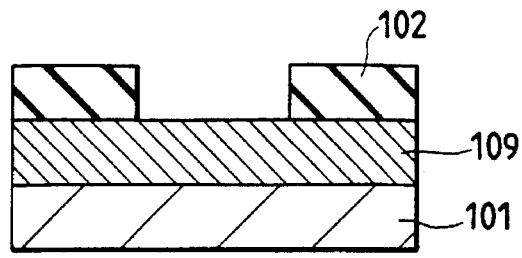
FIGS. 65a to 65e are flow diagrams for explaining Embodiment 26.
Figure 65B:
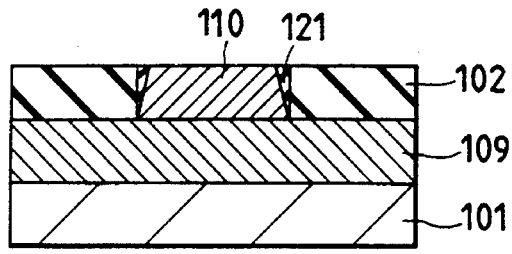
Figure 65C:
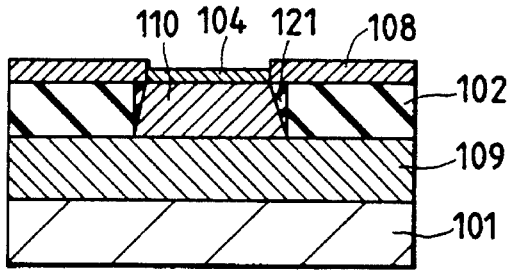
Figure 65D:
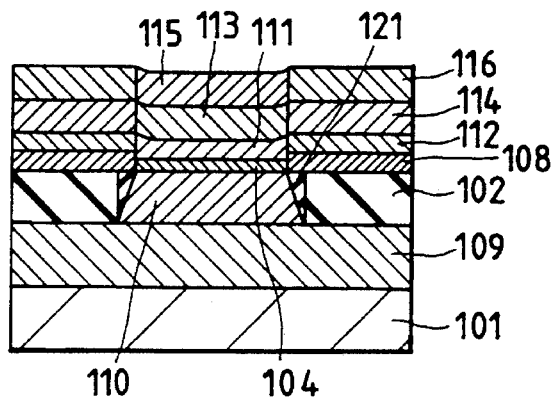

Subsequently, an opening with the vertical side surface was formed on the SiO$_2$ film 102 by the known photolithography and etching (FIG. 65a). After that, the substrate 101 was inserted in an organometallic vapor phase epitaxy system or organometallic molecular beam epitaxy system, and an n-type doped GaAs layer 110 (Si concentration; $5\times10^{16}$/cm$^3$, film thickness; 400 nm) as a collector layer of the HBT was formed by an selective epitaxial growth method. Subsequently, a spin-on-glass 121 (film thickness; 2 μm) was coated on the whole surface to flatten the surface, after which the dry etching was made over the whole surface to expose the surface of the GaAs layer 110 (see FIG. 65b).

Next, by alternately supplying dimethyl aluminum hydride ((CH$_3$)$_2$AlH, DMAlH) and arsine (AsH$_3$) with purge time therebetween on the substrate, an AlAs layer was formed by one molecular layer thickness using an ALE method. Thus, a single crystalline AlAs layer 104 by one molecular layer thickness was allowed to grow on the portion where the SiO$_2$ film 102 was not present, and an alloy layer 108 in which AS was slightly mixed with Al was formed on the SiO$_2$ film 102. In this case, the film thickness of the AlAs layer may be thicker than one molecular layer insofar as being 10 molecular layers or less. Further, the same effect may be obtained by using an InAs layer in place of the AlAs layer.

Next, a heavily doped p-type GaAs layer 111 (C concentration; $4\times10^{20}/cm^3$, film thickness; 100 nm) and a heavily doped p-type polycrystalline GaAs layer 112 (C concentration; $4\times10^{20}/cm^3$, film thickness; 100 nm), as a base layer of the HBT, were simultaneously formed. Subsequently, a n-type AlGaAs layer 113 (AlAs mole ratio; 0.3, Si concentration; $1\times10^{18}/cm^3$, film thickness; 150 nm) and an n-type polycrystalline AlGaAs layer 114 (AlAs mole ratio; 0.3, Si concentration; $1\times10^{18}/cm^3$, film thickness; 150 nm), as an emitter layer of the HBT, were simultaneously formed. Then, a heavily doped n-type GaAs layer 115 (Si concentration; $1\times10^{18}/cm^3$, film thickness; 200 nm) and a heavily doped n-type polycrystalline GaAs layer 116 (Si concentration; $5\times10^{18}/cm^3$, film thickness; 200 nm), as a cap layer of the HBT, were simultaneously formed (see FIG. 65*d*).

Figure 65E:
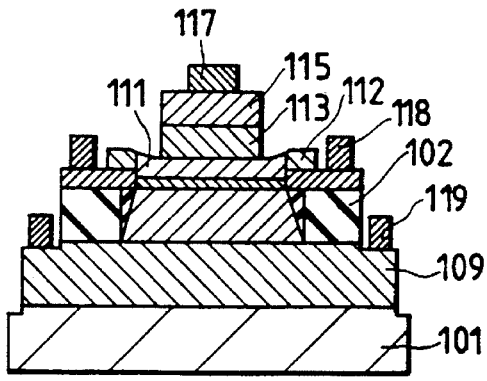

The substrate 101 was removed from the organometallic vapor phase epitaxy system or organometallic molecular beam epitaxy system, after which the surfaces of an extrinsic base region and the subcollector layer were exposed by the known photolithography and etching, to form an emitter electrode 117 (AuGe, film thickness; 200 nm), a base electrode 118 (AuZn, film thickness; 200 nm) and a collector electrode 119 (AuGe, film thickness; 200 nm), thus fabricating the HBT (see FIG. 65*e*).

According to this embodiment, since the semiconductor layer of one molecular layer thickness is formed between the extrinsic base region and the dielectric film, even using the organometallic vapor phase epitaxy method or organometallic molecular beam epitaxy method being difficult to grow the semiconductor layer on the dielectric film, it is possible to grow the polycrystalline semiconductor layer with the semiconductor on the dielectric film being as the nucleus. By use of the organometallic vapor phase epitaxy method or organometallic molecular beam epitaxy method, C enabling heavy doping can be used as a p-type impurity. Since C is smaller in the diffusion constant in the semiconductor as compared with Be used as the p-type dopant of the prior art HBT, there can be fabricated the HBT excellent in the repeatability and the reliability. Additionally, since the base electrode is formed on the alloy layer 108, the base resistance can be reduced.

Further, since the space between the inclined semiconductor surface such as the {111} face emerged in the selective epitaxial growth of the collector layer and the vertically formed side surface of the dielectric film is filled with the spin-on-glass, there is no fear of causing the base-collector short circuit or breakage due to the deposition of the base layer semiconductor layer in the space, thus making it possible to fabricate the HBT with high yield.

Although this embodiment shows the AlGaAs/GaAs HBT, the present invention may be similarly applied to HBTs using the other III-V compound semiconductors such as InAlAs/InGaAs and InP/InGaAs. Further, in this embodiment, the SiO₂ film is used as the extrinsic collector region; however, the other dielectric film such as a Si₃N₄ film may be used. Additionally, the GaAs (100) face is used as the substrate in this embodiment; however, the other material and the other crystal orientation may be used.

Embodiment 27

The embodiment of an HBT in which the present invention is applied to an extrinsic base region from a base layer will be described with reference to FIGS. 66*a* to 66*d*.

Figure 66A:
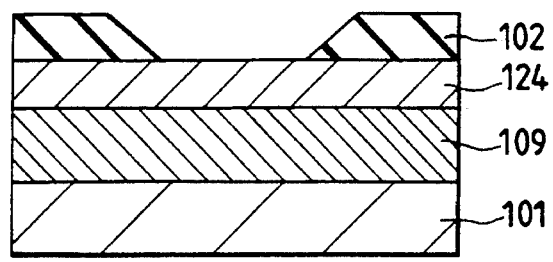
FIGS. 66a to 66d are flow diagrams for explaining Embodiment 27.
Figure 66B:
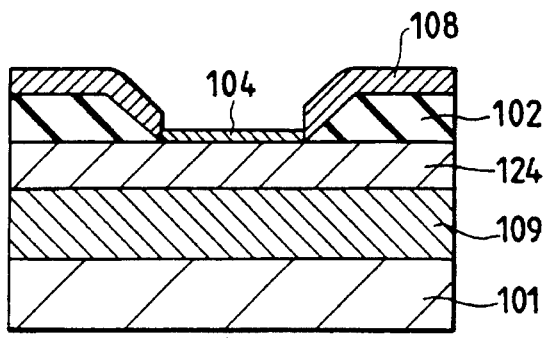
Figure 66C:
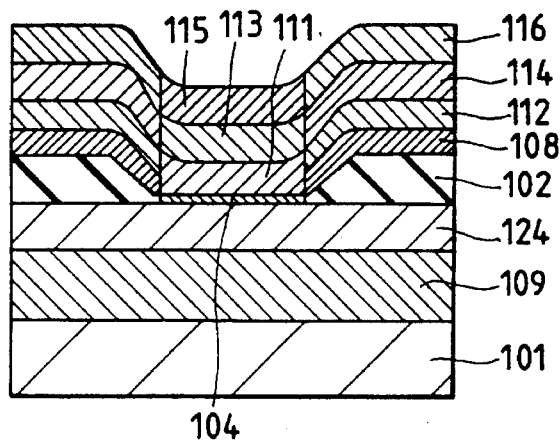

First, the surface of a GaAs (100) substrate 101 was etched by an etchant composed of sulfuric acid, hydrogen peroxide and water, and was washed by flowing water. Then, the substrate 101 was inserted in an organometallic vapor phase epitaxy system or organometallic molecular beam epitaxy system. A heavily doped n-type GaAs layer 109 (Si concentration; $5\times10^{18}/cm^3$, film thickness; 500 nm) as a subcollector layer and an n-type GaAs layer 124 (Si concentration; $5\times10^{16}/cm^3$, film thickness; 400 nm) as a collector layer of an HBT were formed by epitaxial growth. The substrate 101 was removed from the growth system, and a SiO₂ film 102 (film thickness; 300 nm) was deposited by the known thermally-resolved chemical vapor phase deposition method. Subsequently, an opening whose side surface being nearly perpendicular to the substrate was formed by the known photolithography and etching (FIG. 66*a*).

The substrate 101 was inserted in the organometallic vapor phase epitaxy system or organometallic molecular beam epitaxy system. Then, by alternately supplying dimethyl aluminum hydride ((CH₃)₂AlH, DMAIH) and arsine (AsH₃) with purge time therebetween on the substrate 101, an AlAs layer was formed by one molecular layer thickness using an ALE method. Thus, a single crystalline AlAs layer 104 of one molecular layer thickness was allowed to grow on the portion where the SiO₂ film 102 was not present, and an alloy layer 108 in which As was slightly mixed with Al was formed on the SiO₂ film. In this case, the film thickness of the AlAs layer may be thicker than one molecular layer insofar as being 10 molecular layers or less. Further, the same effect may be obtained by using an InAs layer in place of the AlAs layer.

Next, a heavily doped GaAs layer 111 (C concentration; $4\times10^{20}/cm^3$, film thickness; 100 nm) and a heavily doped p-type polycrystalline GaAs layer 112 (C concentration; $4\times10^{20}/cm^3$, film thickness; 100 nm), as a base layer of the HBT, were simultaneously formed. Subsequently, an n-type AlGaAs layer 113 (AlAs mole ratio; 0.3, Si concentration; $1\times10^{18}/cm^3$, film thickness; 150 nm) and an n-type doped polycrystalline AlGaAs layer 114 (AlAs mole ratio; 0.3, Si concentration; $1\times10^{18}/cm^3$, film thickness; 150 nm), as an emitter layer of the HBT, were simultaneously formed. Then, a heavily doped n-type GaAs layer 115 (free electron concentration; $5\times10^{18}/cm^3$, film thickness; 200 nm) and a heavily doped n-type polycrystalline GaAs layer 116 (free electron concentration; $5\times10^{18}/cm^3$, film thickness; 200 nm), as a cap layer of the HBT, were simultaneously formed (see FIG. 66*c*).

Figure 66D:
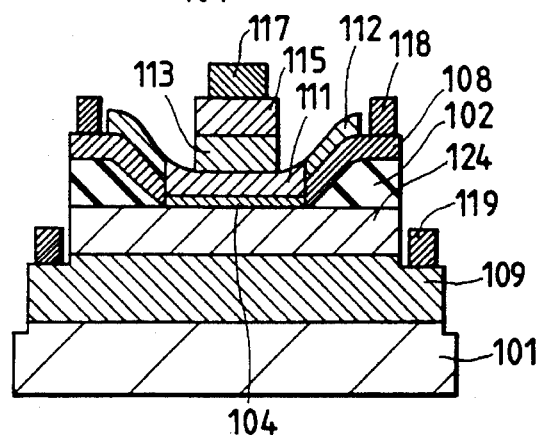

The substrate 101 was removed from the organometallic vapor phase epitaxy system or organometallic molecular beam epitaxy system, after which the surfaces of an extrinsic base region and the subcollector layer were exposed by the known photoetching, to form an emitter electrode 117 (AuGe, film thickness; 200 nm), a base electrode 118 (AuZn, film thickness; 200 nm) and a collector electrode 119 (AuGe, film thickness; 200 nm), thus fabricating the HBT (see FIG. 66*d*).

According to this embodiment, by use of the organometallic vapor phase epitaxy method or organometallic molecular beam epitaxy method, C enabling heavy doping can be used as a p-type impurity. Since C is smaller in the diffusion constant in the semiconductor as compared with Be used as the p-type dopant of the prior art HBT, there can be fabricated the HBT excellent in the repeatability and the reliability.

Further, by making acute the angle between the side surface of the opening portion formed on the SiO$_2$ film and the substrate, it is possible to prevent the breakage in the vicinity of the extrinsic base region, and hence to fabricate the HBT with high yield. Further, since the base electrode is formed on the Al alloy layer 8, it is possible to reduce the base resistance.

Although this embodiment shows the AlGaAs/GaAs HBT, the present invention may be similarly applied to HBTs using the other III–V compound semiconductors such as InAlAs/InGaAs and InP/InGaAs. Further, in this embodiment, the SiO$_2$ film is used as the extrinsic collector region; however, the other dielectric film such as a Si$_3$N$_4$ film may be used. Additionally, the GaAs (100) face is used as the substrate in this embodiment; however, the other material and the other crystal orientation may be used.

Embodiment 28

The structure shown in FIG. 11 was formed by the method shown in Embodiment 6.

Next, the substrate was transferred to an MBE system, and an internal base 5 composed of a Be doped p-type InGaAs layer and an external base 6 composed of a p-type polycrystalline InGaAs layer were simultaneously formed at a temperature of 450° C. As a result, the internal base 5 composed of the InGaAs layer was formed on a collector 3 composed of the single crystalline InGaAs layer, and the external base 6 composed of the p-type polycrystalline InGaAs layer was formed on a spin-on-glass 21. This was confirmed by the observation through an electron diffraction method and a transmission electron microscope. Further, it is revealed that when the Be concentration of the p-type polycrystalline InGaAs layer is specified to be 4×10$^{20}$/cm$^3$ or more, the resistivity of the external base 6 becomes excellent to be 0.04 Ωcm or less.

Figure 67A:
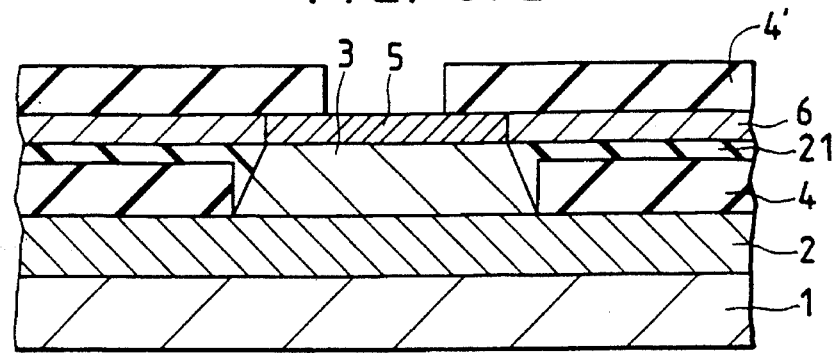
FIGS. 67a to 67c are flow diagrams for explaining Embodiment 28.
Figure 67B:
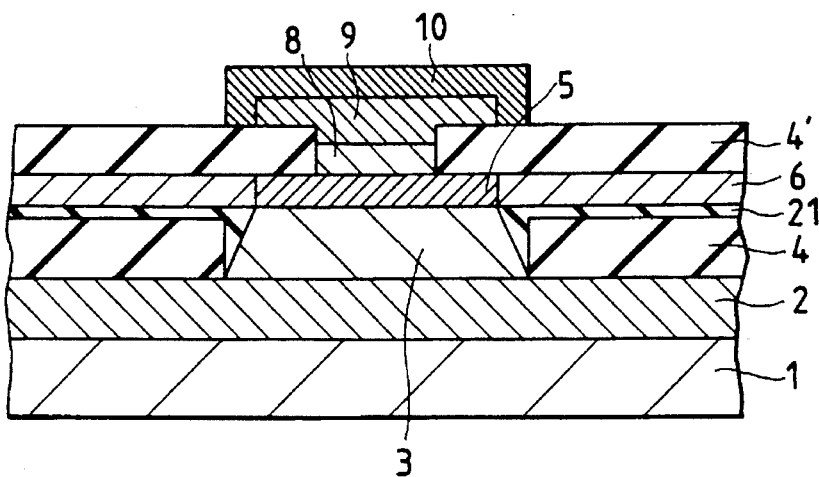

The above substrate was removed from the MBE system, and a surface protective dielectric film 4' was formed by the known CVD method, and the above surface protective dielectric film 4' formed on the region in which an emitter was to be formed was selectively removed by the known photolithography and etching (see FIG. 67a).

Subsequently, the above substrate was transferred to an organometallic vapor phase epitaxy system of organometallic molecular beam epitaxy system, after which an emitter 8 composed of an n-type InP and an extrinsic emitter region 9 composed of an n-type InGaAs were formed by the known epitaxial growth method. In this case, the extrinsic emitter region 9 was allowed to grow in the lateral direction, to extend on the surface protective dielectric film 4' over the length of about 500 nm.

Figure 67C:
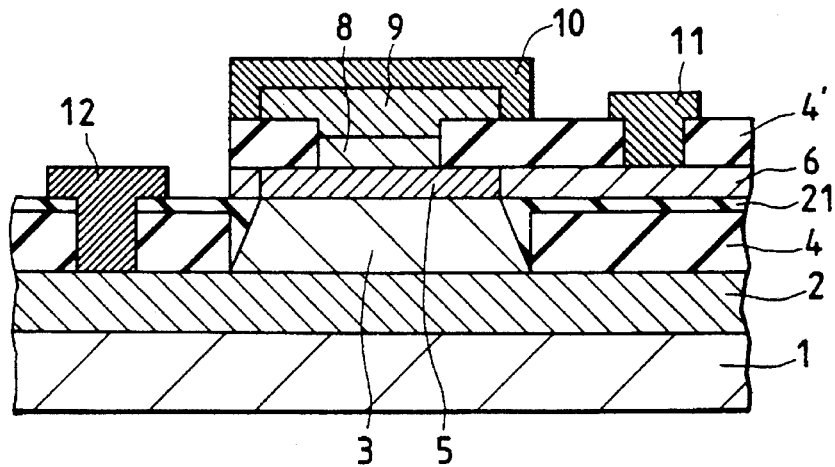

An emitter electrode 10 composed of WSi was formed by the known method, to thus form the structure shown in FIG. 67c.

Subsequently, by performing the etching with the above emitter electrode 10 as a mask, the exposed portions of the above surface protective dielectric film 4' and the external base 6 were removed. By use of the known photoetching, the surface protective dielectric film 4', a spin-on-glass 21 and an embedded dielectric film 4 formed on the region in which a base electrode and a collector electrode were to be formed were removed, after which the base electrode 11 and the collector electrode 12 were formed by the known lift-off method (see FIG. 67c).

In the HBT formed by this embodiment, since the extrinsic emitter region 9 is single crystal and is formed by the selective epitaxial growth technique, the area of the extrinsic emitter region is enlarged more than that of the emitter-base junction. Accordingly, it is possible to simultaneously achieve the reduction of the emitter resistance and the lowering of he emitter area.

As is apparent from the above description, according to the present invention, since the grain size and the resistivity of the polycrystalline compound semiconductor layer can be extremely lowered as compared with the prior art, it is possible to realize a semiconductor device with high performance and high reliability. In particular, in the case of the HBT, to reduce the extrinsic base-collector capacitance, even using the dielectric film with a low dielectric constant as the extrinsic collector region, the significant increase in the base resistance can be prevented, which enables the very high speed operation.

Further, by providing a semiconductor layer with a film thickness of 30 nm or more between the extrinsic base region and the dielectric film, or by making smaller the minimum value of the energy gap in the extrinsic base region than that in the base region, it is possible to further reduce the base resistance and hence to further increase the maximum oscillation frequency. Additionally, in fabrication of the extrinsic base region, there is no fear of causing the short circuit or breakage, which makes it possible to fabricate a very high speed HBT with high yield.

In the case of the surface emitting laser diode, since the dielectric film is embedded without implantation of oxygen ions in the device extrinsic region, and the intrinsic region is connected to the extrinsic region by means of a polycrystalline p-type III–V compound semiconductor, it is possible to realize the perfect current-confinement structure and hence to extremely improve the characteristics.

In the case of the above hetero-insulated gate field effect transistor, since the barrier layer-gate electrode interface can be fabricated without exposure in the air under the ultra-high vacuum or high-purity-hydrogen atmosphere, it is possible to reduce the density of interface states at the interface, and hence to reduce the variation of the density of interface states depending on the difference of the device fabrication condition. Further, it is possible to decrease the size of the gate electrode and the wiring, and hence to facilitate the improvement in the integration density.

Further, by forming an electronic circuit using the above HBT and the hetero-insulated gate field effect transistor for all the transistors or at least a differential amplifier circuit, it is possible to provide a very high speed differential amplifier circuit and an electronic circuit system using the same as the basic unit.

Further, according to the present invention, since the epitaxial growth layer and the polycrystalline layer which are electrically connected to each other are formed on the dielectric film, it is possible to use the polycrystalline layer as the extrinsic base region from the epitaxial layer. In particular, even if the epitaxial layer to be connected to the extrinsic base region is extremely thin layer (100 nm or less) in the multi-layer structure, it is possible to easily form the extrinsic base region.

What is claimed is:

1. A semiconductor device comprising;

a single crystalline compound semiconductor substrate;

a dielectric film formed on said semiconductor substrate; and a polycrystalline compound semiconductor film with a resistivity of 0.04 Ωcm or less which is formed on said dielectric film.

2. A semiconductor device according to claim 1, wherein said polycrystalline compound semiconductor comprises one kind or an alloy of III–V compound semiconductors.

3. A semiconductor device according to claim 1, wherein said polycrystalline compound semiconductor film is doped with Be.

4. A semiconductor device according to claim 3, wherein said polycrystalline compound semiconductor film is doped with Be in a concentration of $4\times10^{20}/cm^3$ to $2\times10^{22}/cm^3$.

5. A semiconductor device according to claim 1, wherein said polycrystalline compound semiconductor film is doped with C.

6. A semiconductor device according to claim 5, wherein said polycrystalline compound semiconductor film is doped with C in a concentration of $4\times10^{20}/cm^3$ to $2\times10^{22}/cm^3$.

7. A semiconductor device according to claim 1, wherein the grain size of said polycrystalline compound semiconductor film is 100 nm or less.

8. A semiconductor device according to claim 1, wherein said dielectric film comprises a $SiO_2$ film or $Si_3N_4$ film.

9. A semiconductor device comprising:

a single crystalline semiconductor substrate;

a first layer composed of a first single crystalline compound semiconductor having a first conductivity, which is formed on said semiconductor substrate;

a second layer composed of a second single crystalline compound semiconductor having said first conductivity, which is formed on said first layer in a specified shape;

a third layer composed of a third single crystalline compound semiconductor having a second conductivity reversed to said first conductivity, which is formed on said second layer;

a fourth layer composed of a fourth single crystalline compound semiconductor having said first conductivity and an energy gap different from that of said third single crystalline compound semiconductor, which is formed on said third layer;

a first dielectric film formed on said first layer so as to be contacted with the side portion of said second layer; and a polycrystalline compound semiconductor layer having said second conductivity and a resistivity of 0.04 Ωcm or less, which is formed on said first dielectric film and is electrically connected to said third layer.

10. A semiconductor device according to claim 9, wherein said first layer, said second layer, said third layer, said fourth layer and said polycrystalline semiconductor layer are an extrinsic collector layer, a collector, a base, an emitter and an extrinsic base layer of a heterojunction bipolar transistor, respectively.

11. A semiconductor device according to claim 10, wherein a collector electrode, a base electrode and an emitter electrode are formed on said collector, said base and said emitter, respectively.

12. A semiconductor device according to claim 9, wherein said third layer and said fourth layer comprise GaAs and AlGaAs, respectively.

13. A semiconductor device according to claim 9, wherein said third layer and said fourth layer comprise InGaAs and InAlAs, respectively.

14. A semiconductor device according to claim 9, wherein said third layer and said fourth layer comprise InGaAs and InP, respectively.

15. A semiconductor device according to claim 9, wherein a fifth layer composed of a fifth semiconductor layer is further provided between said first dielectric film and said polycrystalline semiconductor layer.

16. A semiconductor device according to claim 15, wherein said fifth layer comprises one kind of polycrystalline AsSb, InGaAs, InAsSb and SiGe.

17. A semiconductor device according to claim 15, wherein said fifth layer has said first conductivity or has said second conductivity with an impurity concentration of $1\times10^{17}/cm^3$ or less.

18. A semiconductor according to claim 9, wherein said polycrystalline compound semiconductor layer comprises a polycrystalline GaAs.

19. A semiconductor device according to claim 9, wherein the side surface of said first dielectric film forms an acute angle against a main surface of said substrate.

20. A semiconductor device according to claim 9, wherein a first low resistance semiconductor layer having said first conductivity is formed on said fourth layer.

21. A semiconductor device according to claim 20, wherein the area of said first low resistance semiconductor layer is larger than that of said fourth layer.

22. A semiconductor device according to claim 21, wherein said first low resistance semiconductor layer extends from the surface of said fourth layer to the surface of a second dielectric film formed on said fourth layer.

23. A semiconductor device according to claim 22, wherein said fourth layer comprises an emitter of a heterojunction bipolar transistor, and an emitter electrode is formed on said first low resistance semiconductor layer.

24. A semiconductor device comprising:

a single crystalline semiconductor substrate;

a first dielectric film having an opening which is formed on the surface of said semiconductor substrate;

a first semiconductor layer composed of AlAs or InAs which is formed so as to extend from the exposed surface of said semiconductor substrate to the surface of said first dielectric film; and a second semiconductor layer composed of one kind or an alloy of III–V compound semiconductors containing C in a concentration of $4\times10^{20}/cm^3$ or more, which is formed so as to be layered on said first semiconductor layer;

wherein in said first semiconductor layer, the portion thereof formed on the exposed surface of said semiconductor substrate and the portion thereof formed on said first dielectric film are single crystal and polycrystal, respectively; and in said second semiconductor layer, the portions thereof formed on said single crystalline portion and said polycrystalline portion of said first semiconductor layer are single crystal and polycrystal, respectively.

25. A semiconductor device according to claim 24, wherein a heat resistant metal film is interposed between said first dielectric film and said first semiconductor layer.

26. A semiconductor device according to claim 25, wherein a single crystalline portion of said second semiconductor layer is a base region of a heterojunction bipolar transistor, and polycrystalline portions of said first and second semiconductor layers and said heat resistant metal film are an extrinsic base region electrically connected to said base layer.

27. A semiconductor device according to claim 24, wherein a polycrystalline portion of said first semiconductor layer comprises an alloy of AlAs and InAs.

28. A semiconductor device according to claim 24, wherein a thickness of a single crystalline portion of said first semiconductor layer is one molecular layer or more and 10 molecular layers or less.

29. A semiconductor device comprising:

a single crystalline semiconductor substrate having a first conductivity;

a first distributed Bragg reflection layer composed of a plurality of single crystalline semiconductor films with said first conductivity, which is formed so as to be layered on a main surface of said semiconductor substrate;

an active layer formed on said first distributed Bragg reflection layer;

a second distributed Bragg reflection layer having a second conductivity reversed to said first conductivity, which is formed so as to be layered on said active layer;

a surface reflection layer formed on said second distributed Bragg reflection layer such that part of the surface of the second distributed Bragg reflection layer is exposed; and a polycrystalline compound semiconductor film with a resistivity of 0.04 $\Omega$cm or less, which is formed on the exposed portion of said active layer through a dielectric film.

30. A semiconductor device according to claim 29, wherein electrodes are formed on the back surface of said semiconductor substrate, said surface reflection film and said polycrystalline compound semiconductor film, respectively.

31. A semiconductor device according to claim 29, wherein each of said first and second distributed Bragg reflection layers comprises a layered film of a single crystalline AlAs and a single crystalline GaAs.

32. A semiconductor device according to claim 29, wherein said active layer is a layered film composed of a single crystalline GaAs, a single crystalline AlGaAs and a single crystalline InGaAs.

33. A semiconductor device including an heteroinsulated gate field effect transistor comprising:

a single crystalline semiconductor substrate;

a channel layer formed on the surface of said semiconductor substrate;

a source and a drain having a first conductivity which are provided at a spaced interval on said channel layer; and a polycrystalline compound semiconductor with a resistivity of 0.04 $\Omega$cm or less, which is formed on said channel layer between said source and said drain through a barrier layer.

34. A semiconductor device according to claim 33, wherein said channel layer comprises GaAs, and said barrier layer comprises AlGaAs.

35. A semiconductor device according to claim 33, wherein said channel layer comprises InGaAs, and said barrier layer comprises InP.

* * * * *